(12) United States Patent
Yokoyama

(10) Patent No.: US 7,991,036 B2
(45) Date of Patent: Aug. 2, 2011

(54) TWO-DIMENSIONAL PHOTONIC CRYSTAL PLANE EMISSION LASER

(75) Inventor: Mitsuru Yokoyama, Takatsuki (JP)

(73) Assignee: Konica Minolta Holdings, Inc., Tokyo (JP)

( * ) Notice: Subject to any disclaimer, the term of this patent is extended or adjusted under 35 U.S.C. 154(b) by 37 days.

(21) Appl. No.: 12/666,389

(22) PCT Filed: Jun. 16, 2008

(86) PCT No.: PCT/JP2008/060954
§ 371 (c)(1),
(2), (4) Date: Dec. 23, 2009

(87) PCT Pub. No.: WO2009/001699
PCT Pub. Date: Dec. 31, 2008

(65) Prior Publication Data
US 2010/0172389 A1 Jul. 8, 2010

(30) Foreign Application Priority Data
Jun. 28, 2007 (JP) .................................. 2007-170399

(51) Int. Cl.
*H01S 3/08* (2006.01)
(52) U.S. Cl. ............ 372/98; 372/43.01; 372/92; 372/99
(58) Field of Classification Search ................ 372/43.01, 372/50.124, 92, 98–99
See application file for complete search history.

(56) References Cited

U.S. PATENT DOCUMENTS

| | | | |
|---|---|---|---|
| 2006/0245464 A1 | 11/2006 | Hori et al. | 372/99 |
| 2007/0036189 A1 | 2/2007 | Hori et al. | 372/50.11 |
| 2007/0121694 A1 | 5/2007 | Okamoto | 372/50.124 |
| 2007/0177647 A1* | 8/2007 | Noda et al. | 372/50.1 |
| 2009/0135871 A1* | 5/2009 | Noda et al. | 372/44.01 |
| 2009/0175304 A1* | 7/2009 | Noda et al. | 372/44.01 |
| 2009/0279579 A1* | 11/2009 | Ohnishi et al. | 372/50.124 |
| 2009/0285255 A1* | 11/2009 | Sakai et al. | 372/50.124 |

FOREIGN PATENT DOCUMENTS

| | | |
|---|---|---|
| JP | 2000-332351 A | 11/2000 |
| JP | 2001-308457 A | 11/2001 |
| JP | 2003-273456 A | 9/2003 |
| JP | 2006-332595 A | 12/2006 |
| WO | WO 2007/119273 A1 | 10/2007 |
| WO | WO 2009/001699 A1 | 12/2008 |

* cited by examiner

*Primary Examiner* — Minsun Harvey
*Assistant Examiner* — Phillip Nguyen
(74) *Attorney, Agent, or Firm* — Sidley Austin LLP

(57) ABSTRACT

A two-dimensional photonic crystal plane emission laser of the invention includes a two-dimensional photonic crystal which has a two-dimensional photonic crystal area and a light reflecting area, and which selects a wavelength of light to be generated in an active layer. The light reflecting area is formed in such a manner that when light leaking from the two-dimensional photonic crystal area and reflected on a reflecting surface of the light reflecting area is returned to the two-dimensional photonic crystal area, the reflection light is combined with a standing wave residing in a propagating direction of the reflection light without disturbing its resonant state.

13 Claims, 37 Drawing Sheets

PHOTONIC CRYSTAL AREA

PHOTONIC CRYSTAL AREA

TWO-DIMENSIONAL PHOTONIC CRYSTAL PLANE EMISSION LASER

TECHNICAL FIELD

The present invention relates to a two-dimensional photonic crystal plane emission laser for emitting planar light by resonance on a two-dimensional photonic crystal, and more particularly to a two-dimensional photonic crystal plane emission laser capable of improving the performance of a two-dimensional photonic crystal-based resonator.

This application is a U.S. National Phase Application under 35 USC 371 of International Application PCT/JP2008/060954, filed Jun. 24, 2008, which is based on Japanese Patent Application No. 2007-170399 filed Jun. 28, 2007, the contents of which are hereby incorporated by reference.

BACKGROUND ART

A plane emission laser has various features. For instance, the laser is capable of emitting laser light substantially perpendicularly with respect to a substrate surface, integrating plural laser elements two-dimensionally (configuring into a two-dimensional array), and emitting coherent light from each of the laser elements in parallel. In view of these features, the plane emission laser is expected to be applied in various technical fields such as a storage field, a communications field, and an information processing field; and research and development of the plane emission laser has been progressed.

The plane emission laser generally and basically adopts a structure, wherein an active layer for generating light by carrier impregnation is vertically sandwiched between multilayer reflection mirrors (DBR mirrors). In addition to the above, a two-dimensional photonic crystal is used, as disclosed in e.g. patent literature 1. Generally, a photonic crystal is an optical element internally provided with a periodic refractive index distribution substantially equal to or smaller than a wavelength of light. Examples of the photonic crystal are a three-dimensional photonic crystal having a three-dimensional refractive index distribution, and a two-dimensional photonic crystal having a two-dimensional refractive index distribution. Similarly to a phenomenon that a band gap is formed in a semiconductor, when electrons (an electron wave) are subjected to Bragg reflection by a periodic potential of atomic nuclei, the photonic crystal has a feature that a band gap (a photonic band gap) with respect to light is formed, when a lightwave is subjected to Bragg reflection depending on a periodic refractive index distribution. Since light itself is not allowed to reside in the photonic band gap, control of light using the photonic crystal is expected.

The two-dimensional photonic crystal plane emission laser disclosed in patent literature 1 comprises a substrate, an n-InP layer formed on a principal plane of the substrate and serving as a lower clad layer, an active layer formed on the n-InP layer and for generating light by carrier impregnation; a p-InP layer formed on the active layer and serving as an upper clad layer, a first electrode and a second electrode formed on the p-InP layer and the other principal plane of the substrate, and a two-dimensional photonic crystal formed near the active layer and within the n-InP layer. The plane emission laser having the above construction is operated in such a manner that upon application of a voltage of a predetermined value or more between the first and the second electrodes, the active layer emits light, and the light is incident from the active layer into the two-dimensional photonic crystal. The light incident into the two-dimensional photonic crystal is amplified by resonance of light having a wavelength equal to the lattice constant of the two-dimensional photonic crystal for oscillation, whereby laser light is emitted in a plane direction.

FIG. 32 is a plan view showing a structure of a two-dimensional photonic crystal to be used in a two-dimensional photonic crystal plane emission laser. FIGS. 33A through 36B are diagrams for describing resonance modes. FIGS. 33A and 33B show A mode, FIGS. 34A and 34B show B mode, FIGS. 35A and 35B show C mode, and FIGS. 36A and 36B show D mode. FIGS. 33A, 34A, 35A, and 36A are diagrams each showing a near-field electric field distribution obtained by solving a Maxwell equation, wherein each arrow shows a direction and a magnitude of electric field. FIGS. 33B, 34B, 35B, and 36B are conceptual diagrams corresponding to FIGS. 33A, 34A, 35A, and 36A, respectively, wherein each arrow shows an electric field direction at each lattice point in ±X direction and ±Y direction. FIG. 37 is a diagram showing how a two-dimensional photonic crystal plane emission laser emits planar light.

In describing the resonance of the two-dimensional photonic crystal in detail, for instance, as shown in FIG. 32, let it be assumed that a two-dimensional photonic crystal 100 includes, in a first medium 101 having a first refractive index, a second medium 102 (lattice points) having a second refractive index different from the first refractive index and constituted of square lattices, wherein the cylindrical column-shaped lattice points 102 are arranged in two directions orthogonal to each with a predetermined period (a lattice interval or a lattice constant) "a". If light L having an in-medium wavelength $\lambda$ equal to the lattice interval "a" is propagated in Γ-X direction as a side direction of the square lattice, the light L is diffracted at one of the lattice points 102. Out of the diffraction light L, only the light L which is diffracted in the direction of 0 degree, ±90 degrees, and 180 degrees with respect to the propagating direction of light L satisfies the Bragg condition ($2 \times a \times \sin \theta = m \times \lambda$ (m=0, ±1, ...)). There are other lattice points 102 in the propagating direction of light L diffracted in the direction of 0 degree, ±90 degrees, and 180 degrees. Accordingly, the diffraction light L is diffracted again in the direction of 0 degree, ±90 degrees, and 180 degrees with respect to the propagating direction. Then, the light L propagating in Γ-X direction is returned to the original lattice point 102 by repeating the aforementioned diffraction once or plural times. Thus, the two-dimensional photonic crystal 100 is resonated. In using a square lattice, there also exists a diagonal direction i.e. Γ-M direction, as a typical direction. Accordingly, it is possible to oscillate the two-dimensional photonic crystal 100 using Γ-M direction, based on the same principle as described above.

There are four modes as resonance modes at which light is oscillatable by resonance. If a xy coordinate system is defined on a two-dimensional plane of the two-dimensional photonic crystal 100, with an arbitrary lattice point 102 being defined as a coordinate origin, a standing wave to be formed by resonance at the lattice point 102 has the following features in each of the modes, as shown in FIGS. 33A through 36B.

In the first mode (hereinafter, called as "A mode"), a primary component Ey of standing wave, which is composed of a y-direction component of electric field to be formed in x-axis direction, starts at +sin (see A1), and a primary component Ex of standing wave, which is composed of an x-direction component of electric field to be formed in y-axis direction, starts at sin (see A2). As a result, the electric field distribution is as shown in FIG. 33A.

In the second mode (hereinafter, called as "B mode"), a primary component Ey of standing wave, which is composed of a y-direction component of electric field to be formed in x-axis direction, starts at +sin (see B1), and a primary component Ex of standing wave, which is composed of an x-direction component of electric field to be formed in y-axis direction, starts at +sin (see B2). As a result, the electric field distribution is as shown in FIG. 34A.

In the third mode (hereinafter, called as "C mode"), a primary component Ey of standing wave, which is composed of a y-direction component of electric field to be formed in x-axis direction, starts at +cos (see C1), and a primary component Ex of standing wave, which is composed of an x-direction component of electric field to be formed in y-axis direction, starts at +cos (see C2). As a result, the electric field distribution is as shown in FIG. 35A.

In the fourth mode (hereinafter, called as "D mode"), a primary component Ey of standing wave, which is composed of a y-direction component of electric field to be formed in x-axis direction, starts at +cos (see D1), and a primary component Ex of standing wave, which is composed of a z-direction component of electric field to be formed in y-axis direction, starts at −cos (see D2). As a result, the electric field distribution is as shown in FIG. 36A.

As is obvious from FIG. 35A and FIG. 36A, the electric field distributions are identical to each other, when one of the electric field distributions is rotated by 90 degrees. Accordingly, C mode and D mode are in a relation of degeneration.

The Bragg condition is also satisfied in a direction perpendicular to a plane of the two-dimensional photonic crystal 100. Accordingly, laser light is emitted in the direction perpendicular to the crystal plane in a state that in-plane electric field distributions are considered. In A mode and B mode, the electric field distribution is an odd function with respect to the lattices of the two-dimensional photonic crystal 100. Accordingly, diffraction waves in the perpendicular direction cancel with each other (generate cancellative coherence). As a result, theoretically, laser light is not emitted in the direction perpendicular to the plane of the two-dimensional photonic crystal 100. On the other hand, in C mode and D mode, the electric field distribution is an even function with respect to the lattices of the two-dimensional photonic crystal 100. Accordingly, laser light is emitted, without generating cancellative coherence. Observing the performance of a crystal-based resonator capable of trapping waves, the performance of the resonator is high with respect to A mode and B mode, and low with respect to C mode and D mode. As a result, the two-dimensional photonic crystal plane emission laser having the two-dimensional photonic crystal 100 shown in FIG. 32 has a property that the laser is most likely to oscillate in A mode, second most likely to oscillate in B mode, and hardly likely to oscillate in C mode and D mode.

In an actual device, the lattice number (the periodic number) of the two-dimensional photonic crystal 100 is definite. Accordingly, as shown in FIG. 33B, in A mode, cancellation of electric field components which invokes cancellative coherence is imperfect in electric fields E1, E2; E3, E4 corresponding to the opposing sides of a peripheral portion of the two-dimensional photonic crystal 100, and cancellative coherence in a direction perpendicular to a crystal plane is imperfect at an end portion of the two-dimensional photonic crystal 100. As a result, laser light may leak in the direction perpendicular to the crystal plane even in A mode, and the two-dimensional photonic crystal plane emission laser having the two-dimensional photonic crystal 100 shown in FIG. 32 emits planar light in annular shape (a ring-like shape or a doughnut shape), as shown in FIG. 37.

As a method for improving the performance of a two-dimensional photonic crystal-based resonator in the two-dimensional photonic crystal plane emission laser having the above arrangement, there are proposed firstly, a method of forming a two-dimensional photonic crystal near an active layer, secondly, a method of increasing a refractive index difference between a first medium and a second medium for forming a two-dimensional refractive index distribution of a two-dimensional photonic crystal, and thirdly, a method of increasing the lattice number (the periodic number) of a two-dimensional photonic crystal.

Generally, in an actual device, there is a limit in forming a two-dimensional photonic crystal near an active layer, in view of electrical constraints or thermal constraints. There is also a limit in increasing the refractive index difference in view of material constraints. In view of the above, generally, the third method is adopted.

In the third method, however, increasing the lattice number (the periodic number) in order to improve the performance of a resonator may increase (widen) the light emission area or the element size of a laser element. In view of the above, it is impossible to control (design) the performance of a resonator, and the light emission area or the element size independently of each other. Further, even if the lattice number (the periodic number) is increased, since a two-dimensional photonic crystal has an end portion, light cannot be completely trapped within the crystal. Accordingly, leaking light becomes a light loss for the resonator. In the case where plural laser elements are formed into an array, crosstalk may be generated between the laser elements depending on a leak direction.

There are proposed technologies disclosed in e.g. patent literature 2 and patent literature 3 to improve the performance of a resonator without increasing the lattice number (the periodic number) of a two-dimensional photonic crystal.

In patent literature 2, the two-dimensional photonic crystal is constituted of a first area and a second area. The first area is formed by two-dimensionally arranging refractive bodies with a first-order period for diffracting light to be emitted from an active layer within the photonic crystal. The second area is surrounded by the first area, and is formed by two-dimensionally arranging refractive bodies with a second-order period for diffracting light to be emitted from the active layer in a direction substantially perpendicular to a principal plane of the photonic crystal. In this way, disposing the first area around an outer periphery of the second area enables to trap light leaking from the second area into the first area by Bragg reflection.

Patent literature 3 discloses a two-dimensional photonic crystal, wherein a light reflecting area constituted of a low-refractive mirror is formed by e.g. forming an air-trapping groove in the perimeter of the crystal in a direction horizontal to a crystal plane. Thus, forming the light reflecting area in the periphery of the crystal in the direction horizontal to the crystal plane enables to reduce a likelihood that light may leak from the two-dimensional photonic crystal by Fresnel reflection.

In the technology disclosed in patent literature 2, it is necessary to increase the periodic number with respect to the first area to sufficiently trap light by Bragg reflection. Accordingly, although it is possible to decrease (narrow) the light emission area (the second area), it is difficult to decrease the size of a laser element itself, which corresponds to the sum of the first area and the second area.

In the technology disclosed in patent literature 3, since light is reflected by Fresnel reflection, it is difficult to completely reflect light. Thus, there is a limit in improving the performance of a resonator.

Further, neither patent literature 2 nor patent literature 3 recites or remotely suggests an influence of reflection light on light which is resonated within a two-dimensional photonic crystal.

Patent literature 1: JP 2000-332351A
Patent literature 2: JP2001-308457A
Patent literature 3: JP2003-273456A

DISCLOSURE OF THE INVENTION

An object of the invention is to provide a two-dimensional photonic crystal plane emission laser that enables to improve the performance of a two-dimensional photonic crystal-based resonator, without increasing the light emission area or the element size of a laser element.

A two-dimensional photonic crystal plane emission laser of the invention includes a two-dimensional photonic crystal which has a two-dimensional photonic crystal area and a light reflecting area, and which selects a wavelength of light to be generated in an active layer. The light reflecting area is formed in such a manner that when light leaking from the two-dimensional photonic crystal area and reflected on a reflecting surface of the light reflecting area is returned to the two-dimensional photonic crystal area, the reflection light is combined with a standing wave residing in a propagating direction of the reflection light without disturbing its resonant state. In this arrangement, the performance of a two-dimensional photonic crystal-based resonator can be improved. As a result, the performance of the two-dimensional photonic crystal-based resonator can be improved without increasing the light emission area or the element size of a laser element. Thereby, an electric current value (a threshold value of an operational current) at which laser emission is started can be reduced.

BEST MODE FOR CARRYING OUT THE INVENTION

Figure 1:
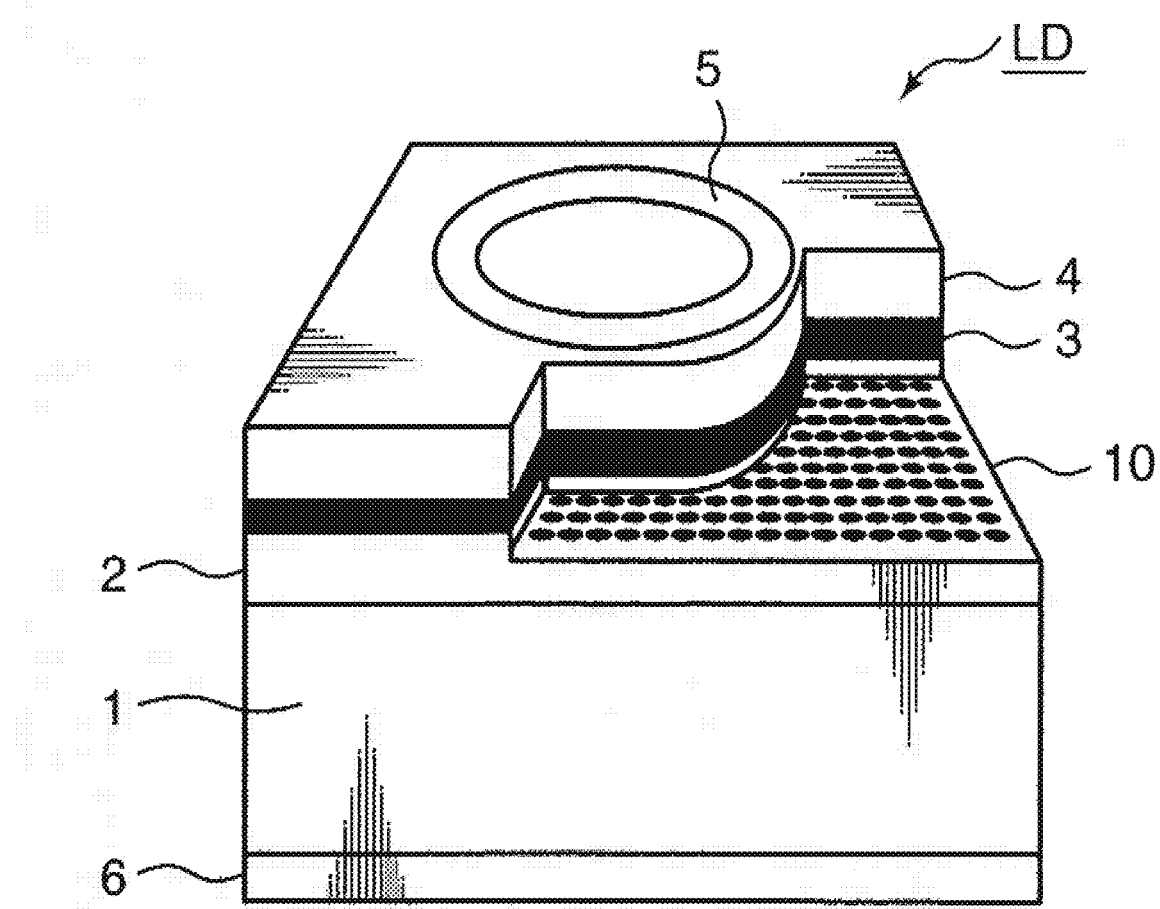
FIG. 1 is a partially cross-sectional perspective view showing an arrangement of a two-dimensional photonic crystal plane emission laser embodying the invention.

In the following, an embodiment of the invention is described referring to the drawings. Elements having like reference numerals throughout the drawings have like arrangement, and repeated description thereof is omitted herein.

Figure 2:
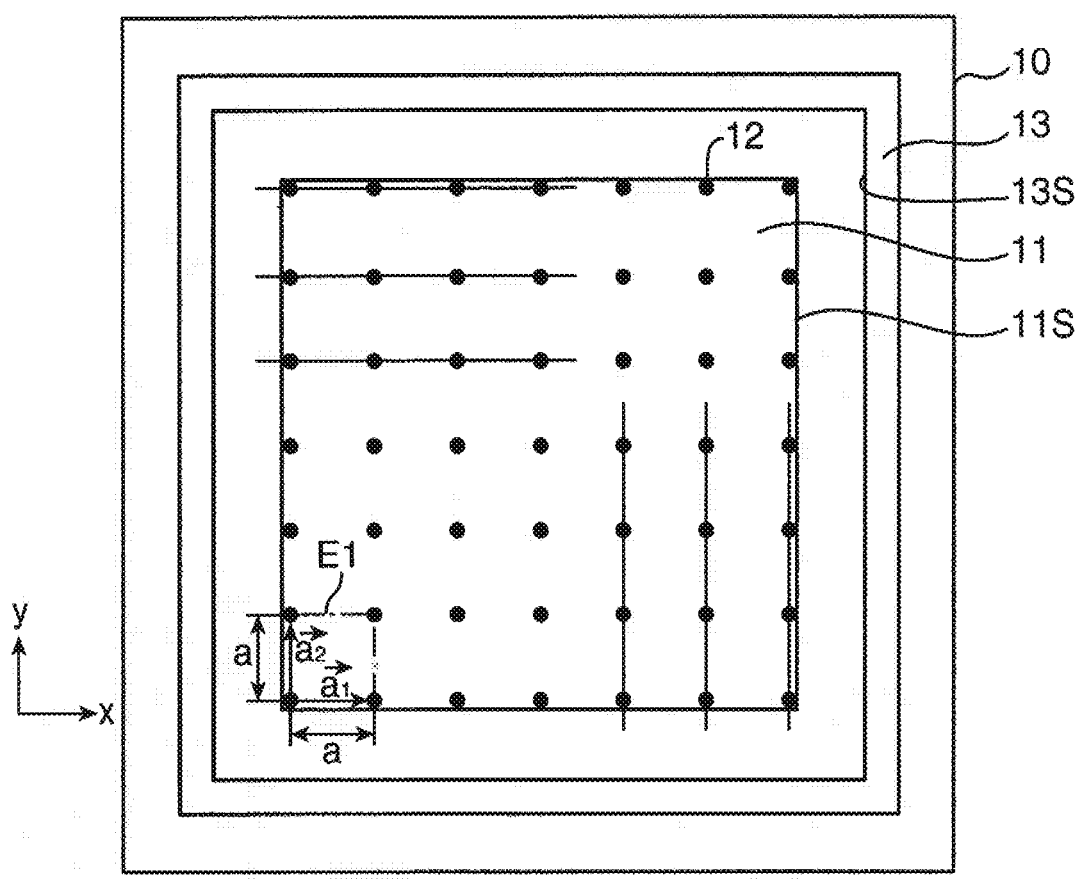
FIG. 2 is a top plan view showing a structure of a two-dimensional photonic crystal to be used in the two-dimensional photonic crystal plane emission laser embodying the invention.

FIG. 1 is a partially cross-sectional perspective view showing an arrangement of a two-dimensional photonic crystal plane emission laser embodying the invention. FIG. 2 is a top plan view showing a structure of a two-dimensional photonic crystal to be used in the two-dimensional photonic crystal plane emission laser in the embodiment.

Referring to FIG. 1, a two-dimensional photonic crystal plane emission laser LD in this embodiment includes a substrate 1, a first conductive semiconductor layer 2 of a first conductive type, which is formed on a principal plane of the substrate 1, an active layer 3 to be formed on the first conductive semiconductor layer 2, a second conductive semiconductor layer 4 of a second conductive type different from the first conductive type, a two-dimensional photonic crystal 10 for selecting a wavelength of light to be generated in the active layer 3, a first electrode 5 to be formed on the second conductive semiconductor layer 4 and having an annular shape (a ring-like shape or a doughnut shape), and a second electrode 6 to be formed on the entire surface of the other principal plane of the substrate 1 opposing to the one principal plane.

The first conductive semiconductor laser 2 is e.g. an n-type semiconductor layer, using electrons as carriers, and is formed of e.g. an n-InP. The second conductive semiconductor layer 4 is e.g. a p-type semiconductor layer, using e.g. holes (positive holes) as carriers, and is formed of e.g. a p-InP.

The layers 2, 3, and 4 are laminated on the substrate 11 as described above, with the active layer 3 being sandwiched between the first conductive semiconductor layer 2 and the second conductive semiconductor laser 4 by laminating. Light is generated (emitted) by carrier impregnation. A well-known and general material and structure may be applied to the active layer 3. The material and the structure are selected so that light of an intended wavelength is emitted depending on a purpose of use. The active layer 3 has a multiple quantum well structure made of e.g. an InGaAs/InGaAsP-based semiconductor material.

The first conductive semiconductor layer 2 and the second conductive semiconductor layer 4 are made of a material having a lower refractive index than the refractive index of the active layer 3, and serve as a lower clad layer and an upper clad layer, respectively. The first conductive semiconductor layer 2 and the second conductive semiconductor layer 4 constitute a double-hetero junction, with the active layer 3 being interposed therebetween to trap carriers, and concentrate the carriers contributing to light emission on the active layer 3. The InP is a material having a lower refractive index than the refractive index of the active layer 3, in the case where the active layer 3 has a multiple quantum well structure made of the InGaAs/InGaAsP-based semiconductor material. Alternatively, for instance, InGaAsP, GaAs, and InGaAs, as the same III-V group compound semiconductor materials as the InP, may be suitably used, in place of the InP. The refractive indexes of these compound semiconductor materials can be changed within a predetermined range by changing a mixed crystal ratio. Further alternatively, an organic semiconductor material such as 8-quinolynol-Al complex ($Aiq_3$) may be used.

Alternatively, another layer may be interposed between the first conductive semiconductor layer 2 and the active layer 3. Further alternatively, another layer may be interposed between the second conductive semiconductor layer 4 and the active layer 3. Further alternatively, another layer may be interposed between the first conductive semiconductor layer 2 and the active layer 3, and another layer may be interposed between the second conductive semiconductor layer 4 and the active layer 3.

The first electrode 5 and the second electrode 6 are e.g. a gold-based electrode. Carriers are impregnated into the active layer 3 by applying a voltage between the first electrode 5 and the second electrode 6. The active layer 3 emits light when a voltage of a predetermined value or more is applied between the first electrode 5 and the second electrode 6. Setting the area of one electrode 5 (6) smaller than the area of the other electrode 6 (5) enables to selectively emit laser light from a surface where the electrode 5 (6) having the smaller area is formed. In this embodiment, the first electrode 5 has a smaller area than the area of the second electrode 6, and the upper surface of the second conductive semiconductor layer 4 serves as an exit surface from which laser light is emitted. Preferably, the first electrode 5 is made of a transparent conductive material with respect to a wavelength of laser light to be emitted from the two-dimensional photonic crystal plane emission laser LD.

As shown in FIG. 2, the two-dimensional photonic crystal 10 includes a two-dimensional photonic crystal area 11 having a two-dimensional periodic refractive index distribution for forming a photonic band gap, and a light reflecting area 13 which is formed in the periphery of the two-dimensional photonic crystal area 11, in a direction (e.g. in a direction horizontal to a crystal plane) along which the refractive index distribution is spread. The two-dimensional photonic crystal 10 is an optical element for selecting the wavelength of light to be generated in the active layer 3. In this embodiment, the two-dimensional photonic crystal 10 is formed e.g. in the first conductive semiconductor layer 2 at a position near the active layer 3. Alternatively, the two-dimensional photonic crystal 10 may be formed in the second conductive semiconductor layer 4, or on both sides of the active layer 3 i.e. in the first conductive semiconductor layer 2 and the second conductive semiconductor layer 4, or in the active layer 3.

The two-dimensional periodic refractive index distribution is formed by arranging lattice points 12 made of a material having a refractive index different from the refractive index of a material for forming the first conductive semiconductor layer 2, in two directions (linearly independent two directions) different from each other with a predetermined period (a lattice interval or a lattice constant). In this embodiment, the lattice points 12 are formed of e.g. column-shaped recesses (hollow holes) formed in the first conductive semiconductor layer 2. Alternatively, a material having a refractive index different from the refractive index of a material for forming the first conductive semiconductor layer 2 may be filled in the column-shaped recesses (hollow holes). For instance, in the case where the first conductive semiconductor layer 2 is formed of the n-InP as described above, an SiN having a lower refractive index than the refractive index of the n-InP is filled in the column-shaped recesses (hollow holes).

The two-dimensional photonic crystal 10 is constructed in such a manner that a reflecting surface 13S of the light reflecting area 13 is disposed at such a position that, assuming that each of propagating directions of diffraction light residing in the two-dimensional photonic crystal area 11 is represented by a unit vector whose magnitude is 1, and one of the unit vectors is selected, the direction of a synthesized vector obtained by summing up all the unit vectors representing the propagating directions of diffraction light of an even number, which includes the selected unit vector and lies within an angle range less than 180 degrees, is aligned with a tangential direction; and that the distance from an end surface 11S of the two-dimensional photonic crystal area 11 to the reflecting surface 13S of the light reflecting area 13 is set to such a value that in the case where diffraction light in one of the propagating directions is reflected on the reflecting surface 13S, the propagating direction and the phase of the reflection light, and the propagating direction and the phase of light in other one of the propagating directions are coincident with each other, respectively.

For instance, as shown in FIG. 2, the two-dimensional photonic crystal 10 is constructed in such a manner that the reflecting surface 13S of the light reflecting area 13 is disposed at such a position that, assuming that an angle range from 0 degree to less than 180 degrees, which is obtained by dividing 360 degrees into two sections, is defined so that propagating directions of an even number are obtained out of the propagating directions of diffraction light in the two-dimensional photonic crystal area 11, the direction of a synthesized vector obtained by summing up all the unit vectors representing the propagating directions of the even number residing in the angle range is aligned with a tangential direction; and that the distance from the end surface 11S of the two-dimensional photonic crystal area 11 to the reflecting surface 13S of the light reflecting area 13 is set to such a value that in the case where diffraction light in one of the propagating directions is reflected on the reflecting surface 13S, the propagating direction and the phase of the reflection light, and the propagating direction and the phase of light in other one of the propagating directions are coincident with each other, respectively.

The light reflecting area 13 is an optical element for reflecting light leaking from the two-dimensional photonic crystal area 11, and returning the leaking light to the two-dimensional photonic crystal area 11. For instance, the light reflecting area 13 is made of a material having a refractive index different from the effective refractive index of the two-dimensional photonic crystal area 11. Since the refractive index of the light reflecting area 13 having the above arrangement is different from the effective refractive index of the two-dimensional photonic crystal area 11, there is formed an optical boundary surface between the two-dimensional photonic crystal area 11 and the light reflecting area 13. Accordingly, it is possible to reflect leaking light from the two-dimensional photonic crystal area 11 on the boundary surface (the reflecting surface 13S), and return the leaking light to the two-dimensional photonic crystal area 11.

Further, for instance, the light reflecting area 13 is made of a material having a smaller refractive index than the effective refractive index of the two-dimensional photonic crystal area 11. The reflecting surface 13S of the light reflecting area 13 is not necessarily a total reflecting surface, but may be a Fresnel reflecting surface. As will be described later, leaking light from the two-dimensional photonic crystal area 11 is obliquely incident into the light reflecting area 13. Accordingly, the light reflecting area 11 having the above arrangement allows for total reflection of leaking light from the two-dimensional photonic crystal area 11. It is needless to say that the light reflecting area 11 may be a Bragg reflection mirror formed by alternately laminating layers of materials having refractive indexes different from each other. A larger reflectance is obtained from a Fresnel reflecting surface in the case where light is obliquely incident, as compared with a case that light is vertically incident.

Further, for instance, the reflecting surface 13S of the light reflecting area 13 is a total reflecting surface which causes total reflection of laser light which is oscillated in a plane of the two-dimensional photonic crystal area 11. In this arrangement, since the oscillated laser light is subjected to total reflection, the performance of a resonator with respect to the wavelength of the laser light is improved, thereby efficiently oscillating the laser light.

It is necessary to make a predetermined period in a two-dimensional refractive index distribution equal to an integral multiple of a wavelength (in this example, an in-medium wavelength) with which laser light is intended to be oscillated in order to function the two-dimensional photonic crystal 10 as a resonator.

Generally, in a two-dimensional periodic structure, assuming that primitive translation vectors (primitive unit vectors) are a1 and a2, and primitive reciprocal lattice vectors are b1 and b2, the vectors are required to satisfy an orthonormal condition: $a1 \cdot b1 = a2 \cdot b2 = 2\pi$, $a1 \cdot b2 = a2 \cdot b1 = 0$. The direction of the reciprocal lattice vector Gm ($=m1 \times b1 + m2 \times b2$, where m1, m2 is an arbitrary integer) is a tangential direction to a lattice plane, and the length of the reciprocal lattice vector is an inverse number of the plane interval.

In the two-dimensional photonic crystal 10 having the above arrangement, making a predetermined period in a two-dimensional refractive index distribution equal to an integer multiple of a wavelength (in this example, an in-medium wavelength) with which laser light is intended to be oscillated means that a component kp (hereinafter, called as "in-plane wave number vector") of a wave number vector of light in a direction parallel to a plane of the two-dimensional photonic crystal satisfies a relation: $kp = (l1 \times b1 + l2 \times b2)$ (where l1, l2 is an arbitrary integer).

In this case, in the two-dimensional photonic crystal 10, light forms a standing wave when combined with a diffraction wave obtained by Bragg diffraction, whereby light is resonated. Specifically, an in-plane wave number vector kp', whose magnitude is equal to the magnitude of the original in-plane wave number vector kp, or whose orientation is substantially equal to the orientation of the original in-plane wave number vector kp is derived from the original in-plane wave number vector kp by diffraction, and an equation 1: $kp' = kp + Gn = ((l1+m1) \times b1 + (l2+m2) \times b2) = (n1 \times b1 + n2 \times b2)$ (where n1, n2 is an arbitrary integer) is established.

Figure 3:
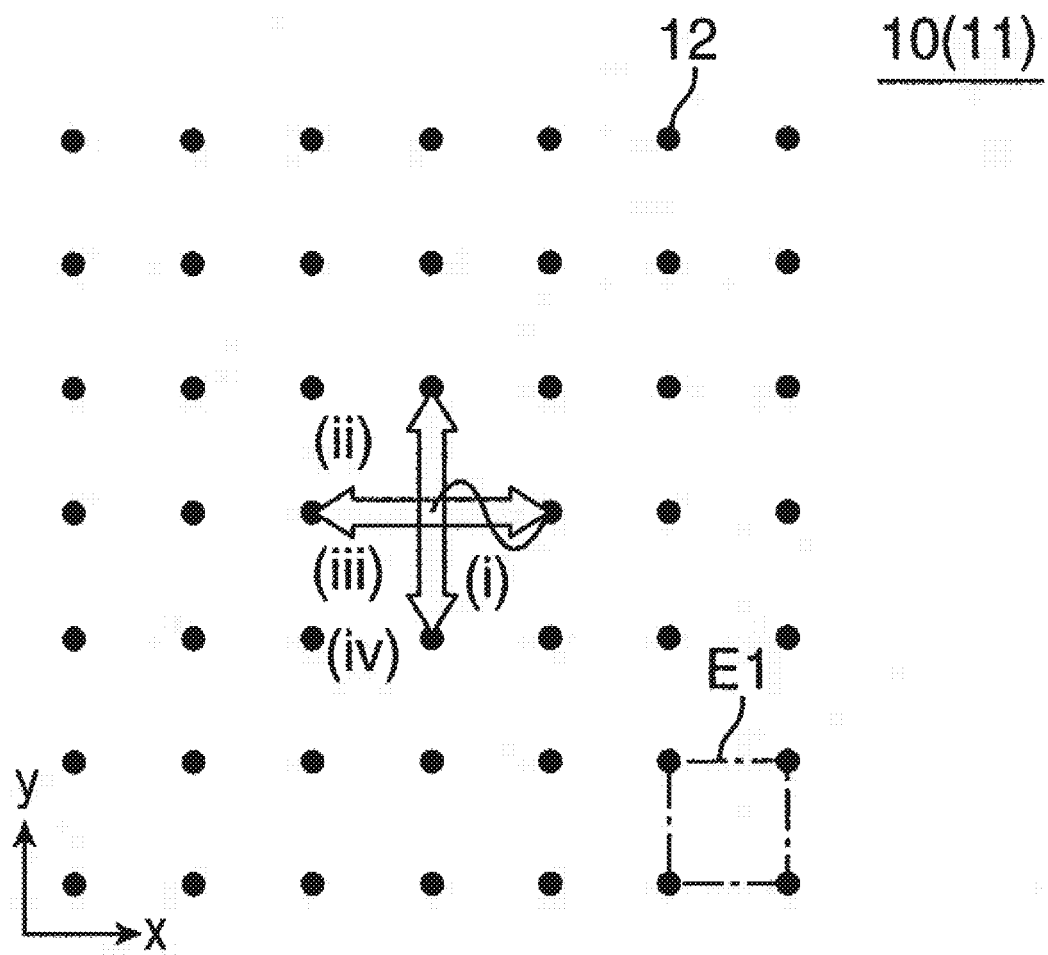
FIG. 3 is a diagram for describing a diffraction state of the two-dimensional photonic crystal in a first case.
Figure 4A:
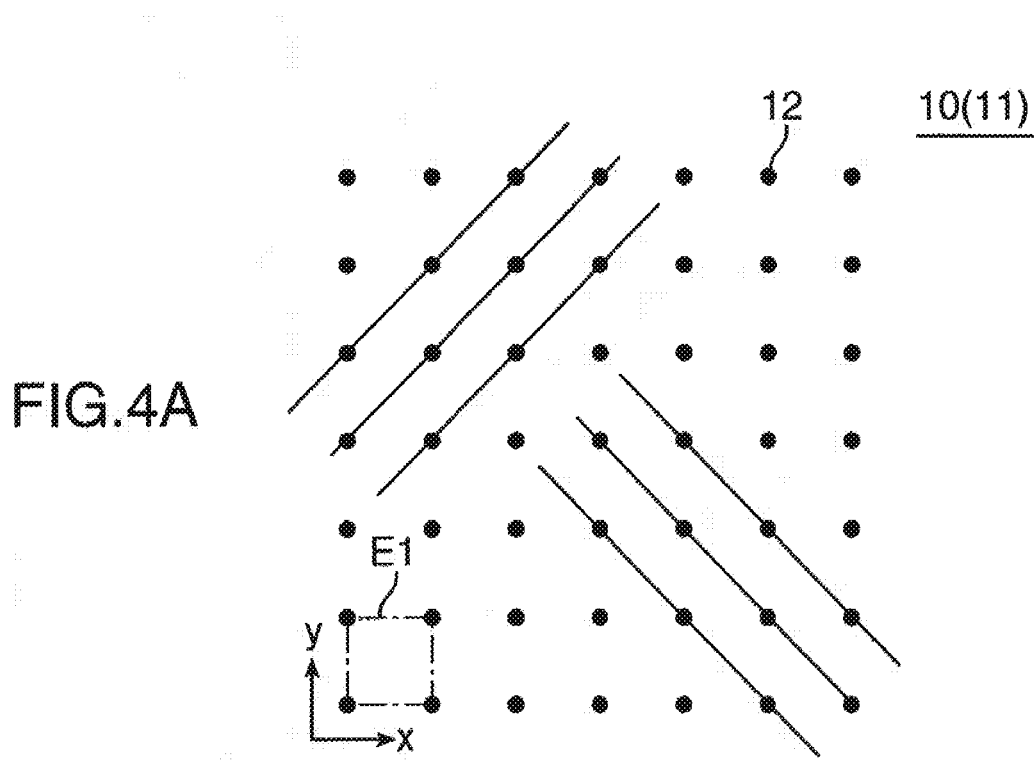
FIGS. 4A and 4B are diagrams for describing a second period and a third period in a two-dimensional periodic structure constituted of square lattices having a lattice interval "a".
Figure 4B:
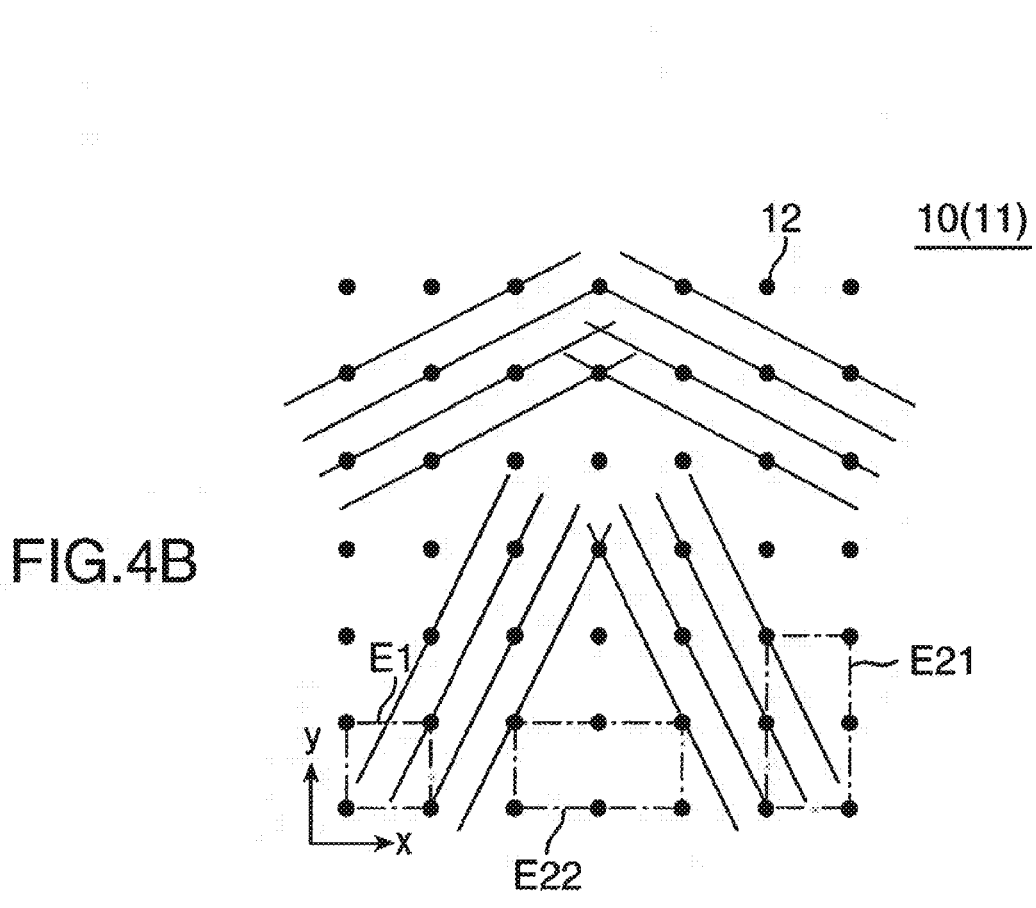
Figure 5A:
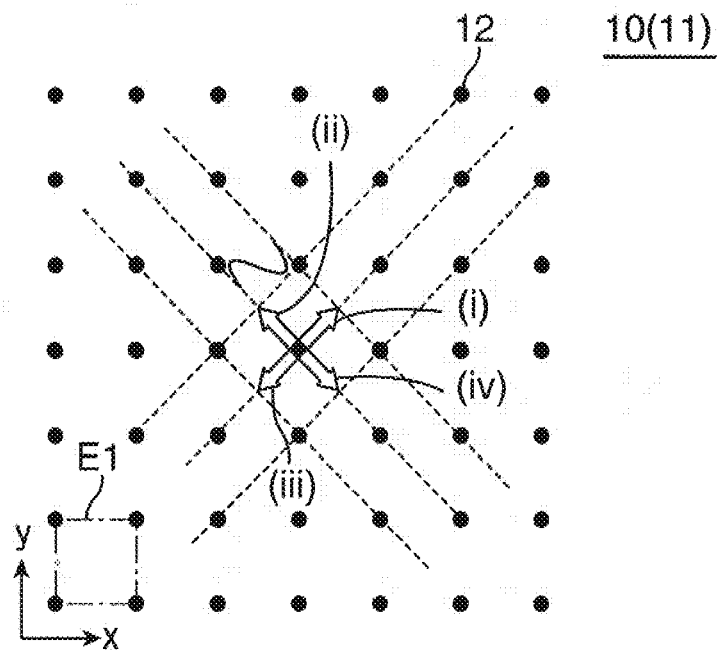
FIGS. 5A and 5B are diagrams for describing diffraction states of the two-dimensional photonic crystal in a second case and a third case.
Figure 5B:
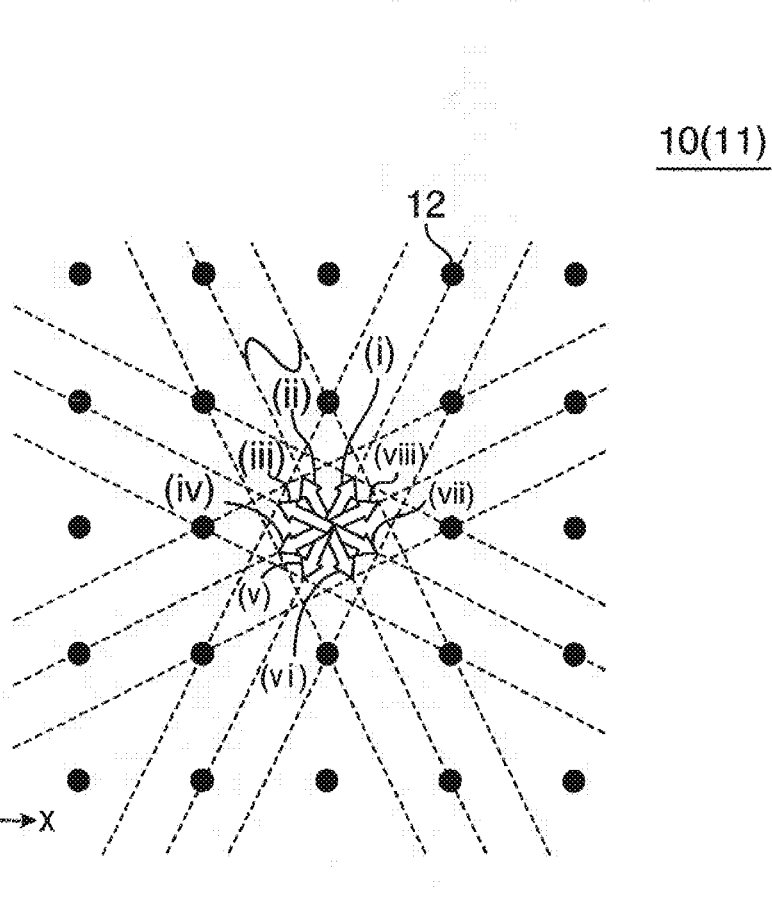
Figure 6:
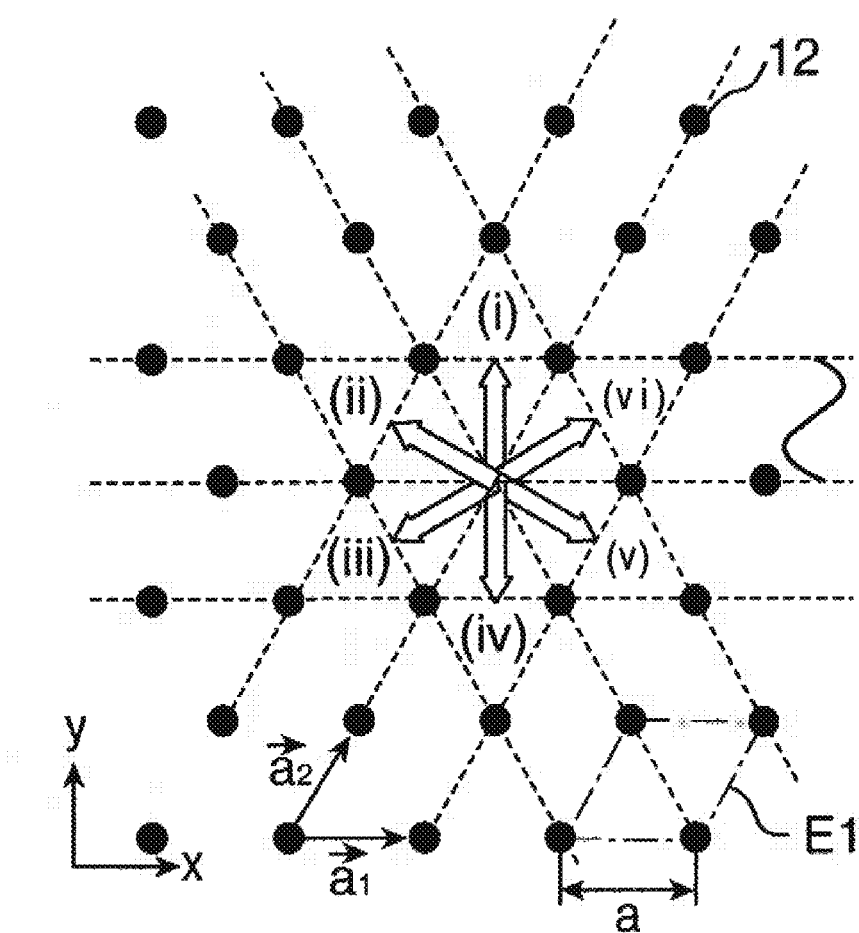
FIG. 6 is a diagram for describing a diffraction state of the two-dimensional photonic crystal, in the case where a lattice element is a triangular lattice.
Figure 7:
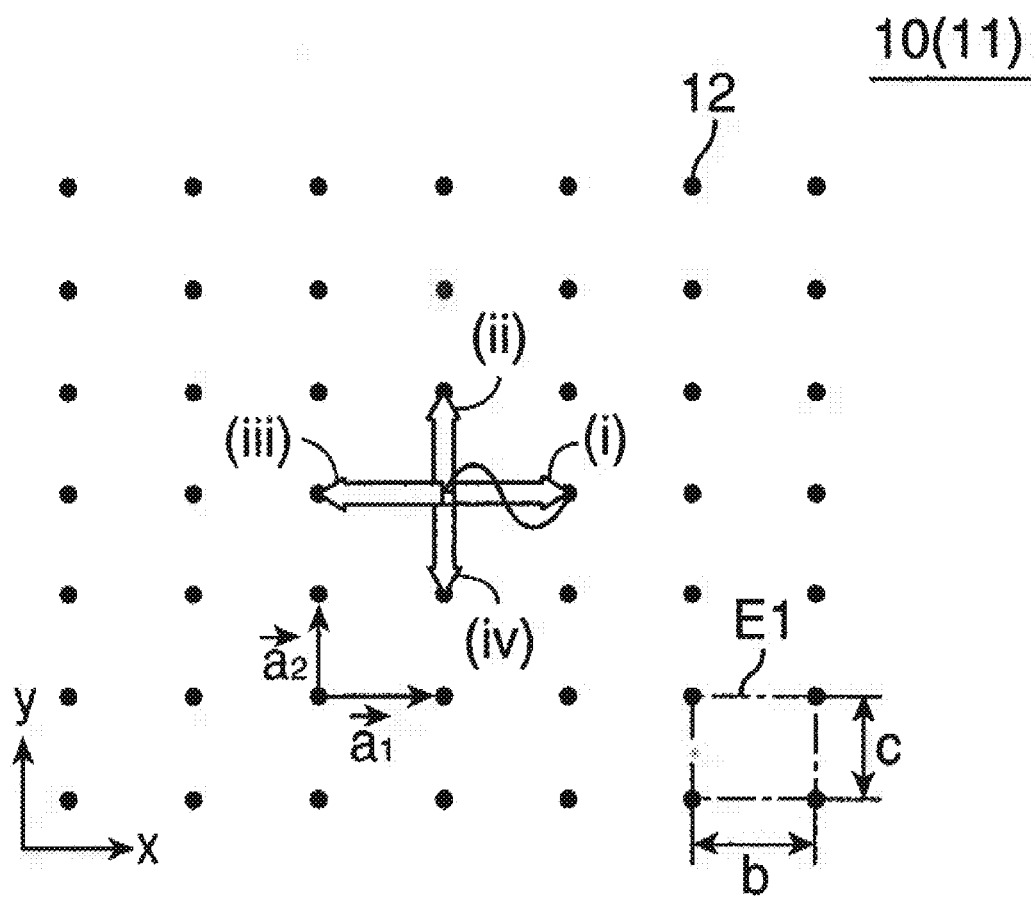
FIG. 7 is a diagram for describing a diffraction state of the two-dimensional photonic crystal, in the case where a lattice element is a rectangular lattice.
Figure 8:
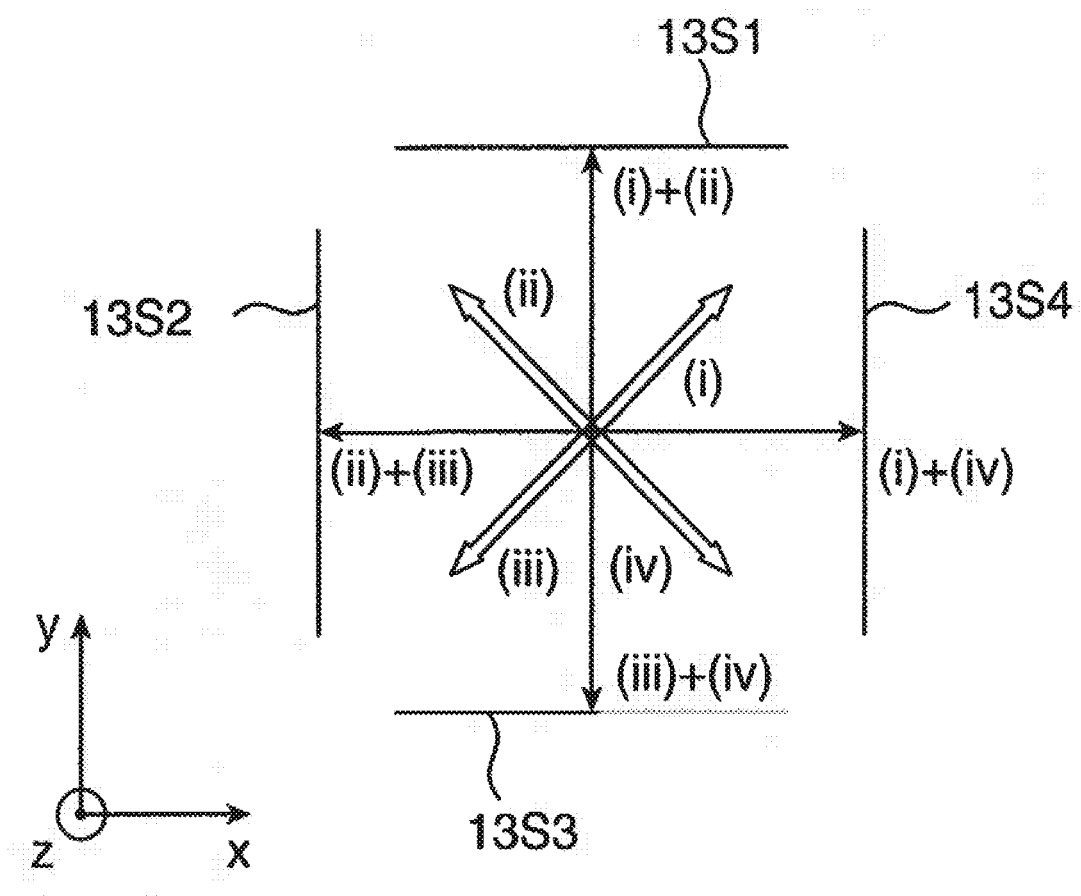
FIG. 8 is a diagram for describing plane directions of a reflecting surface.

FIG. 3 is a diagram for describing a diffraction state of the two-dimensional photonic crystal in a first case. FIGS. 4A and 4B are diagrams for describing a second period and a third period in a two-dimensional periodic structure constituted of square lattices having the lattice interval "a". FIGS. 5A and 5B are diagrams for describing diffraction states of the two-dimensional photonic crystal in a second case and a third case. FIGS. 4A and 5A show the second case, and FIGS. 4B and 5B show the third case. FIG. 6 is a diagram for describing a diffraction state of the two-dimensional photonic crystal, in the case where a lattice element is a triangular lattice. FIG. 7 is a diagram for describing a diffraction state of the two-dimensional photonic crystal, in the case where a lattice element is a rectangular lattice. FIG. 8 is a diagram for describing plane directions of a reflecting surface.

As shown in FIG. 2, in the case where the two-dimensional photonic crystal 10 (two dimensional photonic crystal area 11) is constituted of square lattices having the lattice interval "a", the lattice element E1 has a square shape with the length of one side thereof being "a", the primitive translation vectors a1 and a2 are respectively expressed by $a1 = (a, 0)$, $a2 = (0, a)$, and the primitive reciprocal lattice vectors b1 and b2 are respectively expressed by $b1 = (2\pi/a, 0)$, $b2 = (0, 2\pi/a)$.

As shown in FIG. 2, in the two-dimensional photonic crystal 10 (two-dimensional photonic crystal area 11) constituted of square lattices having the lattice interval "a", there exists, as a basic structure, a first two-dimensional periodic structure (the first case), wherein a first direction and a second direction of a periodic structure respectively coincide with two directions aligned with two sides of the lattice element E1 orthogonal to each other; and a first period of the periodic structure in the first direction, and a second period of the periodic structure in the second direction are equal to the lattice interval "a" of the square lattice.

In the basic two-dimensional periodic structure, in the case where l1=1 and l2=0, assuming that (m1, m2)=(−2, 0), (−1, 1), (−1, −1), then, (n1, n2)=(−1, 0), (0, 1), (0, −1). Thus, the equation (1) satisfies |kp|=|kp'|. Setting an xy coordinate system on a two-dimensional plane of the two-dimensional photonic crystal 10 (two-dimensional photonic crystal area 11) so that y-axis direction and x-axis direction respectively coincide with the direction of the primitive translation vector a1 and the direction of the primitive translation vector a2 means, as shown in FIG. 3, conversion of a lightwave (i) propagating in x-axis direction (primitive translation vector a2 direction), as indicated by the corresponding bold arrow, into one of a lightwave (ii) ((n1, n2)=(−1, −1)) propagating in y-axis direction (primitive translation vector a1 direction), as indicated by the corresponding bold arrow, a lightwave (iii) ((n1, n2)=(−1, 0)) propagating in −x axis direction (primitive translation vector a2 direction), as indicated by the corresponding bold arrow, and a lightwave (iv) ((n1, n2)=(0, −1)) propagating in −y axis direction (primitive translation vector −a1 direction), as indicated by the corresponding bold arrow, by diffraction.

In the two-dimensional photonic crystal 10 (two-dimensional photonic crystal area 11) constituted of square lattices having the lattice interval "a", there also exist a periodic direction and a period different from the periodic direction and the period shown in FIG. 2. For instance, as shown in FIG. 4A, there exists a second two-dimensional periodic structure (the second case), wherein a first direction and a second direction of a periodic structure respectively coincide with two directions aligned with two diagonals of the lattice element E1 orthogonal to each other; and a first period of the periodic structure in the first direction, and a second period of the periodic structure in the second direction are equal to $1/\sqrt{2}$ times of the lattice interval "a" of the square lattice.

In the second two-dimensional periodic structure, for instance, in the case where l1=1 and l2=1, assuming that (n1, n2)=(1, −1), (−1, −1), (−1, 1), then, the equation 1 satisfies |kp|=|kp'|. This means, as shown in FIG. 5A, conversion of a lightwave (i) propagating in a direction of +45 degrees with respect to x-axis direction, as indicated by the corresponding bold arrow, into one of a lightwave (ii) ((n1, n2)=(−1, 1)) propagating in a direction of +135 degrees with respect to x-axis direction, as indicated by the corresponding bold arrow, a lightwave (iii) ((n1, n2)=(−1, −1)) propagating in a direction of +225 degrees with respect to x-axis direction, as indicated by the corresponding bold arrow, and a lightwave (iv) ((n1, n2)=(1, −1)) propagating in a direction of +315 degrees with respect to +x axis direction, as indicated by the bold arrow, by diffraction. The counterclockwise direction in FIG. 5A corresponds to a positive (plus, +) direction with respect to x-axis direction.

In the two-dimensional photonic crystal 10 (two-dimensional photonic crystal area 11) constituted of square lattices having the lattice interval "a", for instance, as shown in FIG. 4B, there also exists a third two-dimensional periodic structure (the third case), wherein, assuming that two lattice elements E1 adjacent to each other in y-axis direction constitute a first unit lattice E21 having a periodic structure, a first direction and a second direction of the periodic structure respectively coincide with two directions aligned with two diagonals of the unit lattice E21 orthogonal to each other; and assuming that two lattice elements E1 adjacent to each other in x-axis direction constitute a second unit lattice E22 having a periodic structure, a third direction and a fourth direction of the periodic structure respectively coincide with two directions aligned with two diagonals of the unit lattice E22 orthogonal to each other, and a first period of the periodic structure in the first direction, and a fourth period of the periodic structure in the fourth direction coincide with $1/\sqrt{5}$ times of the lattice interval "a" of the square lattice.

In the third two-dimensional periodic structure, for instance, in the case where l1=1 and l2=2, assuming that (n1, n2)=(−1, 2), (−2, 1), (−2, −1), (−1, −2), (1, −2), (2, −1), (2, 1), then, the equation 1 satisfies |kp|=|kp'|. This means, as shown in FIG. 5B, conversion of a lightwave (i) propagating in the direction (i) (the first direction), as indicated by the corresponding bold arrow, into one of a lightwave (ii) ((n1, n2)=(−1, 2)) propagating in the direction (ii), as indicated by the corresponding bold arrow, a lightwave (iii) ((n1, n2)=(−2, 1)) propagating in the direction (iii), as indicated by the corresponding bold arrow, a lightwave (iv) ((n1, n2)=(−2, −1)) propagating in the direction (iv), as indicated by the corresponding bold arrow, a lightwave (v) ((n1, n2)=(−1, −2)) propagating in the direction (v), as indicated by the corresponding bold arrow, a lightwave (vi) ((n1, n2)=(1, −2)) propagating in the direction (vi), as indicated by the corresponding bold arrow, a lightwave (vii) ((n1, n2)=(2, −1)) propagating in the direction (vii), as indicated by the corresponding bold arrow, and a lightwave (viii) ((n1, n2)=(2, 1)) propagating in the direction (viii), as indicated by the corresponding bold arrow, by diffraction.

In the foregoing, the first case through the third case have been described. Alternatively, the equation |kp|=|kp'| may be established, even in the case where a higher order period (other periodic direction and other period) is used. In the foregoing, the arrangement that the lattice element E1 is a square lattice has been described. Alternatively, as shown in FIGS. 6 and 7, the equation |kp|=|kp'| may be established, even in the case where a lattice of other shape e.g. a triangular lattice or a rectangular lattice is used.

An example is described in the case where a triangular lattice is used. Assuming that "a" is the lattice interval, the lattice element E1 has a rhombic shape with the length of one side thereof being "a", primitive translation vectors a1 and a2 are respectively expressed by a1=(a, 0), a2=(a/2, (a$\sqrt{3}$)/2), and primitive reciprocal lattice vectors b1 and b2 are respectively expressed by b1=(2π/a, −(2π$\sqrt{3}$)/(3 a)), b2=(0, (4π$\sqrt{3}$)/(3 a)).

In the two-dimensional periodic structure constituted of triangular lattices, for instance, in the case where l1=0 and l2=1, assuming that (n1, n2)=(−1, 0), (−1, −1), (0, −1), (1, 0), (1, 1), then, the equation 1 satisfies |kp|=|kp'|. This means, as shown in FIG. 6, conversion of a lightwave (i) propagating in a direction (i) (+y axis direction), as indicated by the corresponding bold arrow, into one of a lightwave (ii) ((n1, n2)=(−1, 0)) propagating in a direction (ii), as indicated by the corresponding bold arrow, a lightwave (iii) ((n1, n2)=(−1, −1)) propagating in a direction (iii), as indicated by the corresponding bold arrow, a lightwave (iv) ((n1, n2)=(0, −1)) propagating in a direction (iv), as indicated by the corresponding bold arrow, a lightwave (v) ((n1, n2)=(1, 0)) propagating in a direction (v), as indicated by the corresponding bold arrow, and a lightwave (vi) ((n1, n2)=(1, 1)) propagating in a direction (vi), as indicated by the corresponding bold arrow, by diffraction.

An example is described in the case where a rectangular lattice is used. Assuming that the lattice intervals are "b" and "c", the lattice element E1 has a rectangular shape with the lengths of the respective sides thereof being "b" and "c", primitive translation vectors a1 and a2 are respectively expressed by a1=(b, 0), a2=(0, c), and primitive reciprocal lattice vectors b1 and b2 are respectively expressed by b1= (2π/b, 0), b2=(0, 2π/c).

In the two-dimensional periodic structure constituted of rectangular lattices, for instance, in the case where l1=1 and l2=0, assuming that (n1, n2)=(−1, 0), then, the equation 1 satisfies |kp|=|kp|'. This means, as shown in FIG. 7, conversion of a lightwave (i) propagating in a direction (i) (+x axis direction), as indicated by the corresponding bold arrow, into a lightwave (iii) ((n1, n2)=(−1, 0)) propagating in a direction (iii), as indicated by the corresponding bold arrow, by diffraction. Alternatively, as far as (|kp|−|kp'|)/|kp|=20% or less, the two-dimensional periodic structure functions as a resonator. In the modification, the lightwave (i) propagating in the direction (i) (+x axis direction), as indicated by the corresponding bold arrow, is convertible into a lightwave (ii) ((n1, n2)=(0, 1)) propagating in a direction (ii), as indicated by the corresponding bold arrow, or a lightwave (iv) ((n1, n2)=(0, −1)) propagating in a direction (iv), as indicated by the corresponding bold arrow, by diffraction.

In the two-dimensional photonic crystal 10 (two-dimensional photonic crystal area 11), a lightwave satisfying the equation 1 is resonated. A proper reflecting surface 13S may be formed with respect to the exemplified lightwave to improve the performance of the two-dimensional photonic crystal 10 (two-dimensional photonic crystal area 11) as a resonator. Specifically, the direction of the reflecting surface 13S, and the distance from the end surface 11S of the two-dimensional photonic crystal area 11 to the reflecting surface 13S of the light reflecting area 13 may be defined so that in the case where a standing wave formed in the two-dimensional photonic crystal area 11 leaks from the two-dimensional photonic crystal area 11, and is reflected on the reflecting surface 13S of the light reflecting area 13, and the reflection light is returned to the two-dimensional photonic crystal area 11, the reflection lightwave is overlapped with the standing wave formed in the two-dimensional photonic crystal area 11. In view of this, the reflecting surface 13S is disposed at such a position that, assuming that each of propagating directions of diffraction light residing in the two-dimensional photonic crystal area 11 is represented by a unit vector whose magnitude is 1, and one of the unit vectors is selected, the direction of a synthesized vector obtained by summing up all the unit vectors representing the propagating directions of diffraction light of an even number, which includes the selected unit vector and lies within an angle range less than 180 degrees, is aligned with a tangential direction; and that the distance from the end surface 11S of the two-dimensional photonic crystal area 11 to the reflecting surface 13S of the light reflecting area 13 is set to such a value that, assuming that diffraction light in one of the propagating directions is reflected on the reflecting surface 13S, the propagating direction and the phase of the reflection light, and the propagating direction and the phase of light in other one of the propagating directions are coincident with each other, respectively. In one aspect, for instance, the reflecting surface 13S may be disposed at such a position that, assuming that an angle range from 0 degree to less than 180 degrees, which is obtained by dividing 360 degrees into two sections, is defined so that propagating directions of an even number are obtained out of the propagating directions of diffraction light in the two-dimensional photonic crystal area 11, the direction of a synthesized vector obtained by summing up all the unit vectors representing the propagating directions of the even number residing in the angle range is aligned with a tangential direction; and that the distance from the end surface 11S of the two-dimensional photonic crystal area 11 to the reflecting surface 13S of the light reflecting area 13 is set to such a value that in the case where diffraction light in one of the propagating directions is reflected on the reflecting surface 13S, the propagating direction and the phase of the reflection light, and the propagating direction and the phase of light in other one of the propagating directions are coincident with each other, respectively. The angle range from 0 degree to less than 180 degrees, which is obtained by dividing 360 degrees into two sections, is a range from 0 degree inclusive to 180 degrees exclusive, and the angle range from 0 degree to less than 180 degrees excludes an angle range from 0 degree to an angle smaller than 180 degrees, such as an angle range from 0 degree to not larger than 80 degrees, and an angle range from 0 degree to not larger than 150 degrees.

An example of a plane direction of the reflecting surface 13S is described. In the case of the second two-dimensional periodic structure (the second case), as shown in FIG. 8, if the reflecting surface 13S is formed so that the lightwave (i) and the lightwave (ii) out of the lightwave (i) through the lightwave (iv) fall in the angle range from 0 degree to less than 180 degrees, which is obtained by dividing 360 degrees into two sections, a reflecting surface 13S1 having a tangential direction aligned with the direction (0, 1) of a synthesized vector ((i)+(ii)) is defined. If the reflecting surface 13S is formed so that the lightwave (ii) and the lightwave (iii) out of the lightwave (i) through the lightwave (iv) fall in the above angle range, a reflecting surface 13S2 having a tangential direction aligned with the direction (−1, 0) of a synthesized vector ((ii)+(iii)) is defined. If the reflecting surface 13S is formed so that the lightwave (iii) and the lightwave (iv) out of the lightwave (i) through the lightwave (iv) fall in the above angle range, a reflecting surface 13S3 having a tangential direction aligned with the direction (0, −1) of a synthesized vector ((iii)+(iv)) is defined. If the two-dimensional photonic crystal 10 is constructed so that the lightwave (iv) and the lightwave (i) out of the lightwave (i) through the lightwave (iv) fall in the above angle range, a reflecting surface 13S4 having a tangential direction aligned with the direction (1, 0) of a synthesized vector ((iv)+(i)) is defined. Thus, the reflecting surface 13S of the light reflecting area 13 is defined in such a manner that the reflecting surface 13S surrounds the entire periphery of the two-dimensional photonic crystal area 11. Setting an xyz orthogonal coordinate system, wherein z-axis in a direction perpendicular to the plane of FIG. 8 is added to the xy coordinate system, and assuming that each of the reflecting surfaces 13S1 through 13S4 constitutes a flat plane, the reflecting surface 13S1 and the reflecting surface 13S3 are each a flat plane in parallel to zx plane, and the reflecting surface 13S2 and the reflecting surface 13S4 are each a flat plane in parallel to yz plane.

In the two-dimensional photonic crystal plane emission laser LD provided with the two-dimensional photonic crystal 10 of the above arrangement, upon application of a voltage of a predetermined value or more between the first electrode 5 and the second electrode 6, the active layer 3 emits light, and the light is incident from the active layer 3 into the two-dimensional photonic crystal 10. The light incident into the two-dimensional photonic crystal 10 is amplified and oscillated by resonance of light having a wavelength depending on the lattice constant of the two-dimensional photonic crystal 10 (two-dimensional photonic crystal area 11), whereby laser light is emitted in a plane direction. In this embodiment, the two-dimensional photonic crystal 10 is constructed in such a manner that the light reflecting surface 13 is formed in the periphery of the two-dimensional photonic crystal area 11, and that the light reflecting surface 13S of the light reflecting area 13 has the aforementioned configuration. Accordingly, light reflected on the reflecting surface 13S is combined with a standing wave residing in a propagating direction of the reflection light, without disturbing its resonant state. Thus, even if the light reflecting area 13 is an optical element which causes Fresnel reflection, the performance of the two-dimensional photonic crystal 10 as a resonator can be improved. As a result, the performance of the two-dimensional photonic crystal 10 as a resonator can be improved without increasing the light emission area or the element size of a laser LD. Thereby, an electric current value (a threshold value of an operational current) with which laser emission is started can be reduced.

In the background art, a refractive index difference between the first medium and the second medium for forming a two-dimensional refractive index distribution is increased, or the lattice number (the periodic number) is increased to improve the performance of a resonator. In this embodiment, since the performance of a resonator is improved by adjusting the configuration of the reflecting surface 13S of the light reflecting area 13, there is no need of increasing the refractive index difference between the first medium and the second medium, or increasing the lattice number (the periodic number), as required in the background art. Accordingly, material constraints are alleviated; and the performance of a resonator, and the light emission area or the element size of a laser LD can be controlled (designed) independently of each other. In the two-dimensional photonic crystal plane emission laser LD of this embodiment, the lattice constant "a" of the two-dimensional photonic crystal 10 (two-dimensional photonic crystal area 11) is set depending on the wavelength of intended laser light, and the lattice number of the two-dimensional photonic crystal 10 (two-dimensional photonic crystal area 11) is set depending on the size of an intended light emission area. The refractive index difference between the first medium and the second medium for forming a two-dimensional refractive index distribution is properly set in such a manner that light leaks from the two-dimensional photonic crystal area 11 to the light reflecting area 13 depending on the set lattice number.

Unlike the invention, in the background art, coherence between light reflected on the reflecting surface 13S of the light reflecting area 13, and light forming a standing wave in the two-dimensional photonic crystal area 11 is not considered. The background art does not recite, suggest, or discuss the idea of generating coherence between light reflected on the reflecting surface 13S, and light forming a standing wave in the two-dimensional photonic crystal area 11 in such a manner as not to disturb light forming the standing wave in the two-dimensional photonic crystal area 11. Thus, unlike the invention, the background art does not recite, suggest, or discuss the idea of adjusting the plane direction and the position of the reflecting surface 13S of the light reflecting area 13 to improve the performance of a resonator.

In the following, arrangement examples of the two-dimensional photonic crystal 10 (10A through 10H) are described in detail.

In the specification, in the case where the two-dimensional photonic crystal is generically described, the two-dimensional photonic crystal is indicated with a reference numeral without a subscript, and in the case where the examples of the two-dimensional photonic crystal are individually described, the two-dimensional photonic crystals are indicated with reference numerals with subscripts, respectively.

At first, some examples of the two-dimensional photonic crystal 10 constituted of square lattices, wherein the two-dimensional refractive index distribution has a period "a", are described.

Figure 9:
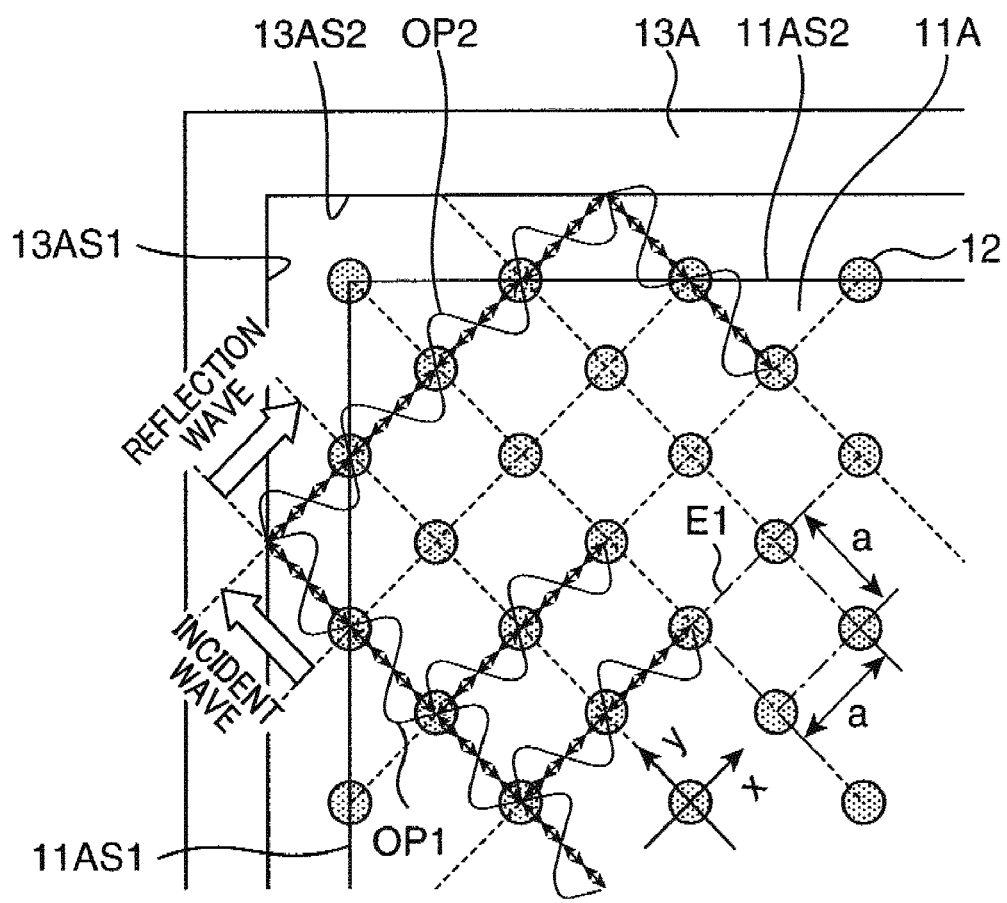
FIG. 9 is a plan view showing a first arrangement of the two-dimensional photonic crystal in the embodiment.
Figure 10A:
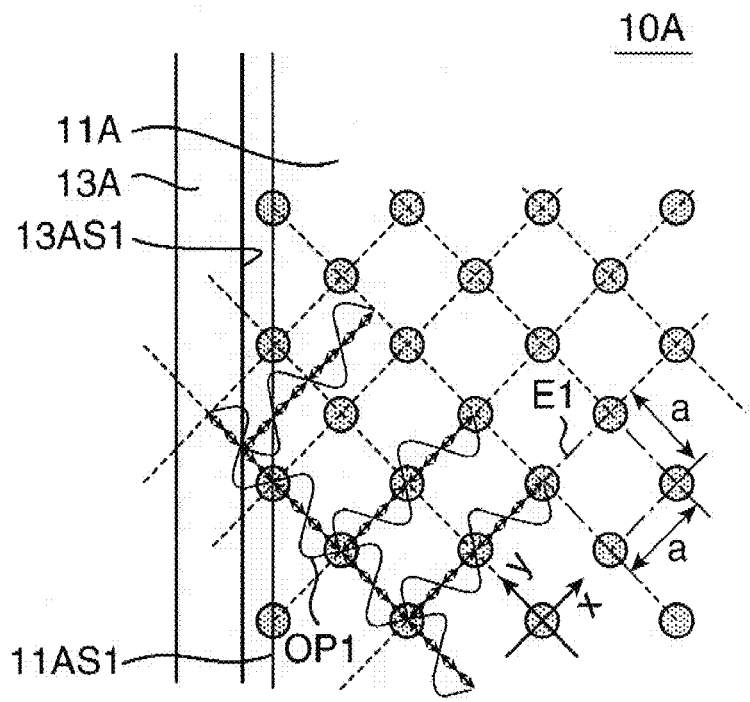
FIGS. 10A and 10B are diagrams for describing an improper position, as a position of a reflecting surface of a light reflecting area.
Figure 10B:
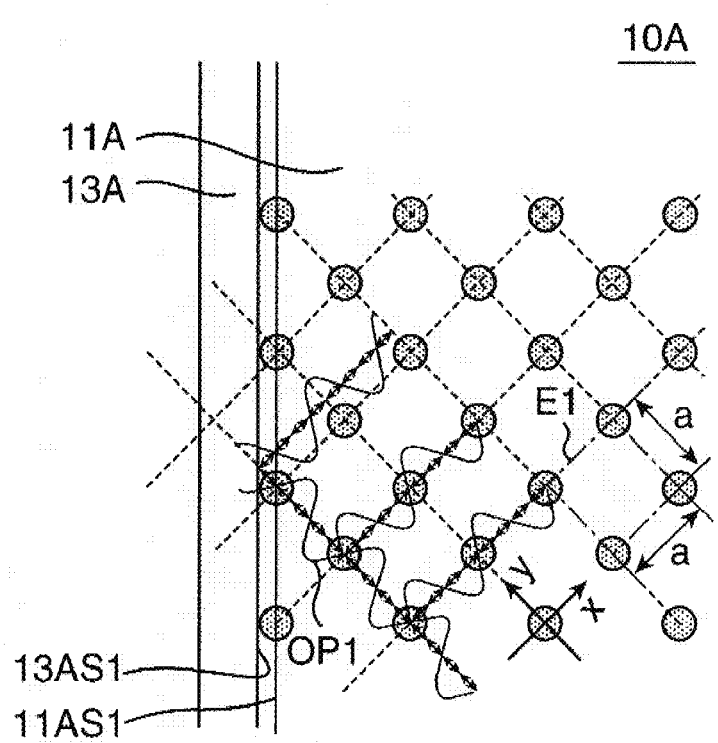

FIG. 9 is a plan view showing a first arrangement of the two-dimensional photonic crystal in the embodiment. FIGS. 10A and 10B are diagrams for describing an improper position, as a position of a reflecting surface of a light reflecting area.

In the first arrangement, as shown in FIG. 9, the two-dimensional photonic crystal 10A includes a two-dimensional photonic crystal area 11A constituted of square lattices, wherein the two-dimensional refractive index distribution has the period (the lattice interval or the lattice constant) "a"; and a light reflecting area 13A in the periphery of the two-dimensional photonic crystal area 11A, in a direction horizontal to a crystal plane of the two-dimensional photonic crystal 10A. The lattice element E1 of the two-dimensional photonic crystal 10A (two-dimensional photonic crystal area 11A) has a square shape with the length of one side thereof being "a".

In the two-dimensional photonic crystal 10A (two-dimensional photonic crystal area 11A) having the above arrangement, a basic oscillation mode is such that propagating directions of diffraction light which is diffracted at a lattice point 12 are aligned with the respective side directions of the lattice element E1 as a square lattice. As described in the background art section, there are four oscillation modes i.e. A mode through D mode. In the following, the arrangement position of a reflecting surface 13AS of the light reflecting area 13A in A mode is described.

Similarly to the background art description, let us define an xy coordinate system, wherein directions aligned with two sides of the lattice element E1 as a square lattice orthogonal to each other are defined as x-axis and y-axis on a two-dimensional plane of the two-dimensional photonic crystal 10A (two-dimensional photonic crystal area 11A), with the center of an arbitrary lattice point 12 being defined as a coordinate origin. As shown in FIG. 9, in A mode, a standing wave is formed in such a manner that a primary component Ey of standing wave, which is composed of a y-direction component of electric field to be formed in x-axis direction, starts at +sin, and a primary component Ex of standing wave, which is composed of an x-direction component of electric field to be formed in y-axis direction, starts at −sin. Although a standing wave is formed over the entire area on the two-dimensional plane of the two-dimensional photonic crystal 10A (two-dimensional photonic crystal area 11A), in FIG. 9, only the standing waves necessary for description are illustrated in FIG. 9. The same idea is applied to the description referring to FIGS. 10A through FIG. 12, FIGS. 20 through FIG. 23, and FIG. 31. The laser oscillation wavelength in a plane of the two-dimensional photonic crystal 10A (two-dimensional photonic crystal area 11A) is equal to the period (the lattice interval or the lattice constant) "a".

Although it may be inappropriate to express that light propagates from a certain position to another position because the light is a standing wave, the following description is made based on the premise that light propagates in y-axis direction to simplify the description.

When leaking from the two-dimensional photonic crystal area 11A, light OP1 propagating in y-axis direction is propagated without diffraction or reflection, and impinges on the reflecting surface 13AS (in the example shown in FIG. 9, a reflecting surface 13AS1) of the light reflecting area 13A, because the periphery of the two-dimensional photonic crystal area 11A is surrounded by the light reflecting area 13A.

The light OP1 which has impinged on the reflecting surface 13AS1 is reflected thereon, and impinges on the two-dimensional photonic crystal area 11A, whereby coherence with a standing wave in the two-dimensional photonic crystal area 11A is generated.

In order to generate coherence without obstructing oscillation in A mode, the light OP1 which has been reflected on the reflecting surface 13AS1 and impinged on the two-dimensional photonic crystal area 11A is required to overlap with light forming a standing wave in the two-dimensional photonic crystal area 11A.

To generate coherence, firstly, the light OP1 reflected on the reflecting surface 13AS1 is required to propagate in a direction aligned with y-axis direction, or a direction aligned with x-axis direction, because a lightwave is resonated in the two-dimensional photonic crystal area 11A in A mode. In the case where light is propagated in +x axis direction, the reflecting surface 13AS1 has to be aligned in parallel to a first diagonal direction of +45 degrees with respect to x-axis direction, out of two diagonals of the lattice element E1, because, generally, an incident angle and a reflection angle on a reflecting surface are equal to each other according to the law of reflection. This means that the reflecting surface 13AS1 is disposed at such a position that assuming that an angle range from 0 degree to less than 180 degrees, which is obtained by dividing 360 degrees into two sections, is defined so that propagating directions (directions of 180 degrees and +90 degrees) of an even number are obtained out of propagating directions (directions of 0 degree, ±90 degrees, and 180 degrees) of diffraction light in the two-dimensional photonic crystal area 11A, the direction of a synthesized vector ((1, −1)) obtained by summing up all the unit vectors (0, −1), (1, 0) representing the propagating directions (directions of 180 degrees and 90 degrees) of the even number residing in the angle range is aligned with a tangential direction. Setting the reflecting surface 13AS1 in the above direction enables to make the propagating direction of reflection light coincide with the propagating direction of the standing wave residing in the two-dimensional photonic crystal area 11A, in the case where light leaking from the two-dimensional photonic crystal area 11A is reflected on the reflecting surface 13AS1, and the reflection light is returned to the two-dimensional photonic crystal area 11A.

To generate coherence without obstructing oscillation in A mode, secondly, the light OP1 reflected on the reflecting surface 13AS1 is required to be coincident with the standing wave in x-axis direction in phase. There is no difference in phase by reflection on the reflecting surface 13AS1, and the primary component Ey of standing wave, which is composed of a y-direction component of electric field to be formed in x-axis direction starts with +sin in A mode. Accordingly, the reflecting surface 13AS1 is required to be disposed at a position distanced by $a/\sqrt{2}$ from a center of a lattice point 12 at an outermost circumference of the two-dimensional photonic crystal area 11A, in the case where the lattice point 12 has a cylindrical column shape. This means that the distance from an end surface 11AS of the two-dimensional photonic crystal area 11A to the reflecting surface 13AS of the light reflecting area 13A is defined so that, in the case where diffraction light in one (in this example, the direction of 0 degree) of the propagating directions (directions of 0 degree, ±90 degrees, and 180 degrees) is reflected on the reflecting surface 13AS1, the propagating direction and the phase of the reflection light are coincident with the propagating direction and the phase of light in any one of the other propagating directions (in this example, the direction of +90 degrees), respectively. Setting the reflecting surface 13AS1 at the above position enables to make the phase of reflection light and the phase of a standing wave residing in the two-dimensional photonic crystal area 11A coincide with each other, in the case where light leaking from the two-dimensional photonic crystal area 11A is reflected on the reflecting surface 13AS1, and the reflection light is returned to the two-dimensional photonic crystal area 11A.

For instance, as shown in FIGS. 10A and 10B, in the case where the reflecting surface 13AS1 is disposed at a position distanced by $a/(2\sqrt{2})$ from a lattice point 12 at the outermost circumference of the two-dimensional photonic crystal area 11A (see FIG. 10A), or in the case where the reflecting surface 13AS1 is disposed at a position distanced by $a/(4\sqrt{2})$ from a lattice point 12 at the outermost circumference of the two-dimensional photonic crystal area 11A (see FIG. 10B), the light OP1 reflected on the reflecting surface 13AS1 does not coincide with the standing wave in x-axis direction in phase. Thereby, oscillation in A mode is obstructed, and oscillation in A mode becomes unstable.

In A mode, there also exists light OP2 propagating in x-axis direction. When leaking from the two-dimensional photonic crystal area 11A, the light OP2 propagating in x-axis direction is propagated without diffraction or reflection, and impinges on the reflecting surface 13AS (in the example shown in FIG. 9, a reflecting surface 13AS2) of the light reflecting area 13A, because the periphery of the two-dimensional photonic crystal area 11A is surrounded by the light reflecting area 13A. The light OP2 which has impinged on the reflecting surface 13AS2 is reflected thereon, and impinges on the two-dimensional photonic crystal area 11A, whereby coherence with a standing wave in the two-dimensional photonic crystal area 11A is generated.

In order to generate coherence without obstructing oscillation in A mode, similarly to the case on the reflecting surface 13AS1, the light OP2 which has been reflected on the reflecting surface 13AS2 and impinged on the two-dimensional photonic crystal area 11A is required to overlap with light forming a standing wave in the two-dimensional photonic crystal area 11A.

To generate coherence, firstly, similarly to the case of the reflecting surface 13AS1, the light OP2 reflected on the reflecting surface 13AS2 is required to propagate in a direction aligned with y-axis direction, or a direction aligned with x-axis direction. In the case where light is propagated in −y axis direction, the reflecting surface 13AS2 is required to be aligned in parallel to a second diagonal direction of +135 degrees (−45 degrees) with respect to x-axis direction, out of two diagonals of the lattice element E1, because, generally, an incident angle and a reflection angle on a reflecting surface are equal to each other according to the law of reflection. This means that the reflecting surface 13AS2 is disposed at such a position that assuming that an angle range from 0 degree to less than 180 degrees, which is obtained by dividing 360 degrees into two sections, is defined so that propagating directions (directions of 90 degrees and 0 degree) of an even number are obtained out of propagating directions (directions of 0 degree, ±90 degrees, and 180 degrees) of diffraction light in the two-dimensional photonic crystal area 11A, the direction of a synthesized vector ((1, 1)) obtained by summing up all the unit vectors (1, 0), (0, 1) representing the propagating directions (directions of 90 degrees and 0 degree) of the even number residing in the angle range is aligned with a tangential direction. Setting the reflecting surface 13AS2 in the above direction enables to make the propagating direction of reflection light coincide with the propagating direction of a standing wave residing in the two-dimensional photonic crystal area 11A, in the case where light leaking from the two-dimensional photonic crystal area 11A is reflected on the reflecting surface 13AS2, and the reflection light is returned to the two-dimensional photonic crystal area 11A.

To generate coherence without obstructing oscillation in A mode, secondly, similarly to the case of the reflecting surface 13A1, the light OP2 reflected on the reflecting surface 13AS2 is required to be coincident with the standing wave in −y axis direction in phase. There is no difference in phase by reflection on the reflecting surface 13AS2, and the primary component Ex of standing wave, which is composed of an x-direction component of electric field to be formed in y-axis direction, starts at −sin in A mode. Accordingly, the reflecting surface 13AS2 is required to be disposed at a position distanced by $a/\sqrt{2}$ from a center of a lattice point 12 at an outermost circumference of the two-dimensional photonic crystal area 11A, in the case where the lattice point 12 has a cylindrical column shape. This means that the distance from an end surface 11AS of the two-dimensional photonic crystal area 11A to the reflecting surface 13AS of the light reflecting area 13A is defined so that, in the case where diffraction light in one (in this example, the direction of 90 degrees) of the propagating directions (directions of 0 degree, ±90 degrees, and 180 degrees) is reflected on the reflecting surface 13AS2, the propagating direction and the phase of the reflection light are coincident with the propagating direction and the phase of light in any one of the other propagating directions (in this example, the direction of −180 degrees), respectively. Setting the reflecting surface 13AS2 at the above position enables to make the phase of reflection light and the phase of a standing wave residing in the two-dimensional photonic crystal area 11A coincide with each other, in the case where light leaking from the two-dimensional photonic crystal area 11A is reflected on the reflecting surface 13AS2, and the reflection light is returned to the two-dimensional photonic crystal area 11A.

Further, although not illustrated, in defining the propagating direction as described above, there also exists light propagating in −y axis direction and −x axis direction. Accordingly, a reflecting surface of the light reflecting area 13A is disposed in a similar manner as described above regarding the light OP1 propagating in y-axis direction, and the light OP2 propagating in x-axis direction.

As described above, in the case where the two-dimensional photonic crystal 10A (two-dimensional photonic crystal area 11A) is constituted of square lattices having the lattice constant "a", the reflecting surface 13AS of the light reflecting area 13A is disposed at a position distanced by $a/\sqrt{2}$ from (a lattice point 12 at the outermost circumference of) the two-dimensional photonic crystal area 11A. More generally, assuming that N is a positive integer, the reflecting surface 13AS of the light reflecting area 13A is disposed at a position distanced by $(N/\sqrt{2}) \times a$ (from a lattice point 12 at the outermost circumference of) the two-dimensional photonic crystal area 11A.

In B mode through D mode, the arrangement position of the reflecting surface 13S of the light reflecting area 13 may be defined in the similar manner as in A mode.

Figure 11:
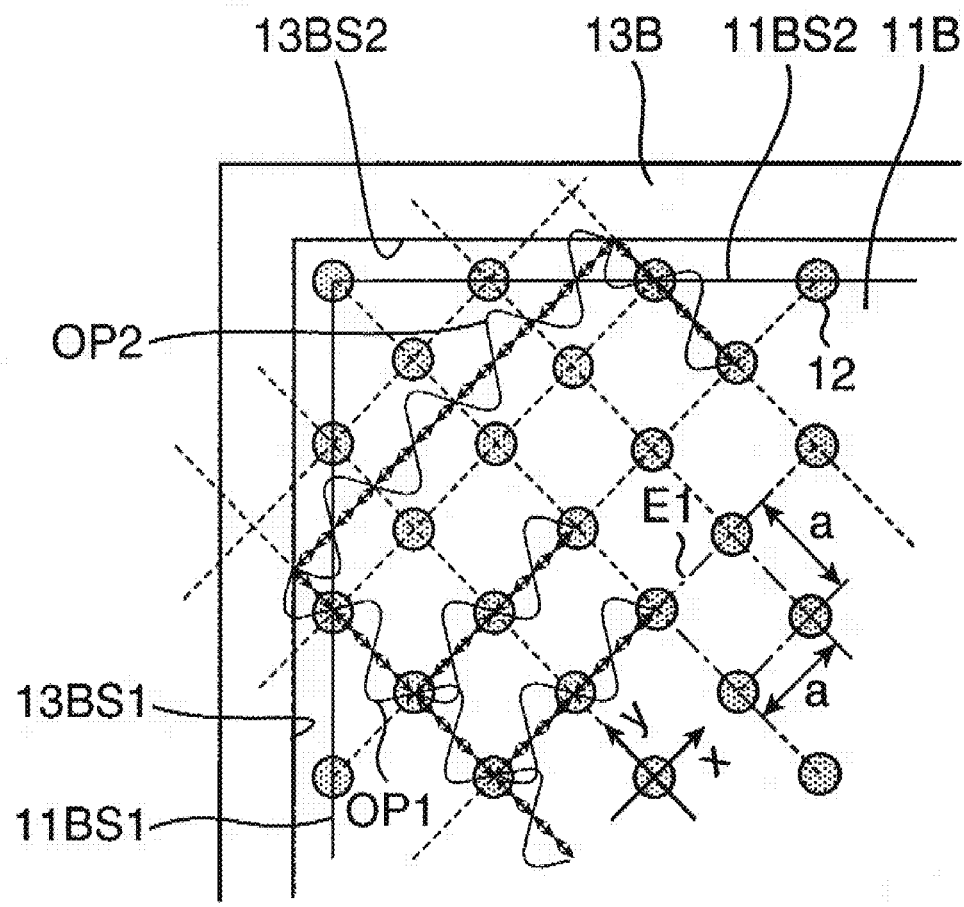
FIG. 11 is a plan view showing a second arrangement of the two-dimensional photonic crystal in the embodiment.
Figure 12:
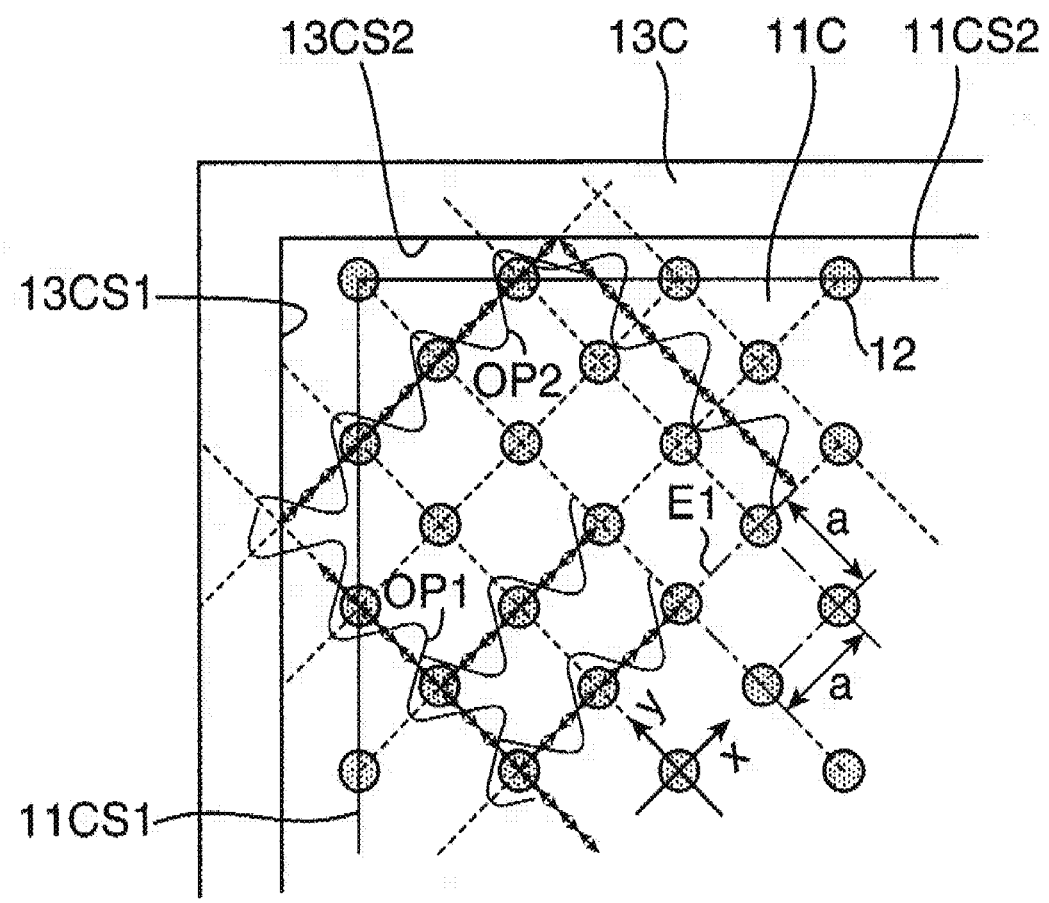
FIG. 12 is a plan view showing a third arrangement of the two-dimensional photonic crystal in the embodiment.

FIG. 11 is a plan view showing a second arrangement of the two-dimensional photonic crystal in the embodiment. FIG. 12 is a plan view showing a third arrangement of the two-dimensional photonic crystal in the embodiment.

In B mode, as shown in FIG. 11, the two-dimensional photonic crystal 10B includes a two-dimensional photonic crystal area 11B constituted of square lattices, wherein the two-dimensional refractive index distribution has the period (the lattice interval or the lattice constant) "a"; and a light reflecting area 13B in the periphery of the two-dimensional photonic crystal area 11B, in a direction horizontal to a crystal plane of the two-dimensional photonic crystal 10B. A reflecting surface 13BS of the light reflecting area 13B is aligned in parallel to a direction of one of two diagonals of the lattice element E1. The reflecting surface 13BS of the light reflecting area 13B is disposed at a position distanced by $a/(2\sqrt{2})$ from a center of a lattice point 12 at an outermost circumference of the two-dimensional photonic crystal area 11B, in the case where the lattice point 12 has a cylindrical column shape. More generally, assuming that N is a positive integer, the reflecting surface 13BS of the light reflecting area 13B is disposed at a position distanced by $(2 \times N - 1)/2\sqrt{2}) \times a$ (from a lattice point 12 at the outermost circumference of) the two-dimensional photonic crystal area 11B.

In C mode, as shown in FIG. 12, the two-dimensional photonic crystal 10C includes a two-dimensional photonic crystal area 11C constituted of square lattices, wherein the two-dimensional refractive index distribution has the period (the lattice interval or the lattice constant) "a"; and a light reflecting area 13C in the periphery of the two-dimensional photonic crystal area 11C, in a direction horizontal to a crystal plane of the two-dimensional photonic crystal 10C. A reflecting surface 13CS of the light reflecting area 13C is aligned in parallel to a direction of one of two diagonals of the lattice element E1. The reflecting surface 13CS of the light reflecting area 13C is disposed at a position distanced by $a\sqrt{2}$ or $a/(2\sqrt{2})$ from a center of a lattice point 12 at an outermost circumference of the two-dimensional photonic crystal area 11C, in the case where the lattice point 12 has a cylindrical column shape. In the example shown in FIG. 12, a reflecting surface 13CS1 of the light reflecting area 13C is aligned in parallel to a direction of one of two diagonals of the lattice element E1, and is disposed at a position distanced by $a/\sqrt{2}$ from the center of a cylindrical-column-shaped lattice point 12 at the outermost circumference of the two-dimensional photonic crystal area 11C. A reflecting surface 13CS2 aligned in parallel to the direction of the other one of the two diagonals of the lattice element E1 is disposed at a position distanced by $a/2\sqrt{2}$ from the center of a cylindrical-column shaped lattice point 12 at the outermost circumference of the two-dimensional photonic crystal area 11C. More generally, assuming that N is a positive integer, the reflecting surface 13CS of the light reflecting area 13C is disposed at a position distanced by $(N/\sqrt{2}) \times a$ or $((2 \times N - 1)/2\sqrt{2}) \times a$ (from a lattice point 12 at the outermost circumference of) the two-dimensional photonic crystal area 11C.

Since D mode and C mode are in a relation of degeneration, although not illustrated, the arrangement in D mode is substantially the same as the arrangement in C mode. As described above, D mode becomes identical to C mode by rotating D mode by 90 degrees. Accordingly, the relation on the distance from (the lattice point 12 at the outermost circumference of) the two-dimensional photonic crystal area 11 to the reflecting surface 13D of the light reflecting area 13 in D mode is replaceable with the relation in C mode.

As described above, in the two-dimensional photonic crystal 10 (10A through 10C) constituted of square lattices, wherein the two-dimensional refractive index distribution has the period (the lattice interval or the lattice constant) "a", the two-dimensional photonic crystal 10 can be stably resonated in a predetermined mode by forming the light reflecting area 13 in the periphery of the two-dimensional photonic crystal area 11 in the aforementioned predetermined plane direction and position shown in FIGS. 9, 11, and 12, thereby further improving the performance of the resonator. This arrangement enables to stably oscillate the two-dimensional photonic crystal plane emission laser LD in the predetermined mode, and reduce the electric current value at which laser emission is started.

Figure 13A:
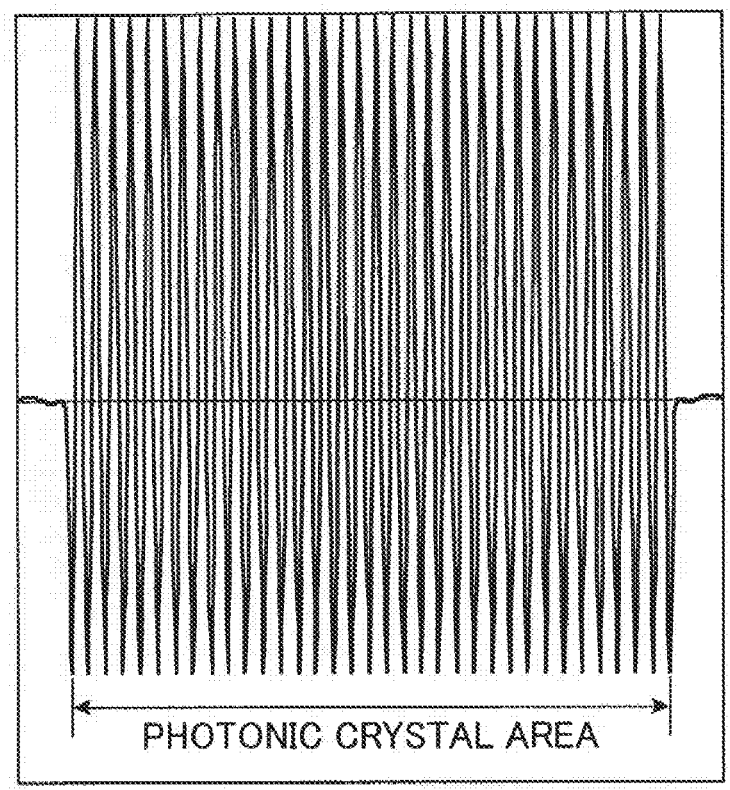
FIGS. 13A and 13B are diagrams for describing the performance of a two-dimensional photonic crystal-based resonator in the embodiment.
Figure 13B:
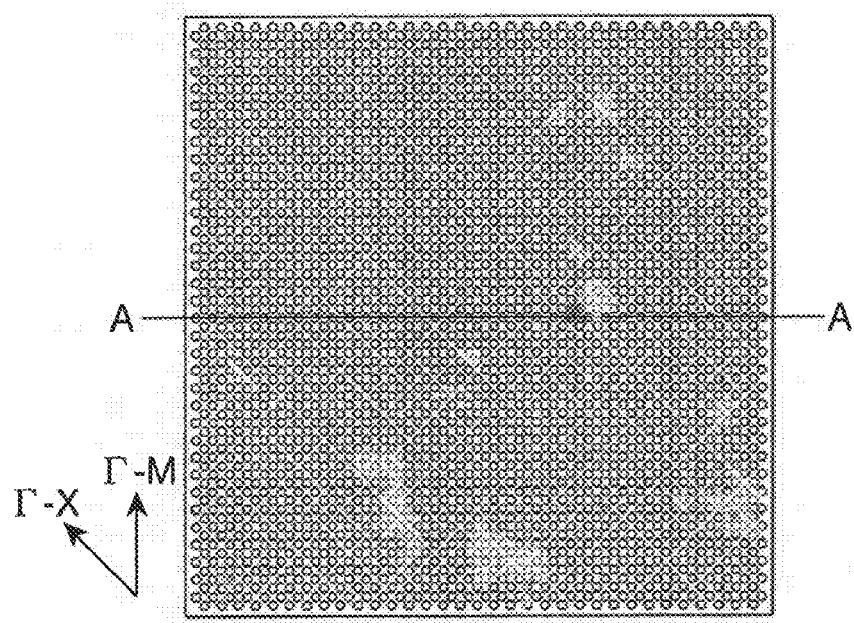
Figure 14A:
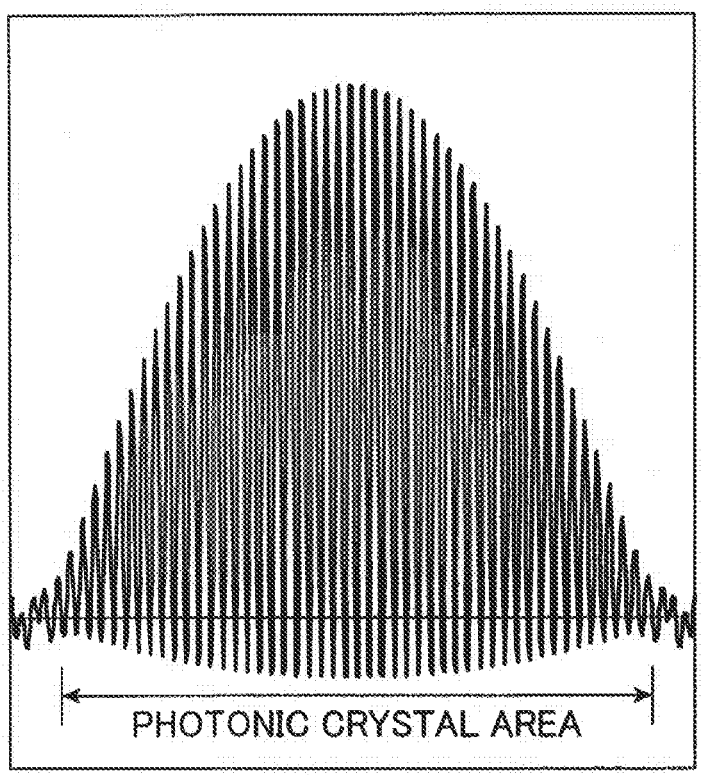
FIGS. 14A and 14B are diagrams for describing the performance of a two-dimensional photonic crystal-based resonator in a comparative example.
Figure 14B:
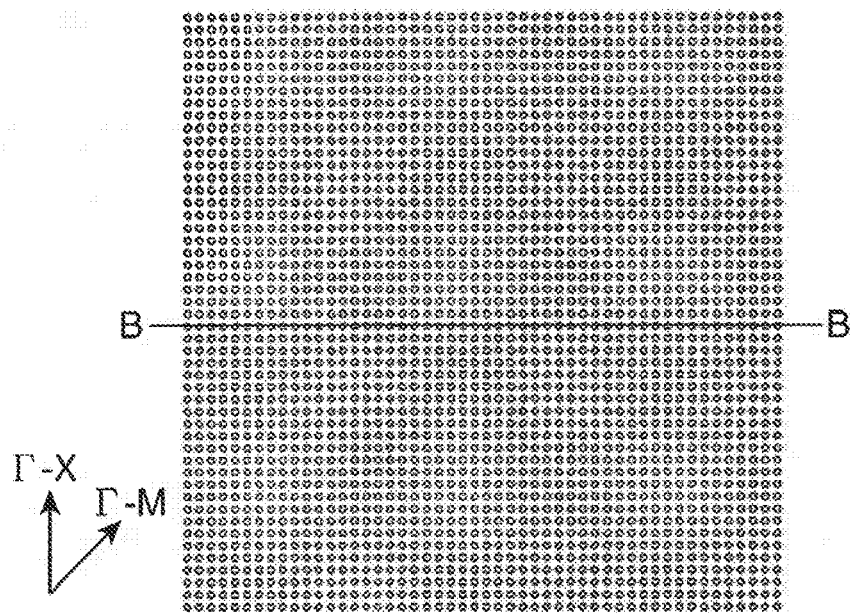

FIGS. 13A and 13B are diagrams for describing the performance of the two-dimensional photonic crystal-based resonator in the embodiment. FIG. 13B is a plan view showing a structure of a two-dimensional photonic crystal. FIG. 13A is a diagram, taken along the line AA in FIG. 13B, showing an electromagnetic field of the two-dimensional photonic crystal in A mode. FIGS. 14A and 14B are diagrams for describing the performance of a two-dimensional photonic crystal-based resonator in a comparative example. FIG. 14B is a plan view showing a structure of a two-dimensional photonic crystal. FIG. 14A is a diagram, taken along the line BB in FIG. 14B, showing an electromagnetic field distribution of the two-dimensional photonic crystal in A mode. The axes of ordinate in FIGS. 13A and 14A indicate a magnitude of electromagnetic field.

In describing the performance of the two-dimensional photonic crystal 10 as a resonator, for instance, similarly to the structure shown in FIG. 9, let us simulate the performance of a two-dimensional photonic crystal 10 having a two-dimensional photonic crystal area 11 as shown in FIG. 13B, wherein an end surface is aligned in a direction parallel to Γ-M direction, and a reflecting surface 13S as the light reflecting surface 13 in the embodiment is formed. Then, as shown in FIG. 13A, the electromagnetic field distribution in A mode at the line AA along Γ-M direction is uniform, and the magnitude of electromagnetic field is substantially the same and constant with respect to a peripheral portion and a central portion of the two-dimensional photonic crystal area 11, and the electromagnetic field is trapped in the two-dimensional photonic crystal area 11. On the other hand, as a comparative example, let us simulate the performance of a two-dimensional photonic crystal having a two-dimensional photonic crystal area as shown in FIG. 14B, wherein an end surface is aligned in Γ-M direction. As shown in FIG. 14A, the electromagnetic field distribution in A mode at the line BB along Γ-M direction, which corresponds to the line AA, has a mountain-shaped envelope curve, and the magnitude of electromagnetic field is maximal at a central portion of the two-dimensional photonic crystal area 11, and is gradually decreased toward a peripheral portion thereof. In this case, the electromagnetic field leaks from the two-dimensional photonic crystal area 11. In the foregoing example shown in FIG. 13B of the embodiment, the periodic number is set to 50, and in the comparative example shown in FIG. 14B, the periodic number is set to 34 ($\approx 50/\sqrt{2}$) so that the two-dimensional photonic crystal areas are substantially equal to each other in size. Further, a simulation was performed in the case where a two-dimensional photonic crystal was formed near an InGaAsP-based active layer sandwiched between InP-based clad layers As described above, it is comprehensive that the two-dimensional photonic crystal 10 of the embodiment has an improved performance than the two-dimensional photonic crystal of the background art. Further, unlike the background art arrangement, wherein the periodic number is indefinite, the two-dimensional photonic crystal 10 of the embodiment is advantageous in that there is no or less light leakage in an in-plane direction, and the light distribution is substantially uniform in the two-dimensional photonic crystal 10.

The above feature means that there is no or less light leakage in a direction perpendicular to a crystal plane, as well as the in-plane direction in A mode and B mode. Thereby, the performance of the two-dimensional photonic crystal 10 as a resonator is further improved.

On the other hand, if the performance of a resonator is improved, and the performance of the resonator becomes perfect, laser light is not emitted from the two-dimensional photonic crystal plane emission laser LD in A mode and B mode, in which cancellative coherence is generated. In view of this, for instance, lattice points 12 in the two-dimensional photonic crystal 10 have an asymmetrical configuration to extract laser light from the two-dimensional photonic crystal plane emission laser LD. For instance, a lattice point 12 has a triangular column shape, wherein a cross section of the lattice point 12 in a direction horizontal to a crystal plane of the two-dimensional photonic crystal 10 (two-dimensional photonic crystal area 11) has a triangular column shape. Forming the lattice points 12 into an asymmetrical shape enables to eliminate cancellation of electric field, as described in the background art, due to the asymmetric shape of the lattice points 12, while retaining the electric field distribution as a substantially odd function. As a result, laser light is emitted in a direction perpendicular to a crystal plane.

Alternatively, the two-dimensional photonic crystal plane emission laser LD may be configured in such a manner that the position of the reflecting surface 13S of the light reflecting area 13 is displaced by e.g. about 1/15 to 1/20 of the lattice constant with respect to the arrangement position in the embodiment. Specifically, the two-dimensional photonic crystal plane emission laser LD may be configured in such a manner that the reflecting surface 13S of the light reflecting area 13 is formed at a position closer to or away from the end surface of the two-dimensional photonic crystal area 11 by about 1/15 to 1/20 of the lattice constant with respect to the arrangement position in the embodiment. The modification enables to make the performance of the resonator imperfect, and emit laser light in a direction perpendicular to a crystal plane.

In the background art, the oscillation modes cannot be selected. However, in the embodiment, as described above, since the distance from (a lattice point 12 at the outermost circumference of) the two-dimensional photonic crystal area 11 to the reflecting surface of the light reflecting area 13 differs depending on the oscillation modes, the two-dimensional photonic crystal 10 can be resonated in an intended oscillation mode by setting the distance from (the lattice point 12 at the outermost circumference of) the two-dimensional photonic crystal area 11 to the reflecting surface of the light reflecting area 13 depending on the intended oscillation mode. Specifically, the distance from the end surface of the two-dimensional photonic crystal area 11 to the reflecting surface 13S of the light reflecting area 13 is set to $(N \times a)/(2\sqrt{2})$ depending on an intended oscillation mode, assuming that a lattice point at the outermost circumference resides on the end surface of the two-dimensional photonic crystal area 11, and N is an arbitrary positive integer.

The above configuration enables to stably oscillate the two-dimensional photonic crystal plane emission laser LD in an intended oscillation mode.

The oscillation modes may be classified by polarization such as TE-like mode and TM-like mode, in addition to the classification by electromagnetic field distribution such as the aforementioned A mode through D mode. TE-like mode is a mode, wherein a primary component of electric field resides in an active layer, and a primary component of magnetic field resides in a direction perpendicular to an active layer surface, as an electromagnetic field distribution in the active layer. TM-like mode is a mode, wherein a primary component of magnetic field resides in an active layer, and a primary component of electric field resides in a direction perpendicular to an active layer surface, as an electromagnetic field distribution in the active layer. TE-like mode and TM-like mode concerning each of the aforementioned A mode through D mode.

Generally, since a gain is large with respect to TE-like mode in an active layer having a multiple quantum well structure, normally, a crystal is oscillated in TE-like mode.

In the embodiment, concerning the reflecting surface 13S of the light reflecting area 13, since a primary component of electric field is aligned in parallel to an incident plane in TE-like mode, light is substantially incident as a p-wave, and since a primary component of electric field is aligned in perpendicular to an incident plane in TM-like mode, light is substantially incident as an s-wave. In oblique incidence, s-wave has a larger Fresnel reflectance than p-wave. Accordingly, the two-dimensional photonic crystal plane emission laser LD can be oscillated in TM-like mode by adjusting the refractive index of the light reflecting area 13 to such a value that the reflecting surface 13S has a reflectance capable of laser oscillation, without causing total reflection.

For instance, in the case of a two-dimensional photonic crystal plane emission laser LD constructed such that a two-dimensional photonic crystal is formed near an InGaAsP-based active layer sandwiched between InP-based clad layers, the equivalent refractive index of the two-dimensional photonic crystal area 11 is about 3.25. If silicon nitride (SiN) is used as a material for the light reflecting area 13, the refractive index of the light reflecting area 13 is 2.32. Since reflectances of p-wave and s-wave at 45-degree incidence are respectively about 33% and about 57%, the two-dimensional photonic crystal plane emission laser LD can be oscillated in TM-like mode.

Figure 15:
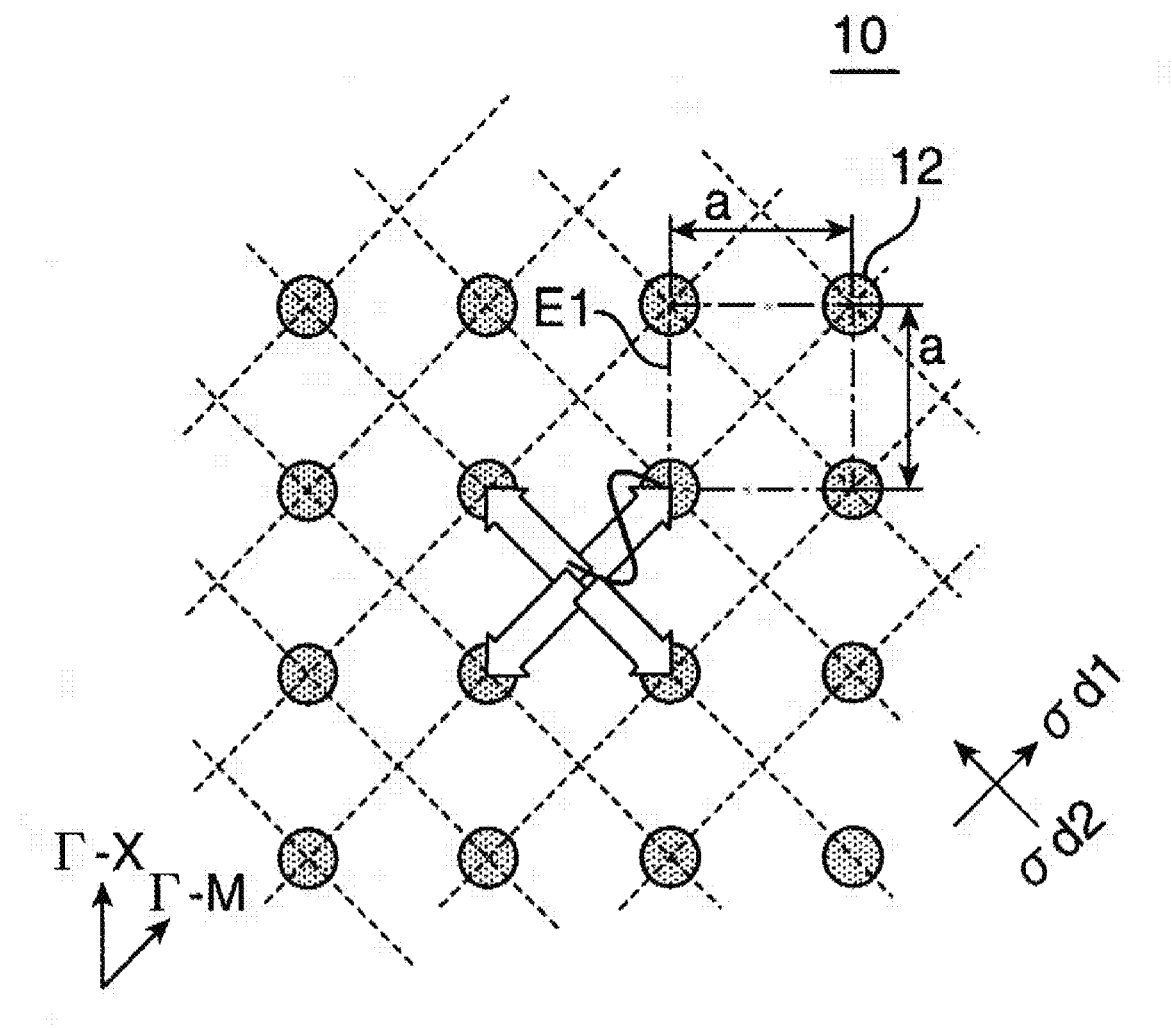
FIG. 15 is a diagram for describing a resonance to be performed in the case where an oscillation wavelength is made equal to the period of a two-dimensional photonic crystal constituted of square lattices in Γ-M direction.
Figure 16:
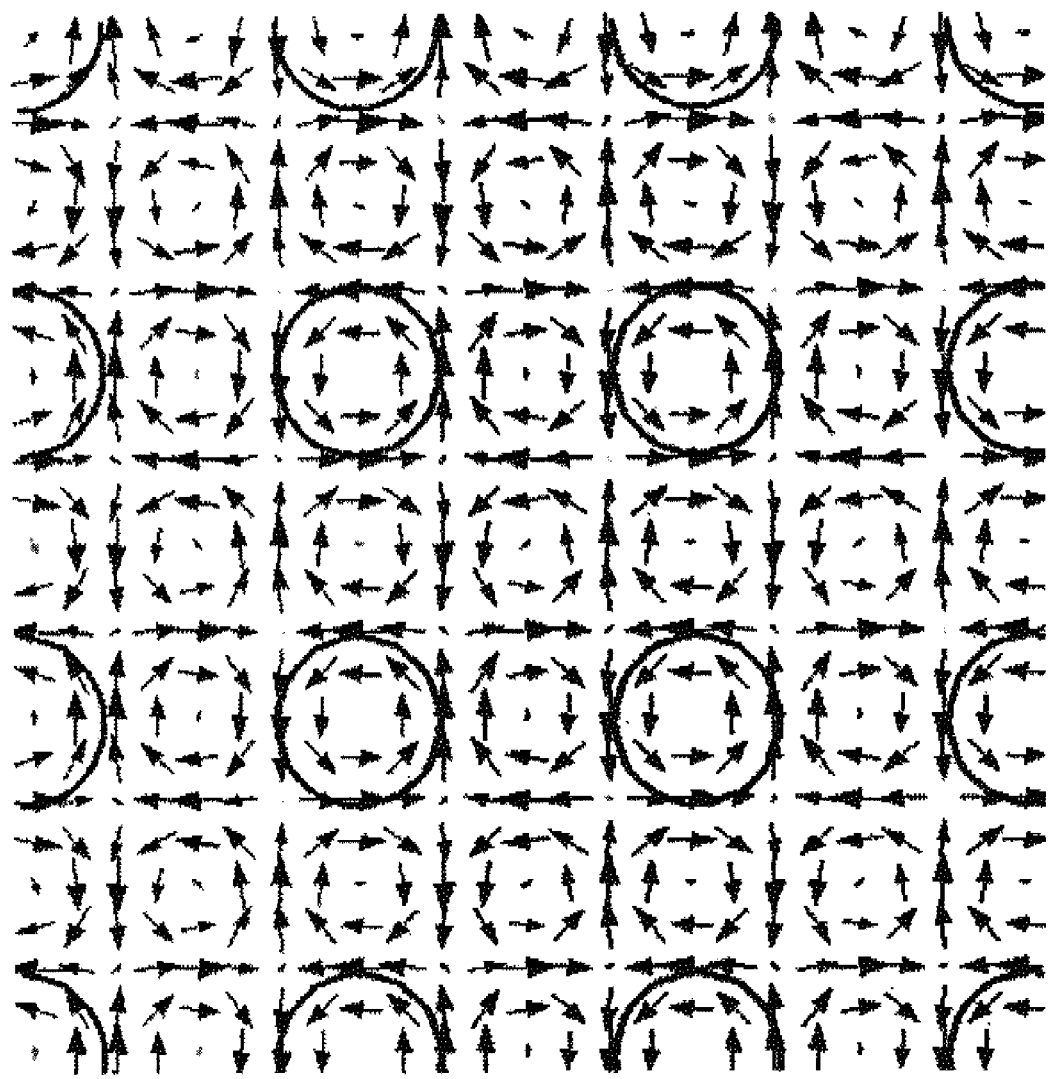
FIG. 16 is a diagram showing a near-field electric field distribution in A mode.
Figure 17:
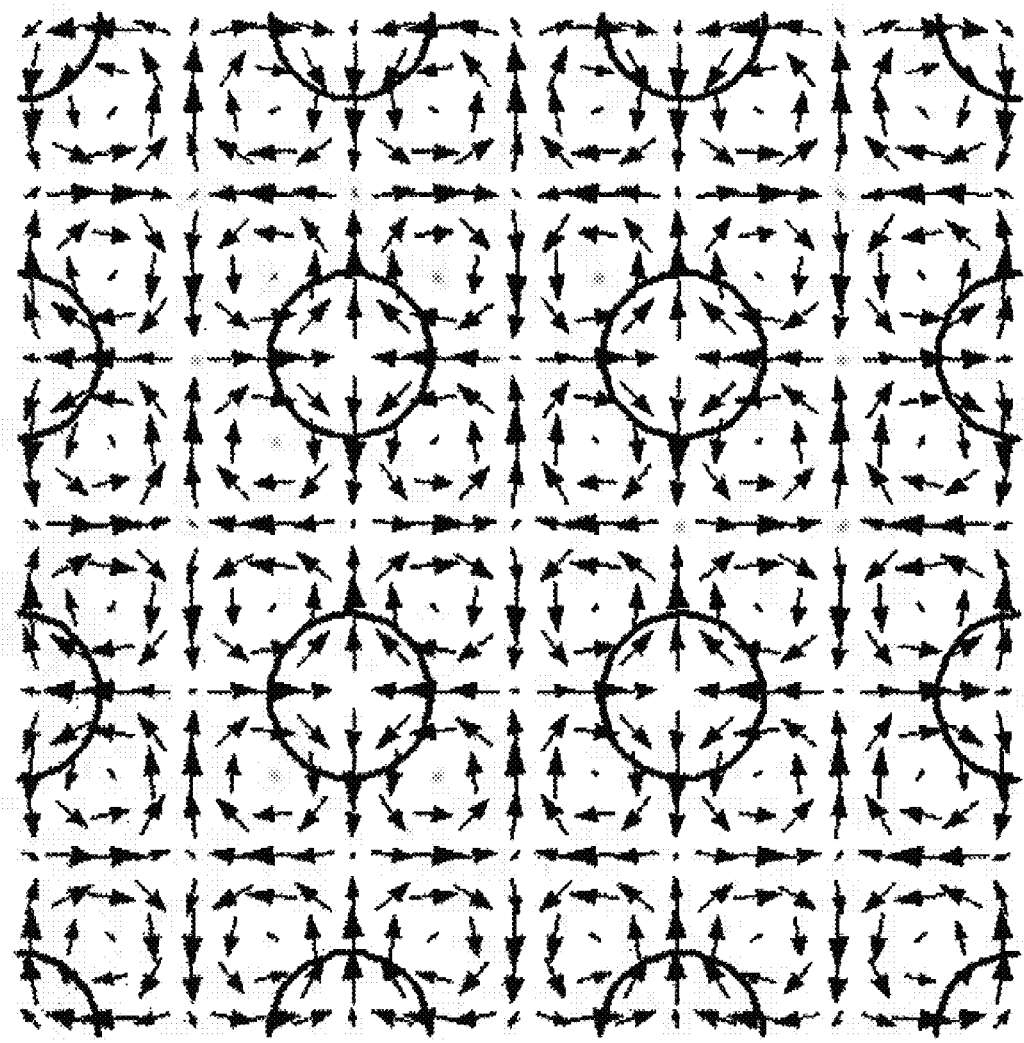
FIG. 17 is a diagram showing a near-field electric field distribution in B mode.
Figure 18:
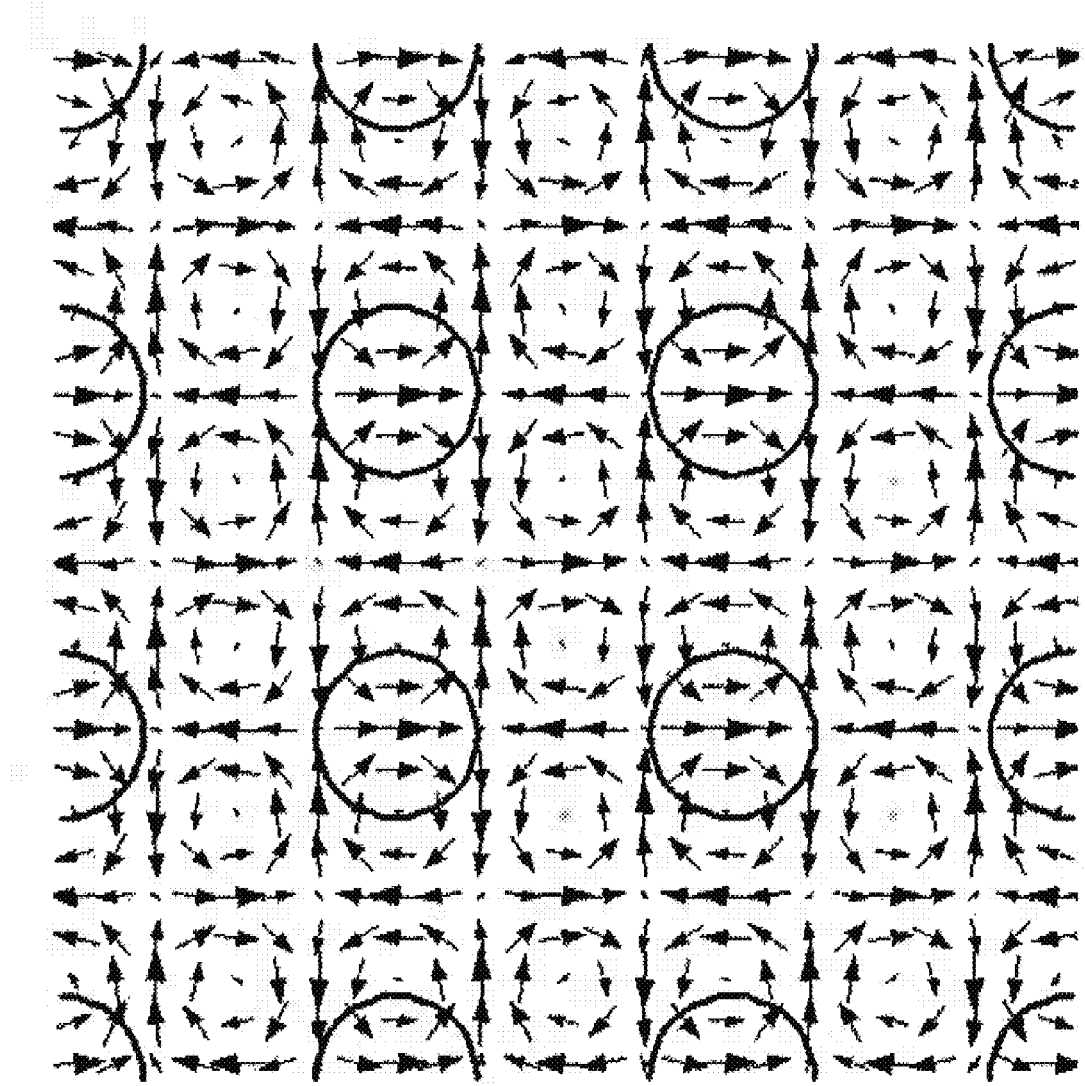
FIG. 18 is a diagram showing a near-field electric field distribution in C mode.
Figure 19:
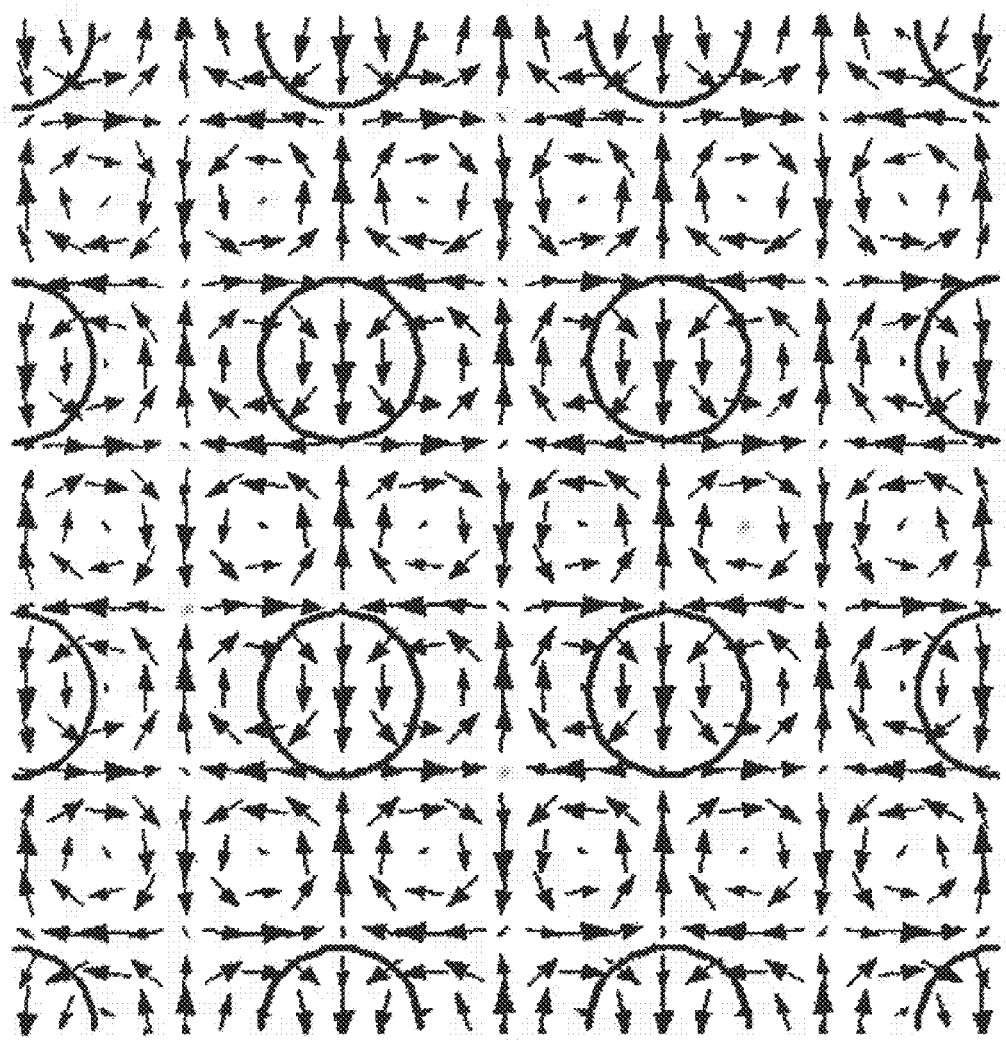
FIG. 19 is a diagram showing a near-field electric field distribution in D mode.

FIG. 15 is a diagram for describing a resonance to be performed in the case where an oscillation wavelength is made equal to the period of a two-dimensional photonic crystal constituted of square lattices in Γ-M direction. FIG. 16 is a diagram showing a near-field electric field distribution in A mode. FIG. 17 is a diagram showing a near-field electric field distribution in B mode. FIG. 18 is a diagram showing a near-field electric field distribution in C mode. FIG. 19 is a diagram showing a near-field electric field distribution in D mode. In FIGS. 16 through 19, each arrow indicates a direction and a magnitude of electric field.

In the first through the third arrangements, described is a case that the laser oscillation wavelength in the two-dimensional photonic crystal area 11 is equal to the lattice constant of a square lattice. As shown in FIG. 15, the laser oscillation wavelength in the two-dimensional photonic crystal area 11 may be equal to $1/\sqrt{2}$ times of the lattice constant of a square lattice.

Specifically, as shown in FIG. 15, when light L having an in-medium wavelength λ equal to $a/\sqrt{2}$ is propagated in Γ-M direction as a diagonal direction of the lattice element E1 as a square lattice, the light L is diffracted at a lattice point 12. Out of the diffraction light L, only the light L which is diffracted in the direction of 0 degree, ±90 degrees, and 180 degrees with respect to the propagating direction of light L satisfies the Bragg condition. There are other lattice points 12 in the propagating direction of the light L diffracted in the direction of 0 degree, ±90 degrees, and 180 degrees. Accordingly, the diffraction light L is diffracted again in the direction of 0 degree, ±90 degrees, and 180 degrees with respect to the propagating direction. Then, the light L propagating in Γ-M direction is returned to the original lattice point 12 by repeating the aforementioned diffraction once or plural times. Thus, the two-dimensional photonic crystal 10 is resonated in the similar manner as in the case where light is propagated in Γ-X direction.

Similarly to the case where light is propagated in f–X direction as a side direction of the lattice element E1 as a square lattice, there are four modes as resonance modes at which light is oscillated by resonance. If a σd1σd2 coordinate system is defined on a two-dimensional plane of a two-dimensional photonic crystal 10 (two-dimensional photonic crystal area 11), with an intersection of two diagonals of an arbitrary square lattice being defined as a coordinate origin, a standing wave to be formed by resonance has the following features in each of the modes, as shown in FIGS. 16 through 19.

In the first mode (hereinafter, called as "A mode"), a primary component Eσd2 of standing wave to be formed in σd1-axis direction starts at +sin, and a primary component Eσd1 of standing wave to be formed in σd2-axis direction starts at +sin. As a result, the electric field distribution is as shown in FIG. 16.

In the second mode (hereinafter, called as "B mode"), a primary component Eσd2 of standing wave to be formed in σd1-axis direction starts at +sin, and a primary component Eσd1 of standing wave to be formed in σd2-axis direction starts at −sin. As a result, the electric field distribution is as shown FIG. 17.

In the third mode (hereinafter, called as "C mode"), a primary component Eσd2 of standing wave to be formed in σd1-axis direction starts at −cos, and a primary component Eσd1 of standing wave to be formed in σd2-direction starts at +cos. As a result, the electric field distribution is as shown in FIG. 18.

In the fourth mode (hereinafter, called as "D mode"), a primary component Eσd2 of standing wave to be formed in σd1-axis direction starts at −cos, and a primary component Eσd1 of standing wave to be formed in σd2-axis direction starts at −cos. As a result, the electric field distribution is as shown in FIG. 19.

The primary component Eσd2 of standing wave to be formed in σd1-axis direction is a primary component Eσd2 of standing wave, which is composed of a σd2-direction component of electric field to be formed in σd1-axis direction. The primary component Eσd1 of standing wave to be formed in σd2-axis direction is a primary component Eσd1 of standing wave, which is composed of a σd1-direction component of electric field to be formed in σd2-axis direction. Since the same indication as described above is applied to the other primary components, description on the other primary is omitted herein.

As is obvious from FIGS. 18 and 19, since the electric field distributions are identical to each other when one of the electric field distributions is rotated by 90 degrees. Accordingly, C mode and D mode are in a relation of degeneration. In A mode and B mode, cancellative coherence is generated, and theoretically, laser light is not emitted in A mode and B mode. In C mode and D mode, cancellative coherence is not generated, and theoretically, laser light is emitted.

Figure 20:
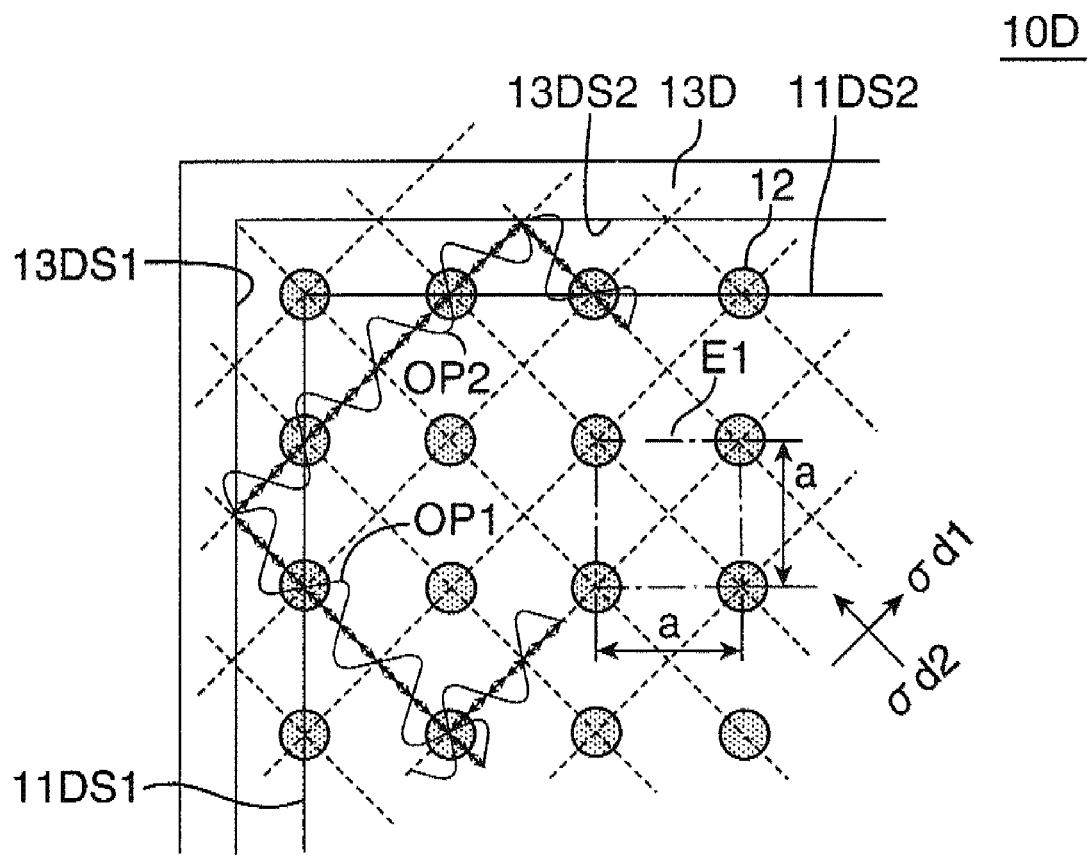
FIG. 20 is a plan view showing a fourth arrangement of the two-dimensional photonic crystal in the embodiment.
Figure 21:
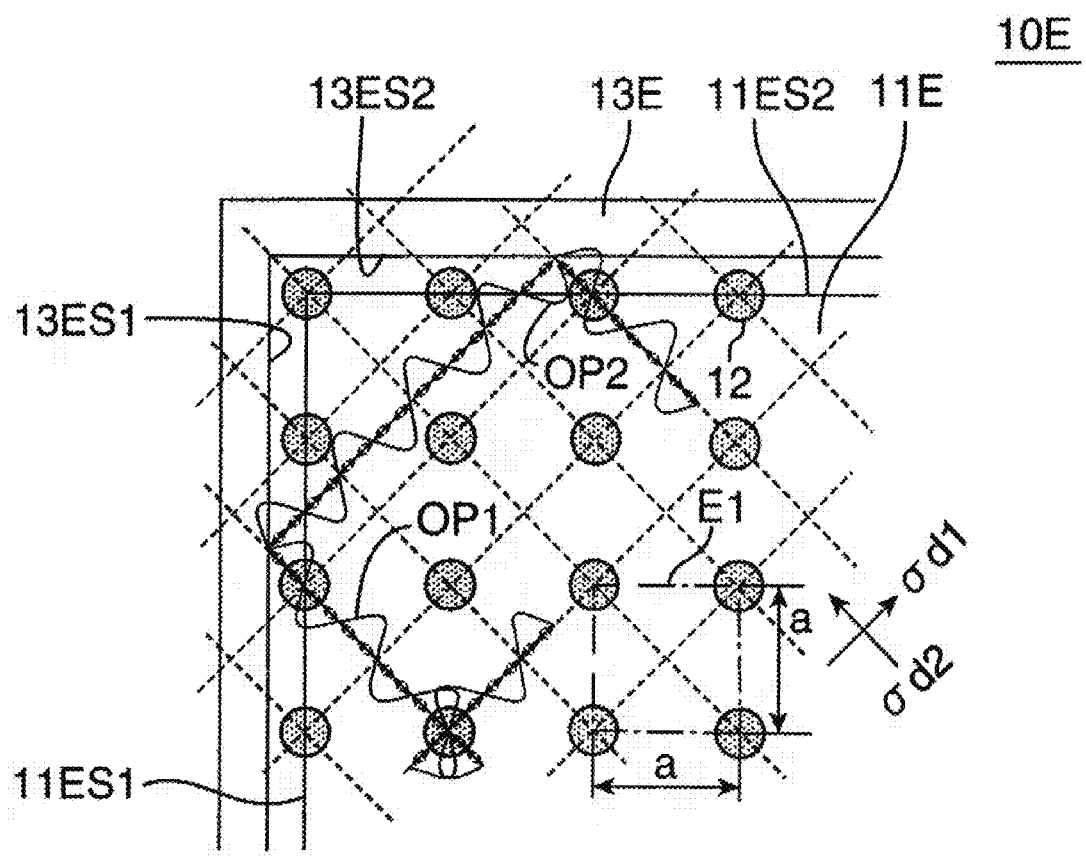
FIG. 21 is a plan view showing a fifth arrangement of the two-dimensional photonic crystal in the embodiment.
Figure 22:
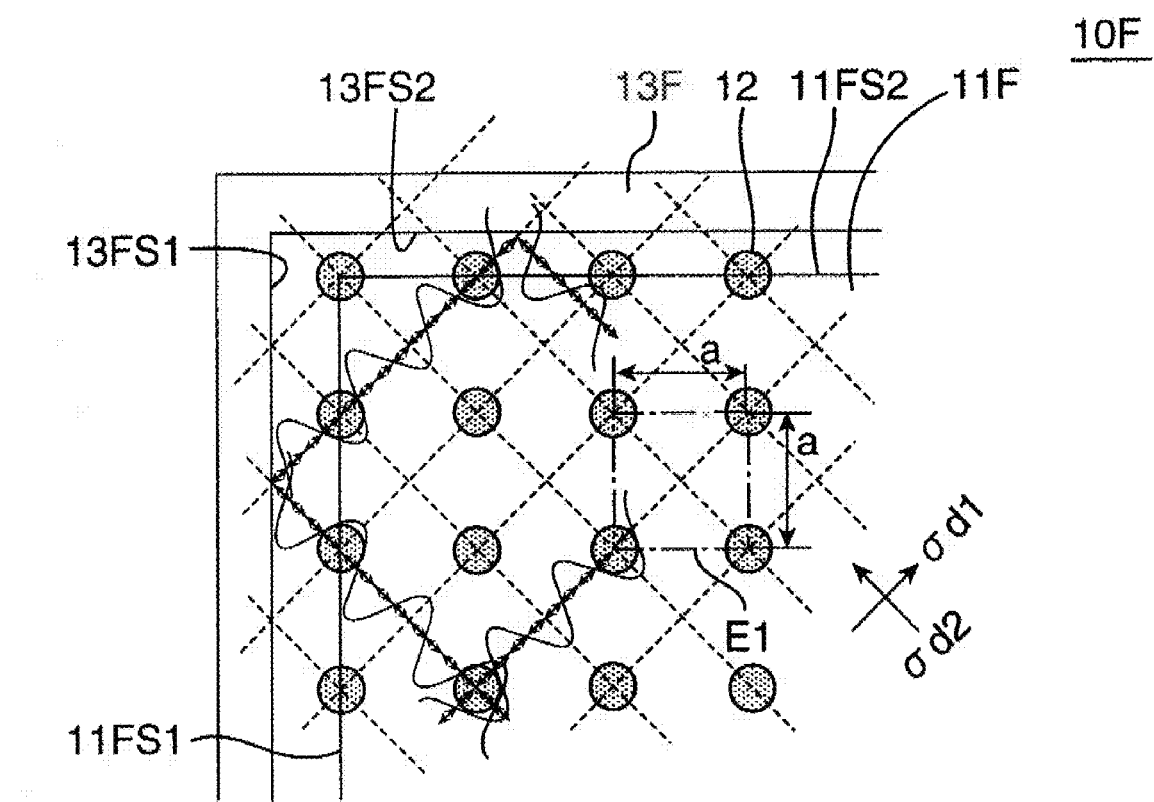
FIG. 22 is a plan view showing a sixth arrangement of the two-dimensional photonic crystal in the embodiment.
Figure 23:
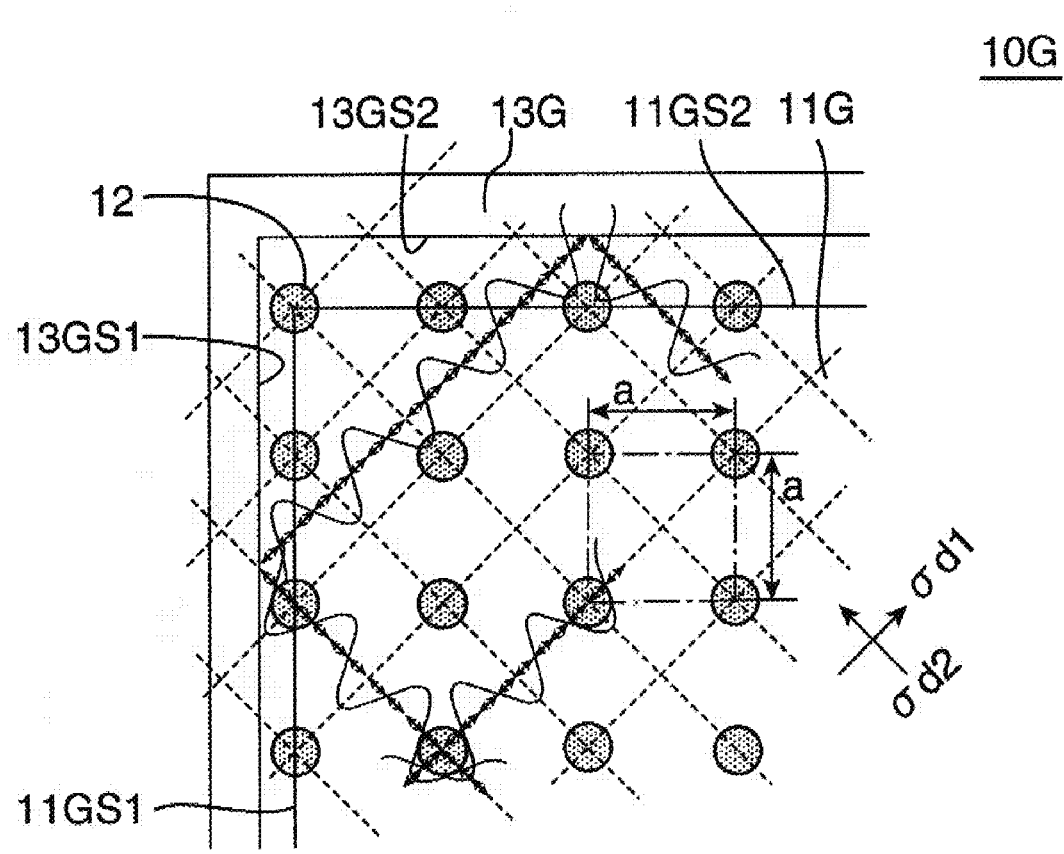
FIG. 23 is a plan view showing a seventh arrangement of the two-dimensional photonic crystal in the embodiment.

FIG. 20 is a plan view showing a fourth arrangement of the two-dimensional photonic crystal in the embodiment. FIG. 21 is a plan view showing a fifth arrangement of the two-dimensional photonic crystal in the embodiment. FIG. 22 is a plan view showing a sixth arrangement of the two-dimensional photonic crystal in the embodiment. FIG. 23 is a plan view showing a seventh arrangement of the two-dimensional photonic crystal in the embodiment.

In A mode, as shown in FIG. 20, the two-dimensional photonic crystal 10D includes a two-dimensional photonic crystal area 11D constituted of square lattices, wherein the two-dimensional refractive index distribution has the period (the lattice interval or the lattice constant) "a"; and a light reflecting area 13D in the periphery of the two-dimensional photonic crystal area 11D, in a direction horizontal to a crystal plane of the two-dimensional photonic crystal 10D. A reflecting surface 13DS of the light reflecting area 13D is aligned in parallel to a direction of one of the sides of the lattice element E1. The reflecting surface 13DS of the light reflecting area 13D is disposed at a position distanced by a/2 from a center of a lattice point 12 at an outermost circumference of the two-dimensional photonic crystal area 11D, in the case where the lattice point 12 has a cylindrical column shape. More generally, assuming that N is a positive integer, the reflecting surface 13DS of the light reflecting area 13D is disposed at a position distanced by (N/2)×a from (a lattice point 12 at the outermost circumference of) the two-dimensional photonic crystal area 11D.

In B mode, as shown in FIG. 21, the two-dimensional photonic crystal 10E includes a two-dimensional photonic crystal area 11E constituted of square lattices, wherein the two-dimensional refractive index distribution has the period (the lattice interval or the lattice constant) "a"; and a light reflecting area 13E in the periphery of the two-dimensional photonic crystal area 11E, in a direction horizontal to a crystal plane of the two-dimensional photonic crystal 10E. A reflecting surface 13ES of the light reflecting area 13E is aligned in parallel to a direction of one of the sides of the lattice element E1. The reflecting surface 13ES of the light reflecting area 13E is disposed at a position distanced by a/4 from a center of a lattice point 12 at an outermost circumference of the two-dimensional photonic crystal area 11E, in the case where the lattice point 12 has a cylindrical column shape. More generally, assuming that N is a positive integer, the reflecting surface 13ES of the light reflecting area 13E is disposed at a position distanced by (N/4)×a from (a lattice point 12 at the outermost circumference of) the two-dimensional photonic crystal area 11E.

In C mode, as shown in FIG. 22, the two-dimensional photonic crystal 10F includes a two-dimensional photonic crystal area 11F constituted of square lattices, wherein the two-dimensional refractive index distribution has the period (the lattice interval or the lattice constant) "a"; and a light reflecting area 13F in the periphery of the two-dimensional photonic crystal area 11F, in a direction horizontal to a crystal plane of the two-dimensional photonic crystal 10F. A reflecting surface 13FS of the light reflecting area 13F is aligned in parallel to a direction of one of the sides of the lattice element E1. The reflecting surface 13FS of the light reflecting area 13F is disposed at a position distanced by a/2 or a/4 from a center of a lattice point 12 at an outermost circumference of the two-dimensional photonic crystal area 11F, in the case where the lattice point 12 has a cylindrical column shape. In the example shown in FIG. 22, a reflecting surface 13FS1 of the light reflecting area 13F is aligned in parallel to a direction of one of the two sides of the lattice element E1 orthogonal to each other, and is disposed at a position distanced from a/2 from the center of a cylindrical-column shaped lattice point 12 at the outermost circumference of the two-dimensional photonic crystal area 11F; and a reflecting surface 13FS2 aligned in parallel to a direction of the other one of the two sides of the lattice element E1 orthogonal to each other is disposed at a position distanced by a/4 from the center of a cylindrical-column shaped lattice point 12 at the outermost circumference of the two-dimensional photonic crystal area 11F. More generally, assuming that N is a positive integer, the reflecting surface 13FS of the light reflecting area 13F is disposed at a position distanced by (N/2)×a or (N/4)/×a from (a lattice point 12 at the outermost circumference of) the two-dimensional photonic crystal area 11F.

In D mode, as shown in FIG. 23, the two-dimensional photonic crystal 10G includes a two-dimensional photonic crystal area 11G constituted of square lattices, wherein the two-dimensional refractive index distribution has the period (the lattice interval or the lattice constant) "a"; and a light reflecting area 13G in the periphery of the two-dimensional photonic crystal area 11G, in a direction horizontal to a crystal plane of the two-dimensional photonic crystal 10G. A reflecting surface 13GS of the light reflecting area 13G is aligned in parallel to a direction of one of the sides of the lattice element E1. The reflecting surface 13GS of the light reflecting area 13G is disposed at a position distanced by a/4 or a/2 from a center of a lattice point 12 at an outermost circumference of the two-dimensional photonic crystal area 11G, in the case where the lattice point 12 has a cylindrical column shape. In the example shown in FIG. 23, a reflecting surface 13GS1 of the light reflecting area 13G is aligned in parallel to a direction of one of the two sides of the lattice element E1 orthogonal to each other, and is disposed at a position distanced by a/4 from a center of a cylindrical-column-shaped lattice point 12 at the outermost circumference of the two-dimensional photonic crystal area 11G; and a reflecting surface 13GS2 aligned in parallel to a direction of the other one of the two sides of the lattice element E1 orthogonal to each other is disposed at a position distanced by a/2 from the center of a cylindrical-column shaped lattice point 12 at the outermost circumference of the two-dimensional photonic crystal area 11G. More generally, assuming that N is a positive integer, the reflecting surface 13GS of the light reflecting area 13G is disposed at a position distanced by (N/4)×a or (N/2)/×a from (a lattice point 12 at the outermost circumference of) the two-dimensional photonic crystal area 11G.

As described above, in the two-dimensional photonic crystal 10 (10D through 10G) constituted of square lattices, wherein the two-dimensional refractive index distribution has the period (the lattice interval or the lattice constant) "a", the two-dimensional photonic crystal 10 can be stably resonated in a predetermined mode by forming the light reflecting area 13 in the periphery of the two-dimensional photonic crystal area 11 in the aforementioned predetermined reflection plane direction and reflection plane position shown in FIGS. 20 through 23, thereby further improving the performance of the resonator. This arrangement enables to stably oscillate the two-dimensional photonic crystal plane emission laser LD in the predetermined mode, and reduce the electric current value at which laser emission is started. Furthermore, unlike the background art arrangement, wherein the periodic number is indefinite, the two-dimensional photonic crystal 10 of the embodiment is advantageous in that there is no or less light leakage in an in-plane direction, and the light distribution is substantially uniform in the two-dimensional photonic crystal 10.

In the background art, the oscillation modes cannot be selected. However, in the embodiment, as described above, since the distance from (a lattice point 12 at the outermost circumference of) the two-dimensional photonic crystal area 11 to the reflecting surface of the light reflecting area 13 differs depending on the oscillation modes, the two-dimensional photonic crystal 10 can be resonated in an intended oscillation mode by setting the distance from (the lattice point 12 at the outermost circumference of) the two-dimensional photonic crystal area 11 to the reflecting surface of the light reflecting area 13 depending on the intended oscillation mode. Specifically, the distance from the end surface of the two-dimensional photonic crystal area 11 to the reflecting surface 13S of the light reflecting area 13 is set to (N×4)/×a depending on an intended oscillation mode, assuming that a lattice point at the outermost circumference resides on the end surface of the two-dimensional photonic crystal area 11, and N is an arbitrary positive integer.

The above configuration enables to stably oscillate the two-dimensional photonic crystal plane emission laser LD in an intended oscillation mode.

In the foregoing, description has been made on the two-dimensional photonic crystal 10 constituted of square lattices, wherein the two-dimensional refractive index distribution has the period "a", in the case where the propagating direction of diffraction light is aligned with a periodic direction of a shortest period "a" (the first-order period) of a square lattice, or in the case where the propagating direction of diffraction light is aligned with a periodic direction of a second shortest period a/$\sqrt{2}$ (the second-order period) of a square lattice. For instance, as shown in FIGS. 4A and 4B, substantially the same description as above can be applied for a case that the propagating direction of diffraction light is aligned with a periodic direction of other period (a higher order period) of a square lattice. In the modification, as described above, the reflecting surface 13S of the light reflecting area 13 may be disposed at such a position that, assuming that an angle range from 0 degree to less than 180 degrees, which is obtained by dividing 360 degrees into two sections, is defined so that propagating directions of an even number are obtained out of the propagating directions of diffraction light in the two-dimensional photonic crystal area 11, the direction of a synthesized vector obtained by summing up all the unit vectors representing the propagating directions of the even number residing in the angle range is aligned with a tangential direction; and that the distance from the end surface 11S of the two-dimensional photonic crystal area 11 to the reflecting surface 13S of the light reflecting area 13 is set to such a value that in the case where diffraction light in one of the propagating directions is reflected on the reflecting surface 13S, the propagating direction and the phase of the reflection light, and the propagating direction and the phase of light in other one of the propagating directions are made coincident with each other, respectively.

Next, an example of a two-dimensional photonic crystal 10 constituted of triangular lattices, wherein the two-dimensional refractive index distribution has the period "a" is described.

Figure 24:
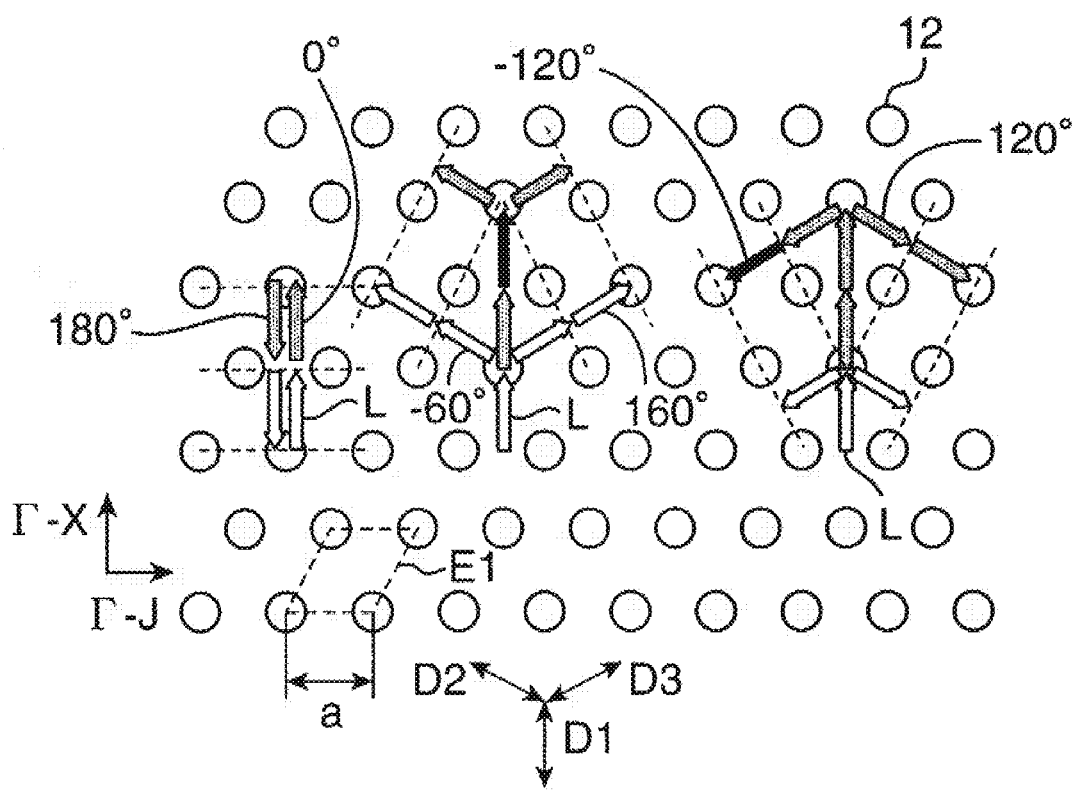
FIG. 24 is a diagram for describing a resonance to be performed in the case where an oscillation wavelength is made equal to the period of a two-dimensional photonic crystal constituted of triangular lattices in Γ-X direction.
Figure 25:
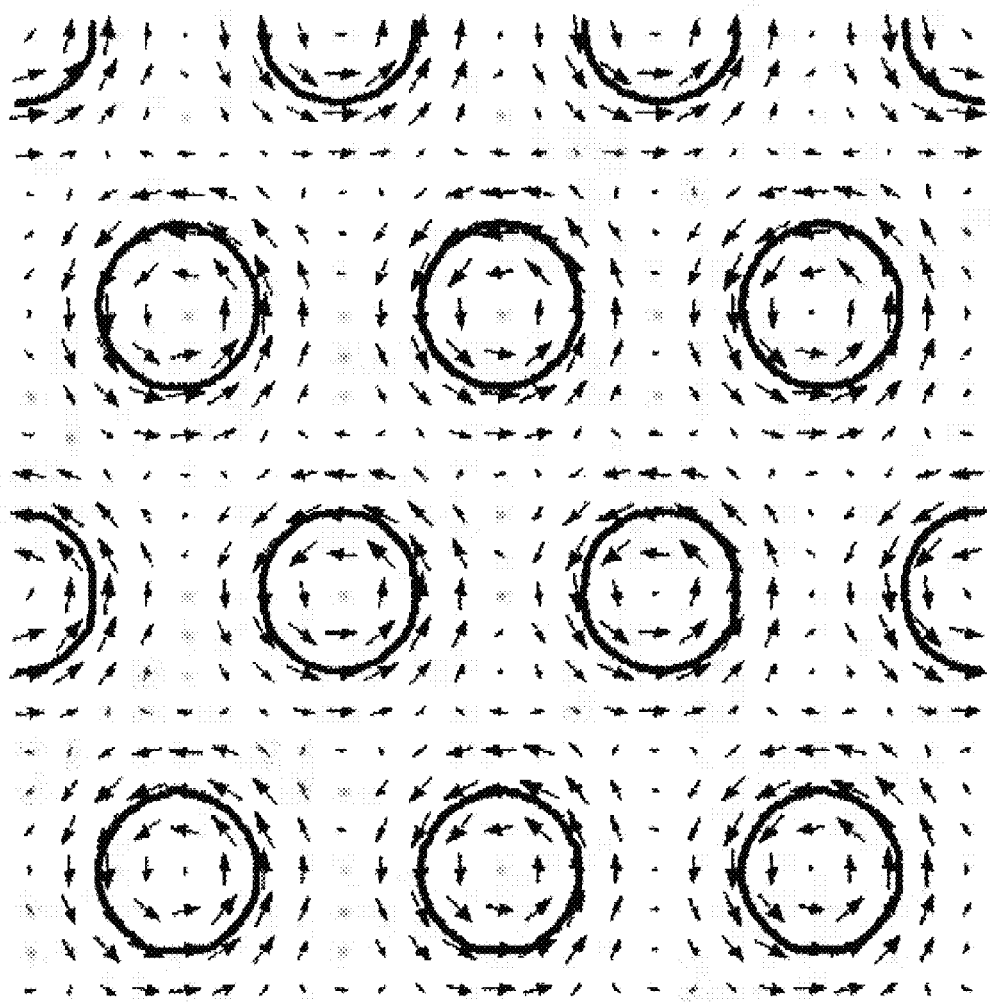
FIG. 25 is a diagram showing a near-field electric field distribution in α mode.
Figure 26:
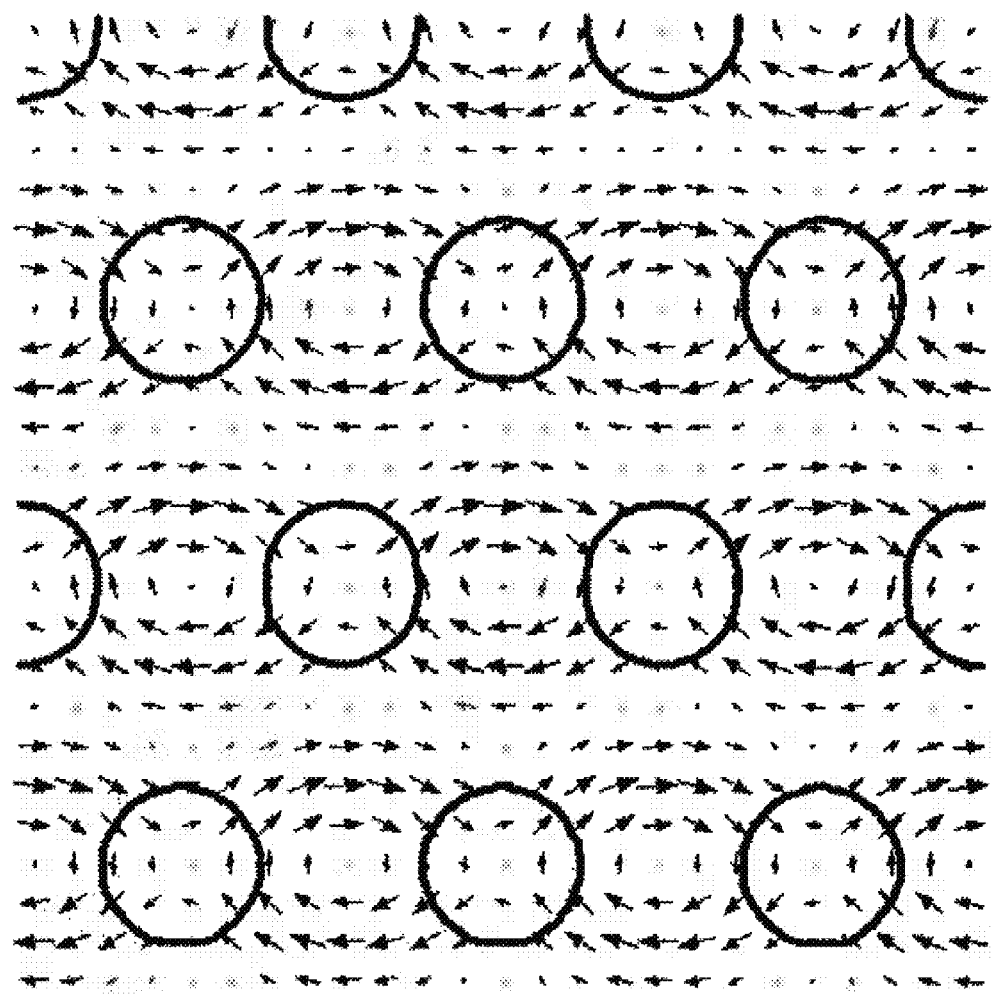
FIG. 26 is a diagram showing a near-field electric field distribution in γ1 mode.
Figure 27:
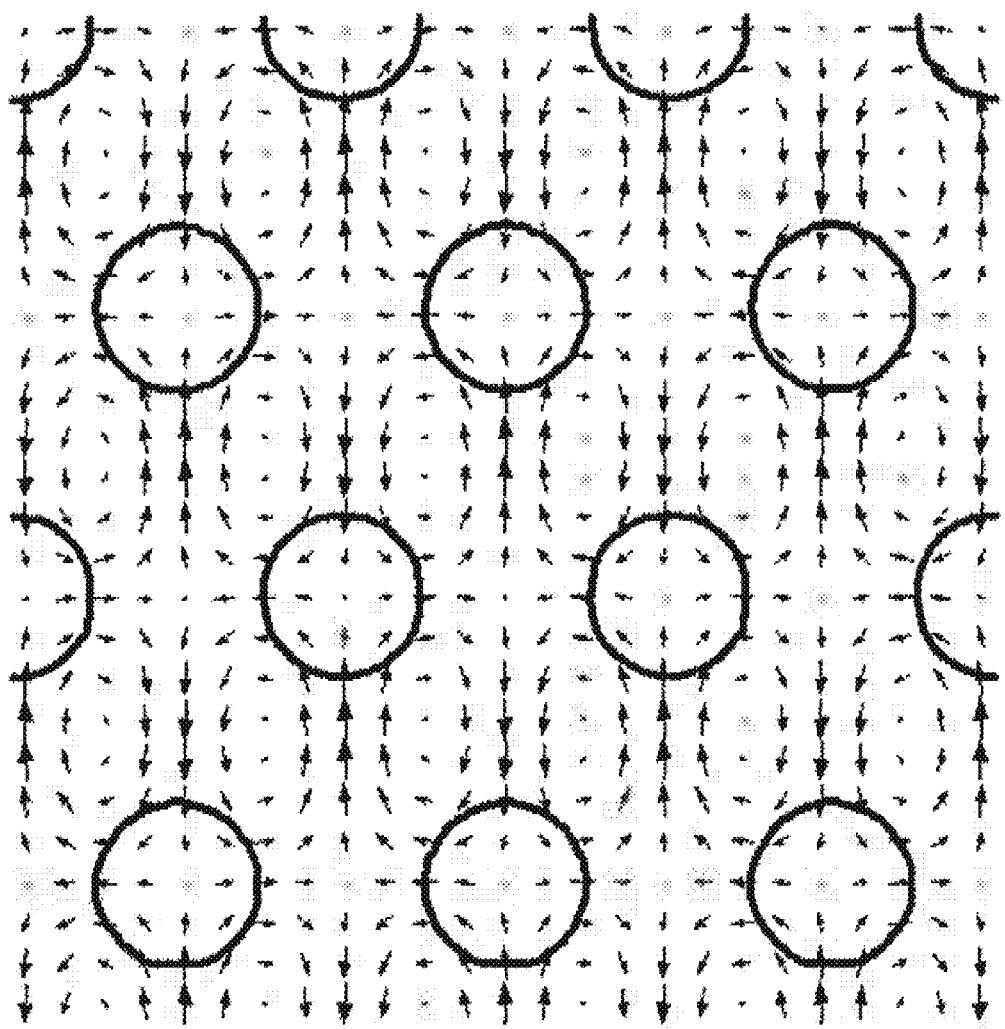
FIG. 27 is a diagram showing a near-field electric field distribution in γ2 mode.
Figure 28:
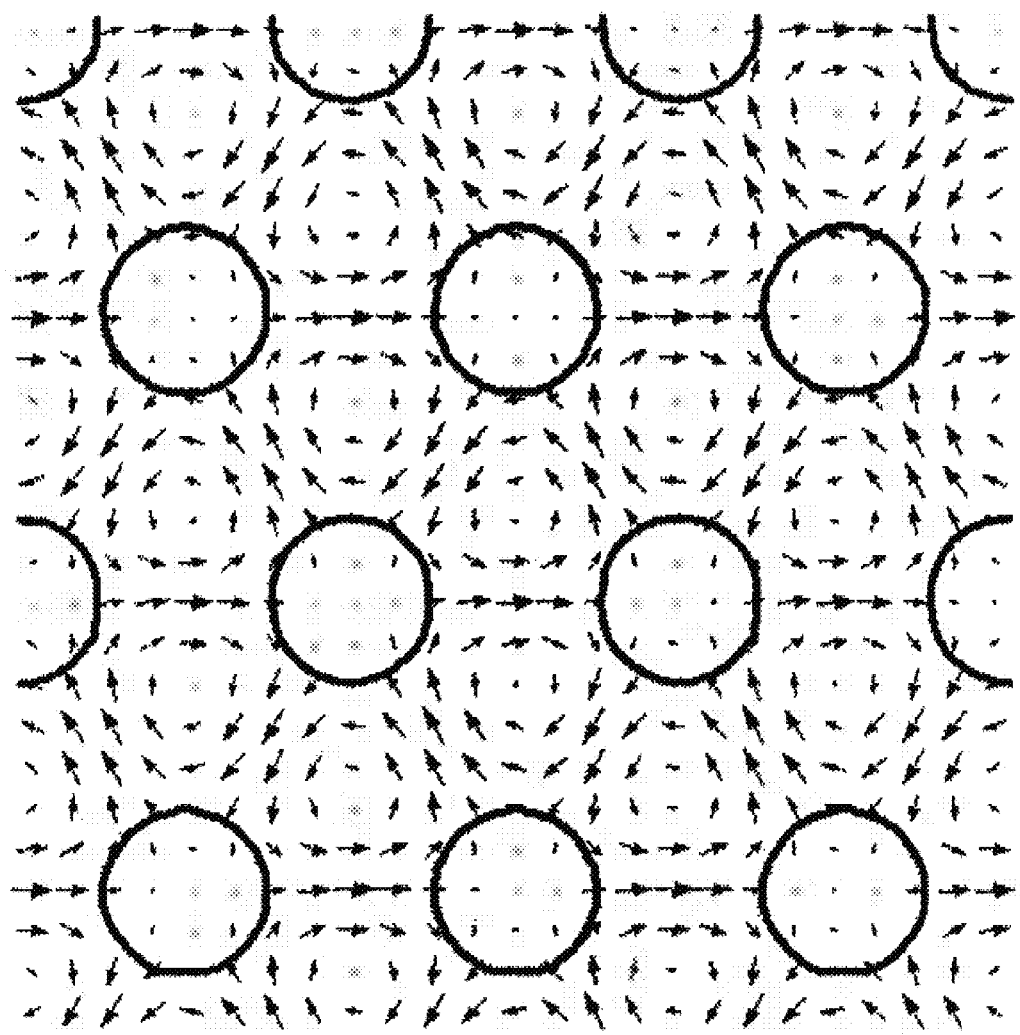
FIG. 28 is a diagram showing a near-field electric field distribution in β mode.
Figure 29:
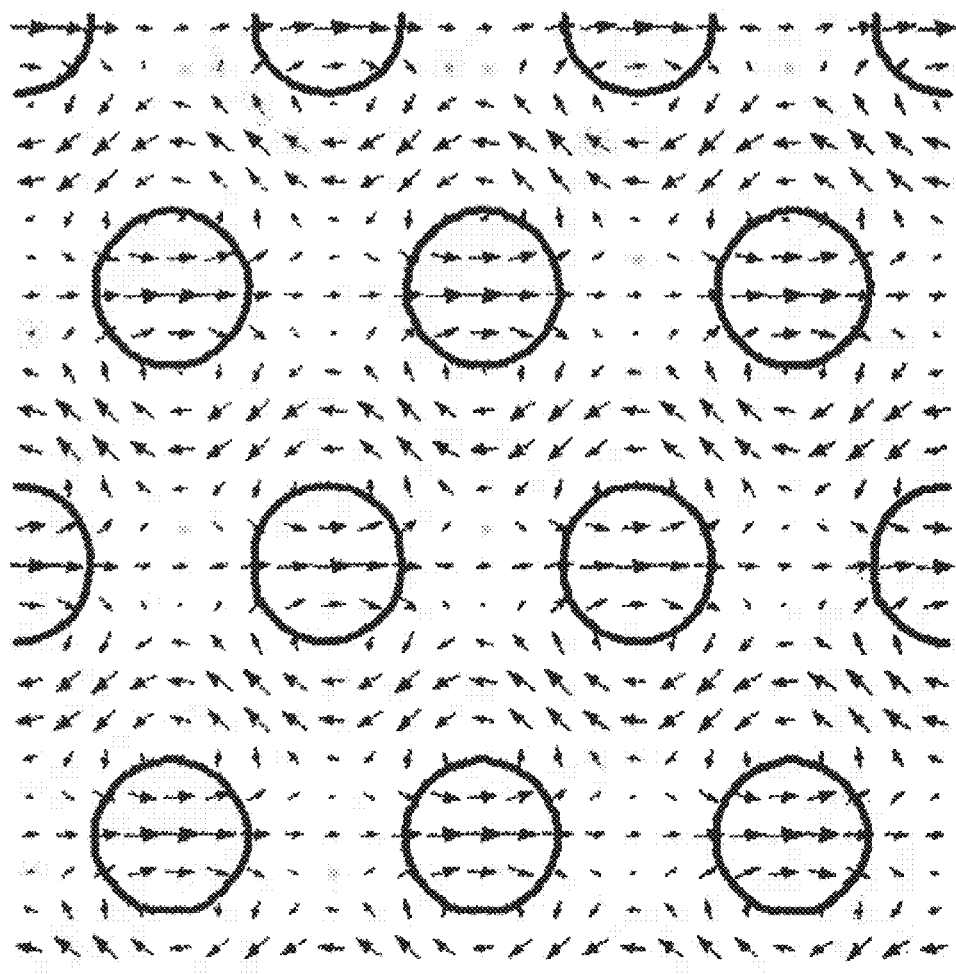
FIG. 29 is a diagram showing a near-field electric field distribution in δ1 mode.
Figure 30:
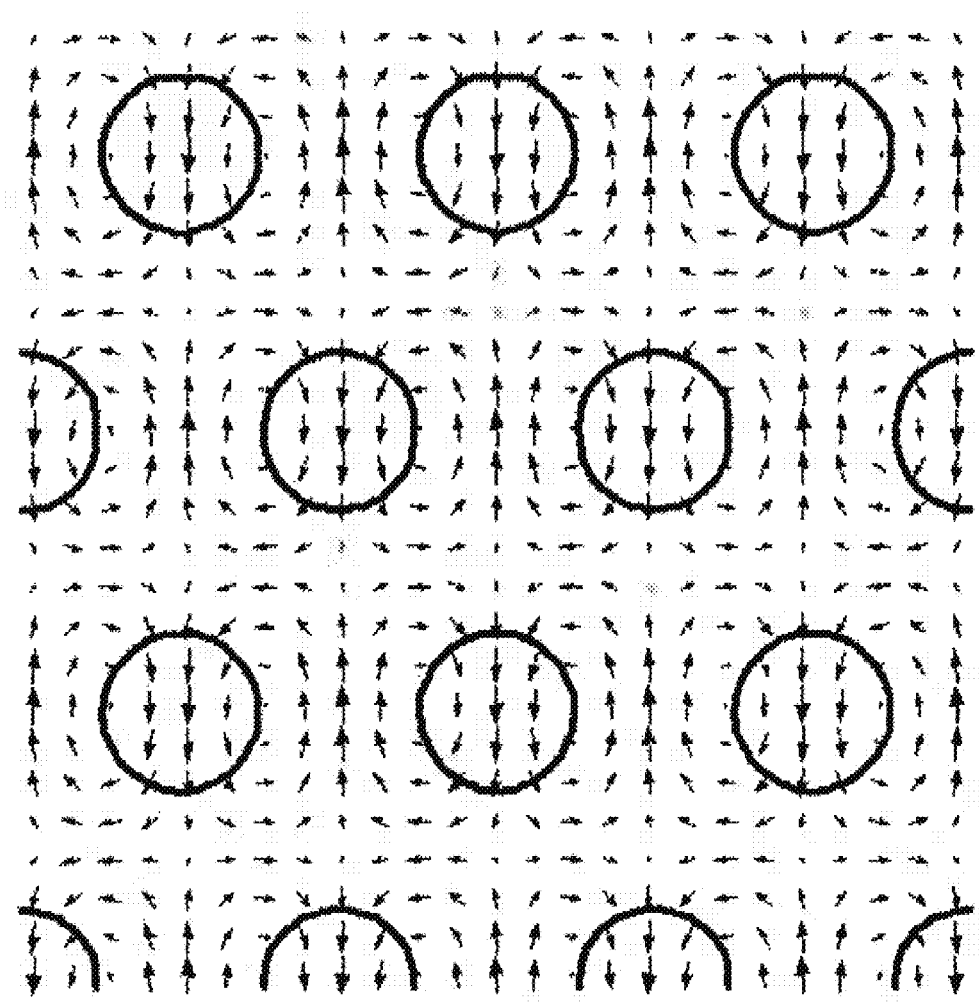
FIG. 30 is a diagram showing a near-field electric field distribution in δ2 mode.

FIG. 24 is a diagram for describing a resonance to be performed in the case where an oscillation wavelength is made equal to the period of a two-dimensional photonic crystal constituted of triangular lattices in Γ-X direction. FIG. 25 is a diagram showing a near-field electric field distribution in α mode. FIG. 26 is a diagram showing a near-field electric field distribution in γ1 mode. FIG. 27 is a diagram showing a near-field electric field distribution in γ2 mode. FIG. 28 is a diagram showing a near-field electric field distribution in β mode. FIG. 29 is a diagram showing a near-field electric field distribution in δ1 mode. FIG. 30 is a diagram showing a near-field electric field distribution in δ mode. In FIGS. 25 through 30, each arrow indicates a direction and a magnitude of electric field.

In the case of a triangular lattice, Γ-X direction as a height direction of a triangle, and Γ-J direction as a side direction of the triangle are typical directions. For instance, observing light L propagating in Γ-X direction, as shown in FIG. 24, when the light L is propagated in Γ-X direction, the light L is diffracted at a lattice point 12. Similarly to the case of a square lattice, out of the diffraction light L, only the light L which is diffracted in the direction of 0 degree, ±60 degrees, ±120 degrees, and 180 degrees with respect to the propagating direction of light L satisfies the Bragg condition. There are other lattice points 12 in the propagating direction of the light L diffracted in the direction of 0 degree, ±60 degrees, ±120 degrees, and 180 degrees. Accordingly, the diffraction light L is diffracted again in the direction of 0 degree, ±60 degrees, ±120 degrees, and 180 degrees with respect to the propagating direction. Then, the light L propagating in Γ-X direction is returned to the original lattice point 12 by repeating the aforementioned diffraction once or plural times. Thereby, the two-dimensional photonic crystal 10 is resonated. Thus, the light having an in-medium wavelength equal to the height of the lattice element E1 as a triangular lattice is resonated for laser oscillation.

There are six modes as resonance modes at which light is oscillated by resonance. If D1 direction aligned in Γ-X direction, D2 direction, which is equivalent to Γ-X direction, and is obtained by rotating Γ-X direction by 60 degrees counterclockwise (by 120 degrees clockwise), and D3 direction, which is equivalent to Γ-X direction, and is obtained by rotating Γ-X direction by 120 degrees counterclockwise (by 60 degrees clockwise) are defined on a two-dimensional plane of the two-dimensional photonic crystal 10 (two-dimensional photonic crystal area 11), a standing wave to be formed by resonance has the following features in each of the modes, as shown in FIGS. 25 through 30.

In the first mode (hereinafter, called as "α mode"), a primary component ED1 of standing wave to be formed in D1 direction starts at −sin, a primary component ED2 of standing wave to be formed in D2 direction starts at +sin, and a primary component ED3 of standing wave to be formed in D3 direction starts at +sin. As a result, the electric field distribution is as shown in FIG. 25.

In the second mode (hereinafter, called as "γ1 mode"), a primary component ED1 of standing wave to be formed in D1 direction starts at +sin, a primary component ED2 of standing wave to be formed in D2 direction starts at +sin, and a primary component ED3 of standing wave to be formed in D3 direction starts at +sin. As a result, the electric field distribution is as shown FIG. 26.

In the third mode (hereinafter, called as "γ2 mode"), a primary component ED1 of standing wave to be formed in D1 direction is null, a primary component ED2 of standing wave to be formed in D2 direction starts at +sin, and a primary component ED3 of standing wave to be formed in D3 direction starts at −sin. As a result, the electric field distribution is as shown in FIG. 27.

In the fourth mode (hereinafter, called as "β mode"), a primary component ED1 of standing wave to be formed in D1 direction starts at +cos, a primary component ED2 of standing wave to be formed in D2 direction starts at +cos, and a primary component ED3 of standing wave to be formed in D3 direction starts at −cos. As a result, the electric field distribution is as shown in FIG. 28.

In the fifth mode (hereinafter, called as "δ1 mode"), a primary component ED1 of standing wave to be formed in D1 direction starts at +cos, a primary component ED2 of standing wave to be formed in D2 direction starts at +cos, and a primary component ED3 of standing wave to be formed in D3 direction starts at −cos. As a result, the electric field distribution is as shown in FIG. 29.

In the sixth mode (hereinafter, called as "δ2 mode"), a primary component ED1 of standing wave to be formed in D1 direction is null, a primary component ED2 of standing wave to be formed in D2 direction starts at −cos, and a primary component ED3 of standing wave to be formed in D3 direction starts at −cos. As a result, the electric field distribution is as shown in FIG. 30.

In α mode, γ1 mode, γ2 mode, and β mode, cancellative coherence is generated, and theoretically, laser light is not emitted. In δ1 mode and δ2 mode, cancellative coherence is not generated, and theoretically, laser light is emitted.

Figure 31:
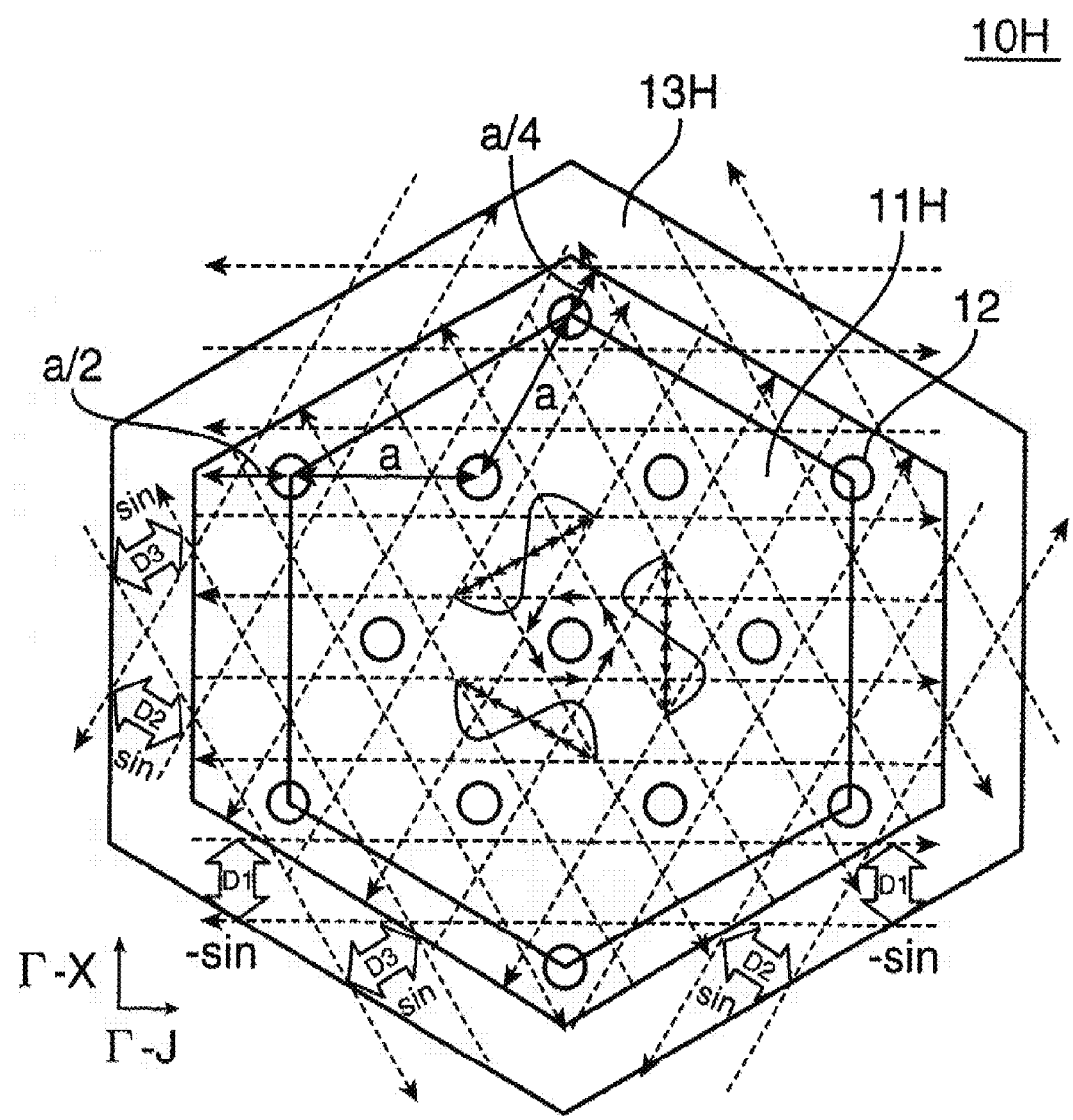
FIG. 31 is a plan view showing an eighth arrangement of the two-dimensional photonic crystal in the embodiment.
Figure 32:
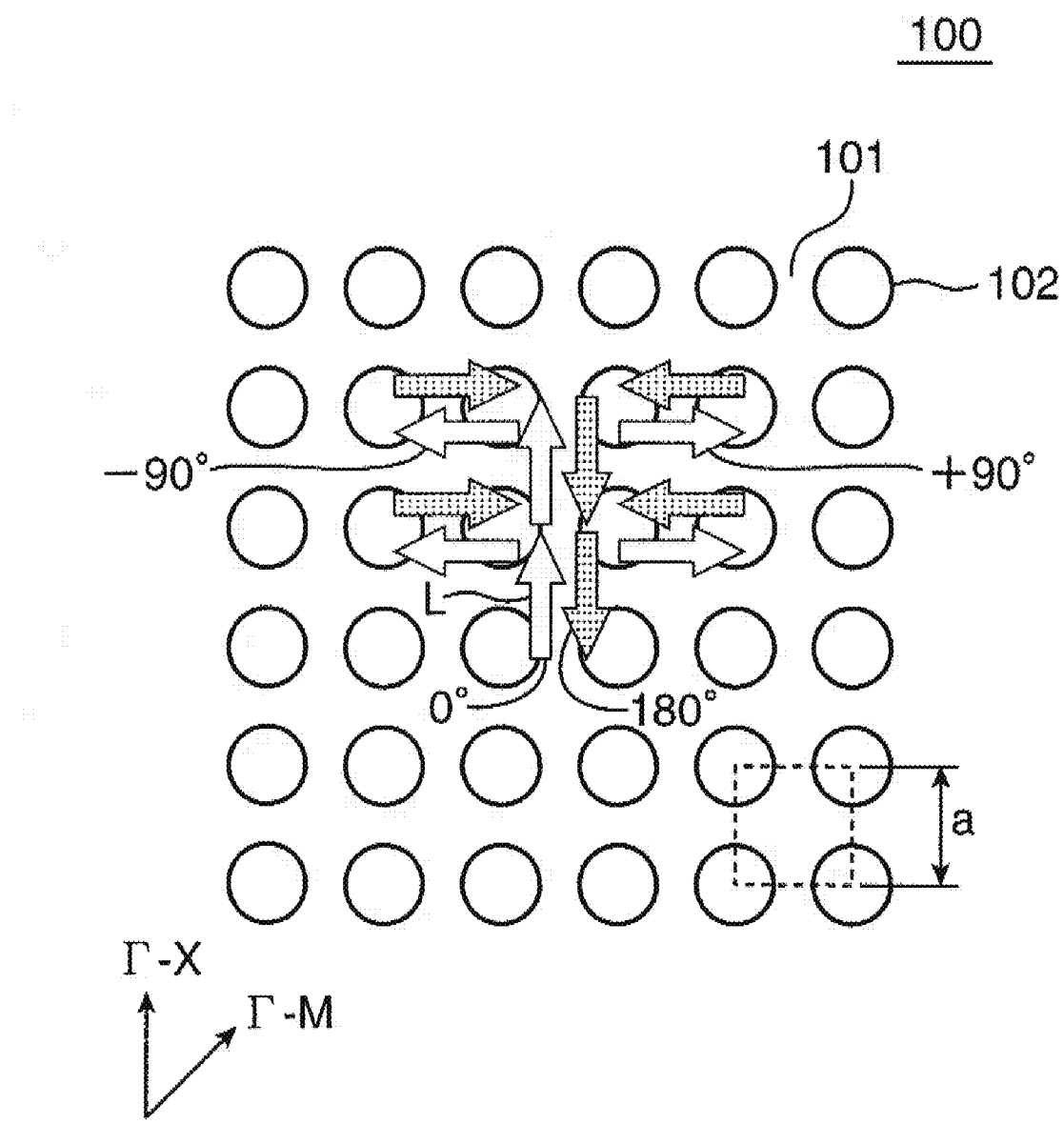
FIG. 32 is a plan view showing a structure of a two-dimensional photonic crystal to be used in a two-dimensional photonic crystal plane emission laser.
Figure 33A:
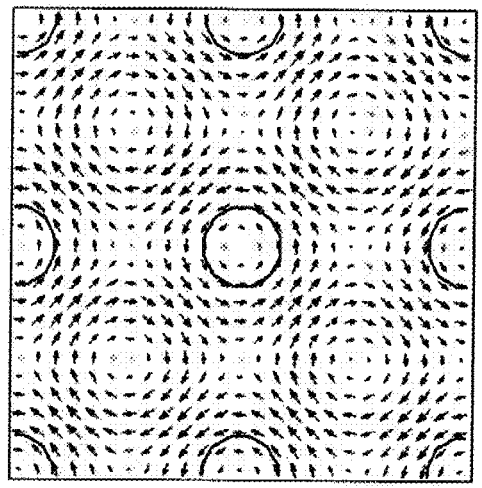
FIGS. 33A and 33B are diagrams for describing a resonance mode.
Figure 33B:
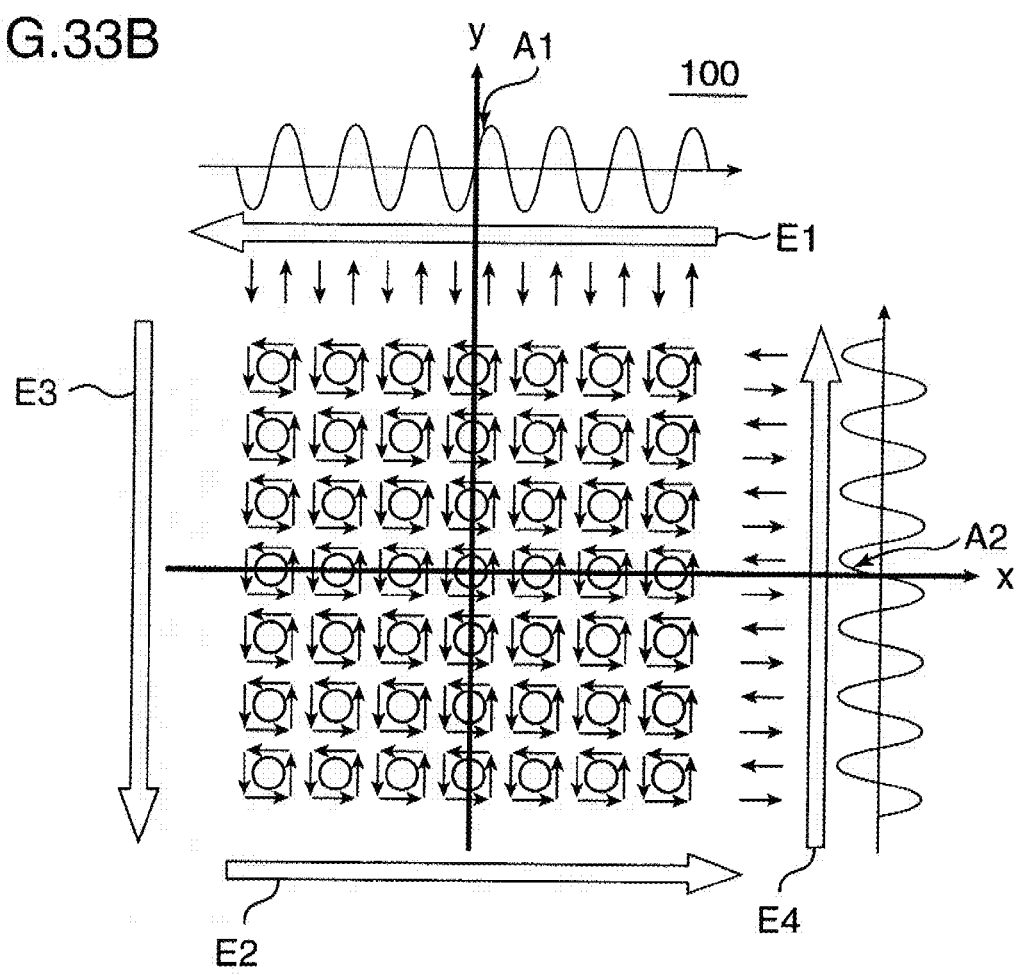
Figure 34A:
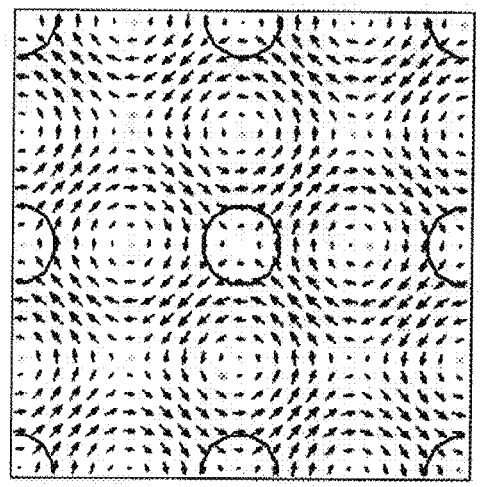
FIGS. 34A and 34B are diagrams for describing a resonance mode.
Figure 34B:
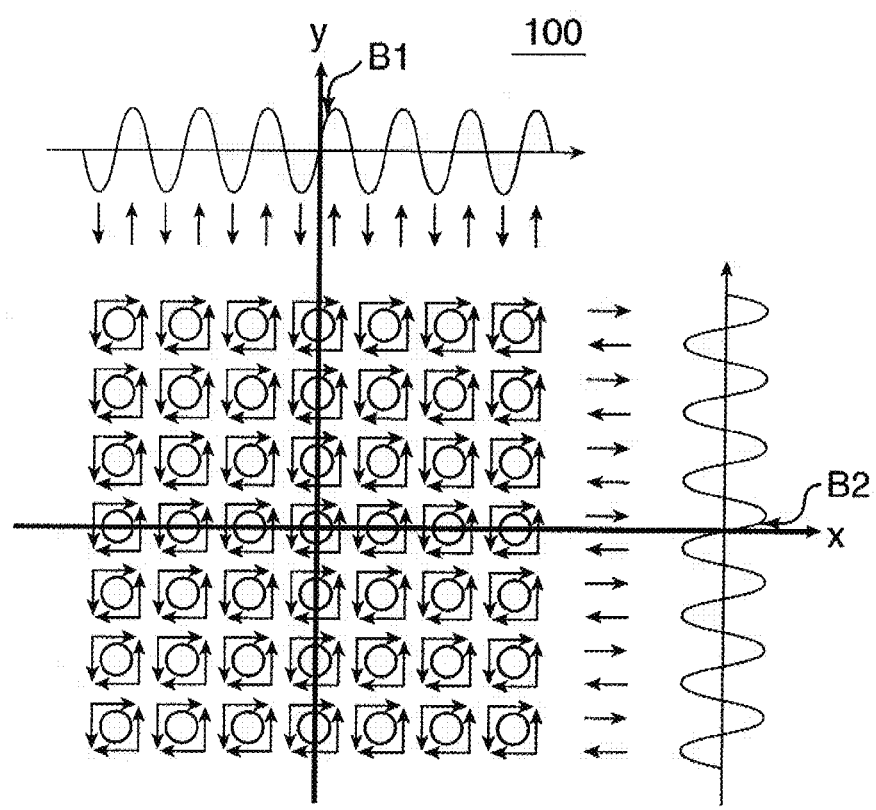
Figure 35A:
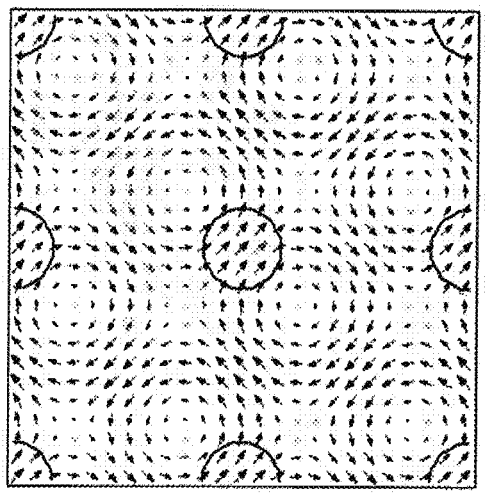
FIGS. 35A and 35B are diagrams for describing a resonance mode.
Figure 35B:
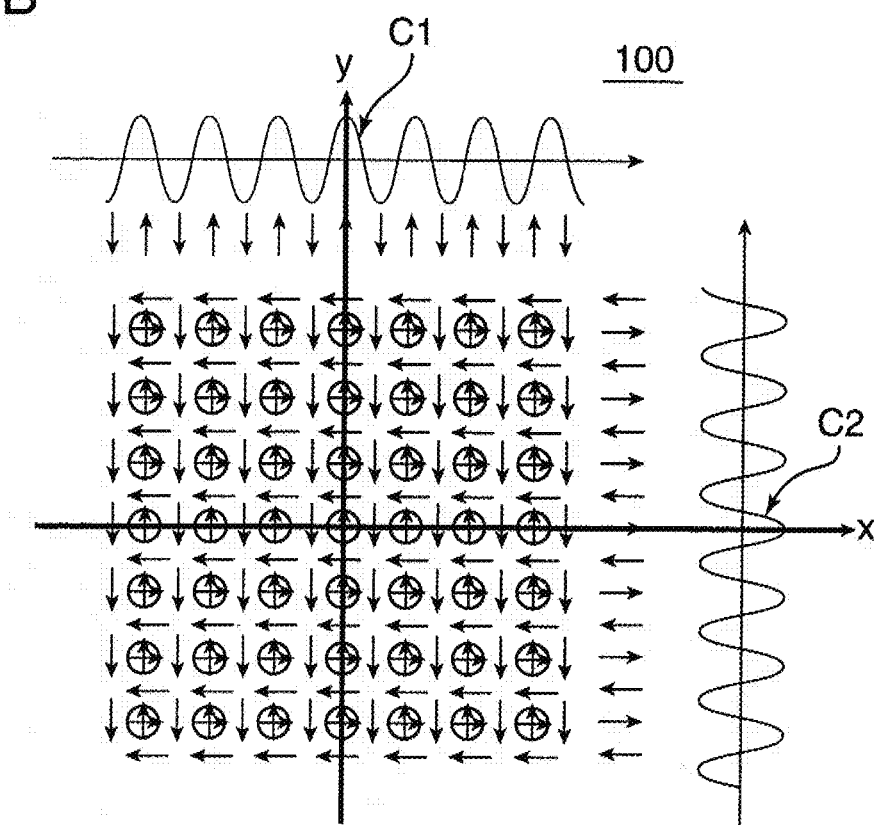
Figure 36A:
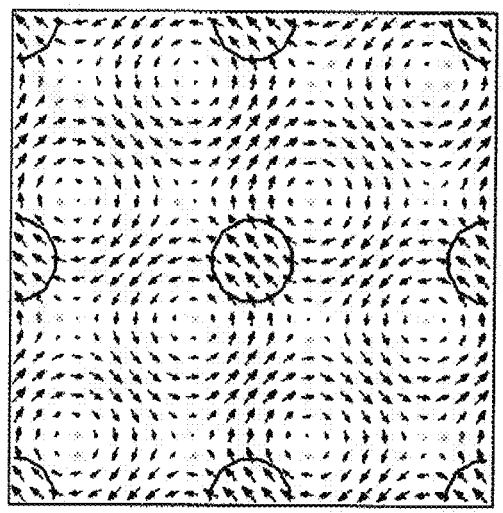
FIGS. 36A and 36B are diagrams for describing a resonance mode.
Figure 36B:
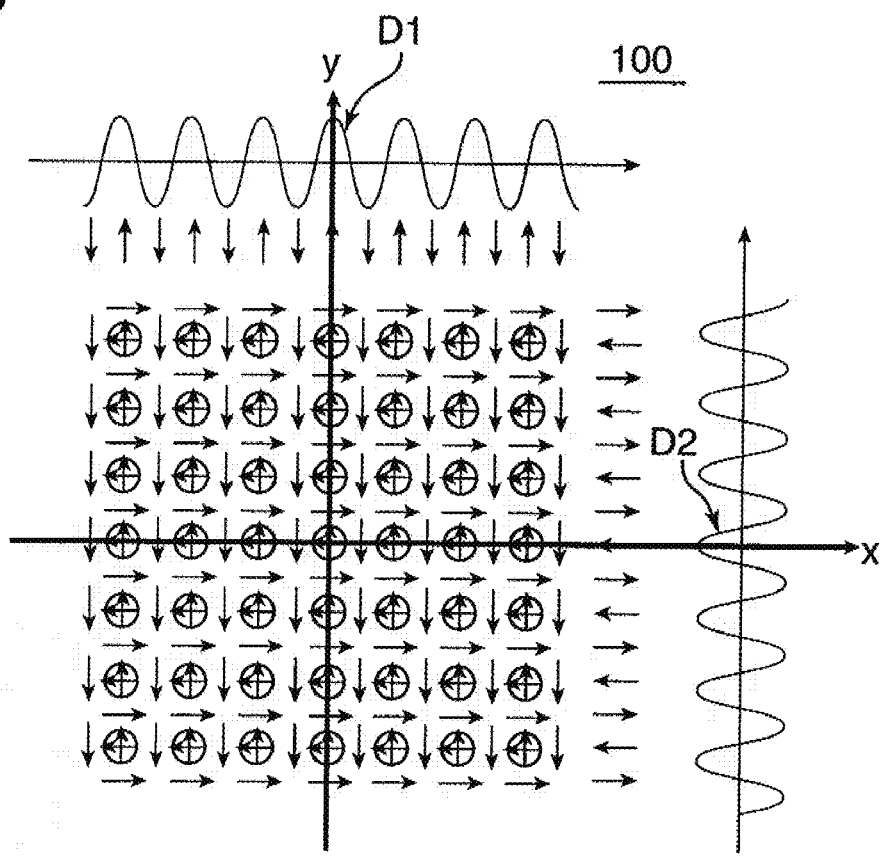
Figure 37:
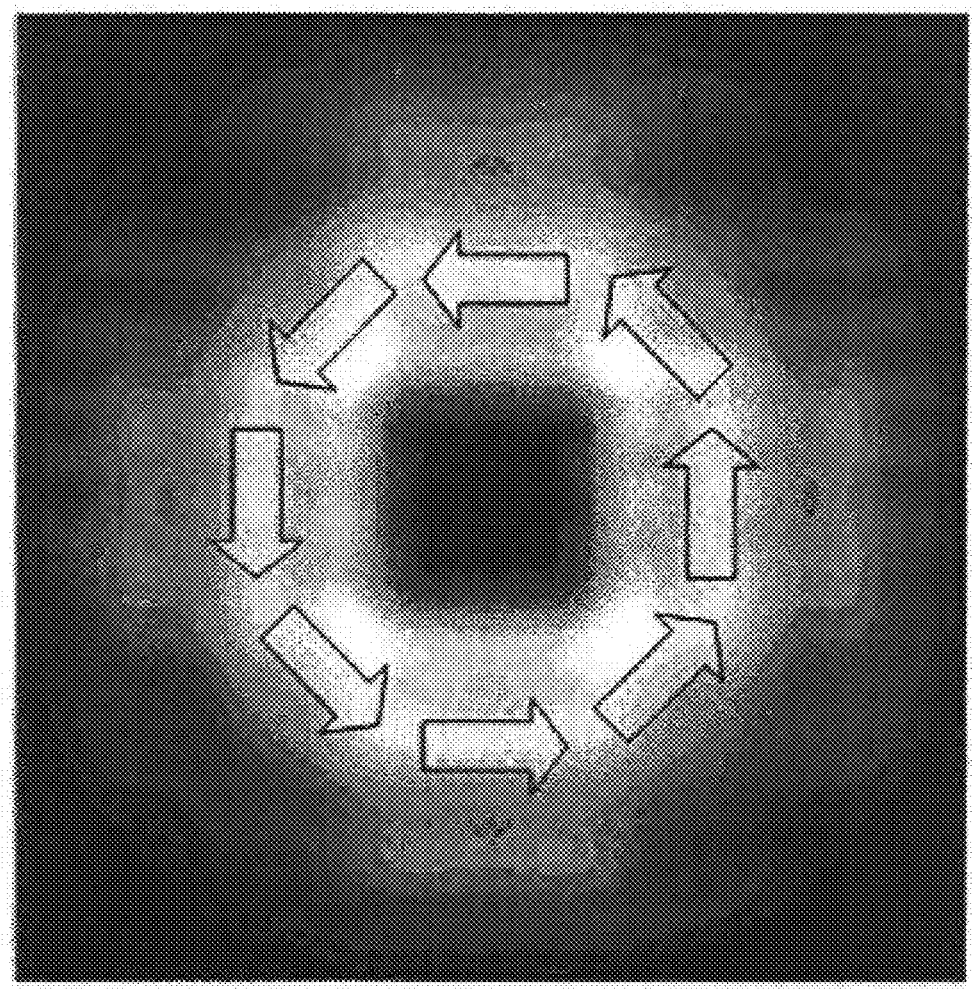
FIG. 37 is a diagram showing how a two-dimensional photonic crystal plane emission laser emits planar light.

FIG. 31 is a plan view showing an eighth arrangement of the two-dimensional photonic crystal in the embodiment.

In α mode, as shown in FIG. 31, the two-dimensional photonic crystal 10H includes a two-dimensional photonic crystal area 11H constituted of triangular lattices, wherein the two-dimensional refractive index distribution has the period (the lattice interval or the lattice constant) "a"; and a light reflecting area 13H in the periphery of the two-dimensional photonic crystal area 11H, in a direction horizontal to a crystal plane of the two-dimensional photonic crystal 10H. The two-dimensional photonic crystal area 11H has a regular hexagonal shape in a direction horizontal to a crystal plane thereof. In defining a regular triangle, which is obtained by connecting each two vertices opposing to each other with respect to the lattice element E1, a reflecting surface 13HS of the light reflecting area 13H is aligned in parallel to a tangential direction to each side of the regular triangle. The reflecting surface 13HS of the light reflecting area 13H is disposed at a position distanced by a/2 or a/4 from a center of a lattice point 12 at an outermost circumference of the two-dimensional photonic crystal area 11H, in the case where the lattice point 12 has a cylindrical column shape. More generally, assuming that N is a positive integer, the reflecting surface 13HS of the light reflecting area 13H is disposed at a position distanced by (N/2)×a or ((N/4)/×a from (a lattice point 12 at the outermost circumference of) the two-dimensional photonic crystal area 11H.

Although not illustrated, a reflecting surface 13S of a light reflecting area 13 may be configured in the same manner as described above in β mode, γ1 mode, and δ1 mode, as well as α mode to stably oscillate the crystal.

As described above, in the two-dimensional photonic crystal 10 constituted of triangular lattices, wherein the two-dimensional refractive index distribution has the period "a", disposing the light reflecting area 13 in the periphery of the two-dimensional photonic crystal area 11 at a predetermined position as described above enables to stably oscillate the crystal in any one of α mode, β mode, γ1 mode, and δ1 mode, and improve the performance of the resonator. This enables to stably oscillate the two-dimensional photonic crystal plane emission laser LD in the predetermined mode, and reduce the electric current value at which laser emission is started. Further, unlike the background art arrangement, wherein the periodic number is indefinite, the two-dimensional photonic crystal 10 of the embodiment is advantageous in that there is no or less light leakage in an in-plane direction, and the light distribution becomes substantially uniform in the two-dimensional photonic crystal 10.

In this embodiment, the oscillation modes of the two-dimensional photonic crystal plane emission laser LD can be selected from among α mode, β mode, γ1 mode, and δ1 mode by properly setting the distance from (a lattice point 12 at the outermost circumference of) the two-dimensional photonic crystal area 11 to the reflecting surface of the light reflecting area 13. Specifically, the distance from the end surface of the two-dimensional photonic crystal area 11 to the reflecting surface 13S of the light reflecting area 13 is set to (N/4)×a depending on an intended oscillation mode, assuming that a lattice point at the outermost circumference resides on the end surface of the two-dimensional photonic crystal area 11, and N is an arbitrary positive integer.

In the foregoing, description has been made on the two-dimensional photonic crystal 10 constituted of triangular lattices, wherein the two-dimensional refractive index distribution has the period "a", and the propagating direction of diffraction light is aligned in Γ-X direction of a triangular lattice. Substantially the same description as described above may be applied, in the case where the periodic direction is a direction other than the above.

In the foregoing, description has been made on the two-dimensional photonic crystal 10 constituted of square lattices, wherein the two-dimensional refractive index distribution has the period "a", and the two-dimensional photonic crystal 10 constituted of triangular lattices, wherein the two-dimensional refractive index distribution has the period "a". Substantially the same description as described above may be applied, in the case where the lattice element has a shape other than the above.

For instance, the invention is applicable to an arrangement, wherein a resonance mode having an order other than the order of a square lattice, a resonance mode having an order other than the order of a triangular lattice, a rectangular lattice, or a face-centered lattice is used.

In any of the above arrangements, as described above, the reflecting surface 13S of the light reflecting area 13 may be disposed at such a position that assuming that an angle range from 0 degree to less than 180 degrees, which is obtained by dividing 360 degrees into two sections, is defined so that propagating directions of an even number are obtained out of the propagating directions of diffraction light in the two-dimensional photonic crystal area 11, the direction of a synthesized vector obtained by summing up all the unit vectors representing the propagating directions of the even number residing in the angle range is aligned with a tangential direction; and that the distance from the end surface 11S of the two-dimensional photonic crystal area 11 to the reflecting surface 13S of the light reflecting area 13 is set to such a value that in the case where diffraction light in one of the propagating directions is reflected on the reflecting surface 13S, the propagating direction and the phase of the reflection light, and the propagating direction and the phase of light in other one of the propagating directions are coincident with each other, respectively.

Although the present invention has been fully described by way of example with reference to the accompanying drawings, it is to be understood that various changes and modifications will be apparent to those skilled in the art. Therefore, unless otherwise such changes and modifications depart from the scope of the present invention hereinafter set, they should be construed as being included therein.

The specification discloses the aforementioned various aspects of the technology, and the following is a summary of the technology.

A two-dimensional photonic crystal plane emission laser according to an aspect includes: a first conductive semiconductor layer and a second conductive semiconductor layer different from each other in a conductive type; an active layer which is sandwiched between the first conductive semiconductor layer and the second conductive semiconductor laser, and generates light by carrier impregnation; and a two-dimensional photonic crystal layer including a two-dimensional photonic crystal area having a two-dimensional periodic refractive index distribution, and a light reflecting area which is formed in a periphery of the two-dimensional photonic crystal area, in a direction along which the refractive index distribution is spread, the two-dimensional photonic crystal layer being adapted to select a wavelength of the light to be generated in the active layer, wherein a reflecting surface of the light reflecting area is disposed at such a position that, assuming that each of propagating directions of diffraction light residing in the two-dimensional photonic crystal is represented by a unit vector whose magnitude is 1, and one of the unit vectors is selected, a direction of a synthesized vector obtained by summing up all the unit vectors representing the propagating directions of diffraction light of an even number, which includes the selected unit vector and lies within an angle range less than 180 degrees, is aligned with a tangential direction, and a distance from an end surface of the two-dimensional photonic crystal area to the reflecting surface of the light reflecting area is set to such a value that in the case where diffraction light in one of the propagating directions is reflected on the reflecting surface, a propagating direction and a phase of the reflection light, and a propagating direction and a phase of light in other one of the propagating directions are coincident with each other, respectively.

A two-dimensional photonic crystal plane emission laser according to another aspect includes: a first conductive semiconductor layer and a second conductive semiconductor layer different from each other in a conductive type; an active layer which is sandwiched between the first conductive semiconductor layer and the second conductive semiconductor laser, and generates light by carrier impregnation; and a two-dimensional photonic crystal layer including a two-dimensional photonic crystal area having a two-dimensional periodic refractive index distribution, and a light reflecting area which is formed in a periphery of the two-dimensional photonic crystal area, in a direction along which the refractive index distribution is spread, the two-dimensional photonic crystal layer being adapted to select a wavelength of the light to be generated in the active layer, wherein a reflecting surface of the light reflecting area is disposed at such a position that, assuming that an angle range from 0 degree to less than 180 degrees, which is obtained by dividing 360 degrees into two sections, is defined so that propagating directions of an even number are obtained out of the propagating directions of diffraction light in the two-dimensional photonic crystal area, a direction of a synthesized vector obtained by summing up all the unit vectors representing the propagating directions of the even number residing in the angle range is aligned with a tangential direction; and that a distance from an end surface of the two-dimensional photonic crystal area to the reflecting surface of the light reflecting area is set to such a value that in the case where diffraction light in one of the propagating directions is reflected on the reflecting surface, the propagating direction and the phase of the reflection light, and the propagating direction and the phase of light in other one of the propagating directions are made coincident with each other, respectively.

The two-dimensional photonic crystal plane emission laser having the above arrangement is provided with the light reflecting area in the periphery of the two-dimensional photonic crystal area, in a direction horizontal to a crystal plane thereof, to trap light within the two-dimensional photonic crystal area, while preventing light leakage. The reflecting surface of the light reflecting area is disposed at such a position that assuming that each of the propagating directions of diffraction light residing in the two-dimensional photonic crystal is represented by a unit vector whose magnitude is 1, and one of the unit vectors is selected, the direction of a synthesized vector obtained by summing up all the unit vectors representing the propagating directions of diffraction light of an even number, which includes the selected unit vector and lies within an angle range less than 180 degrees, is aligned with a tangential direction. Alternatively, for instance, the reflecting surface of the light reflecting area is disposed at such a position that, assuming that an angle range from 0 degree to less than 180 degrees, which is obtained by dividing 360 degrees into two sections, is defined so that propagating directions of an even number are obtained out of the propagating directions of diffraction light in the two-dimensional photonic crystal area, the direction of a synthesized vector obtained by summing up all the unit vectors representing the propagating directions of the even number residing in the angle range is aligned with a tangential direction. Further, the distance from the end surface of the two-dimensional photonic crystal area to the reflecting surface of the light reflecting area is set to such a value that in the case where diffraction light in one of the propagating directions is reflected on the reflecting surface, the propagating direction and the phase of the reflection light, and the propagating direction and the phase of light in other one of the propagating directions are made coincident with each other, respectively. With this arrangement, in the case where light leaking from the two-dimensional photonic crystal area and reflected on the reflecting surface is returned to the two-dimensional photonic crystal area, the reflection light is combined with a standing wave residing in the propagating direction of the reflection light, without disturbing its resonant state. This enables to improve the performance of a two-dimensional photonic crystal-based resonator, even if the light reflecting area is an optical element which causes Fresnel reflection, thereby improving the performance of the two-dimensional photonic crystal-based resonator, without increasing the light emission area or the element size of the optical element.

The reflecting surface of the light reflecting area in the specification is a reflecting surface disposed at a position considering Goos-Hanchen shift. Goos-Hanchen effect is a phenomenon that, in the case where light satisfying the total reflection condition is incident from a high refractive medium A to a low refractive medium B, the light intrudes into the medium B through a physical boundary surface between the medium A and the medium B, and is reflected. Displacement from the physical boundary surface between the medium A and the medium B to an actual reflecting surface is called as Goos-Hanchen shift. The expression "no phase displacement", or "phase change is zero" means a condition that there is no change in electromagnetic field component (in case of s-polarized light incidence, the electromagnetic field component indicates an electric field component, and in case of p-polarized light incidence, the electromagnetic field component indicates a magnetic field component) in a direction perpendicular to an incident plane. Substantially the same description as described above is applied to an arrangement using a Bragg reflection mirror.

Preferably, a lattice of the two-dimensional photonic crystal area may be a square lattice, a lattice constant of the square lattice may be equal to a laser oscillation wavelength in a plane of the two-dimensional photonic crystal area, and the reflecting surface of the light reflecting area may be aligned in parallel to a diagonal direction of the square lattice. Further preferably, the propagating directions of diffraction light may be aligned with side directions of the square lattice. Further preferably, the distance from the end surface of the two-dimensional photonic crystal area to the reflecting surface of the light reflecting area may be $(N \times a)/(2\sqrt{2})$, assuming that a lattice point at an outermost circumference of the two-dimensional photonic crystal area resides on the end surface of the two-dimensional photonic crystal area, "a" is the lattice constant of the square lattice, and N is an arbitrary positive integer, where $\sqrt{2}=2^{1/2}$.

The above arrangement provides a two-dimensional photonic crystal plane emission laser with an improved performance as a resonator, wherein a two-dimensional photonic crystal (two-dimensional photonic crystal area) is constituted of square lattices, and laser light whose in-medium wavelength is equal to the lattice constant of a square lattice is stably emitted as planar light. The above arrangement enables to select a mode of laser light to be emitted from the two-dimensional photonic crystal plane emission laser by properly setting the positive integer N depending on an intended mode.

Preferably, a lattice of the two-dimensional photonic crystal area may be a square lattice, a lattice constant of the square lattice may be equal to $\sqrt{2}$ times of a laser oscillation wavelength in a plane of the two-dimensional photonic crystal area, and the reflecting surface of the light reflecting area may be aligned in parallel to a side direction of the square lattice. Further preferably, the propagating directions of diffraction light may be aligned with diagonal directions of the square lattice. Further preferably, the distance from the end surface of the two-dimensional photonic crystal area to the reflecting surface of the light reflecting area may be (N×a)/4, assuming that a lattice point at an outermost circumference of the two-dimensional photonic crystal area resides on the end surface of the two-dimensional photonic crystal area, "a" is the lattice constant of the square lattice, and N is an arbitrary positive integer.

The above arrangement provides a two-dimensional photonic crystal plane emission laser with an improved performance as a resonator, wherein a two-dimensional photonic crystal (two-dimensional photonic crystal area) is constituted of square lattices, and laser light whose in-medium wavelength is equal to $1/\sqrt{2}$ times of the lattice constant of a square lattice is stably emitted as planar light. The above arrangement enables to select a mode of laser light to be emitted from the two-dimensional photonic crystal plane emission laser by properly setting the positive integer N depending on an intended mode.

Preferably, a lattice of the two-dimensional photonic crystal area may be a triangular lattice.

The above arrangement provides a two-dimensional photonic crystal plane emission laser with an improved performance as a resonator, wherein a two-dimensional photonic crystal (two-dimensional photonic crystal area) is constituted of triangular lattices, and laser light is stably emitted as planar light.

Preferably, the light reflecting area may be constituted of an area having a refractive index different from an effective refractive index of the two-dimensional photonic crystal area. Further preferably, the light reflecting area may be constituted of an area having a refractive index smaller than the effective refractive index of the two-dimensional photonic crystal area.

Further, for instance, the reflecting surface of the light reflecting area may be a total reflecting surface which causes total reflection with respect to laser light oscillated in a plane of the two-dimensional photonic crystal area. Furthermore, for instance, the light reflecting area may be a Bragg reflection mirror formed by alternately laminating layers of materials having refractive indexes different from each other. The light reflecting area having the above arrangement enables to further improve the performance of the two-dimensional photonic crystal-based resonator.

The refractive index of the two-dimensional photonic crystal area is an average value of refractive indexes, because the two-dimensional photonic crystal area has a two-dimensional refractive index distribution. However, since there is no lattice point for forming a two-dimensional refractive index distribution in the reflecting surface, the refractive index becomes a slightly different value from the average value. In view of this, the effective refractive index of the two-dimensional photonic crystal area indicates a refractive index of the reflecting surface and its vicinity in the two-dimensional photonic crystal area, considering the above effect.

Preferably, a lattice point in the two-dimensional photonic crystal area may have a triangular column shape.

In the above arrangement, since the lattice point has an asymmetrical shape, the two-dimensional photonic crystal plane emission laser can emit laser light to the exterior from a plane thereof.

Although the present invention has been fully described by way of example with reference to the accompanying drawings, it is to be understood that various changes and modifications will be apparent to those skilled in the art. Therefore, unless otherwise such changes and modifications depart from the scope of the present invention hereinafter set, they should be construed as being included therein.

INDUSTRIAL APPLICABILITY

According to the invention, provided is a two-dimensional photonic crystal plane emission laser.

The invention claimed is:

1. A two-dimensional photonic crystal plane emission laser, comprising:
    a first conductive semiconductor layer and a second conductive semiconductor layer different from each other in a conductive type;
    an active layer which is sandwiched between the first conductive semiconductor layer and the second conductive semiconductor laser, and generates light by carrier impregnation; and
    a two-dimensional photonic crystal layer including
        a two-dimensional photonic crystal area having a two-dimensional periodic refractive index distribution, and
        a light reflecting area which is formed in a periphery of the two-dimensional photonic crystal area, in a direction along which the refractive index distribution is spread, the two-dimensional photonic crystal layer being adapted to select a wavelength of the light to be generated in the active layer, wherein
    a reflecting surface of the light reflecting area is disposed at such a position that, assuming that each of propagating directions of diffraction light residing in the two-dimensional photonic crystal is represented by a unit vector whose magnitude is 1, and one of the unit vectors is selected, a direction of a synthesized vector obtained by summing up all the unit vectors representing the propagating directions of diffraction light of an even number, which includes the selected unit vector and lies within an angle range less than 180 degrees, is aligned with a tangential direction, and
    a distance from an end surface of the two-dimensional photonic crystal area to the reflecting surface of the light reflecting area is set to such a value that in the case where diffraction light in one of the propagating directions is reflected on the reflecting surface, a propagating direction and a phase of the reflection light, and a propagating direction and a phase of light in other one of the propagating directions are coincident with each other, respectively.

2. The two-dimensional photonic crystal plane emission laser according to claim 1, wherein
    a lattice of the two-dimensional photonic crystal area is a square lattice,
    a lattice constant of the square lattice is equal to a laser oscillation wavelength in a plane of the two-dimensional photonic crystal area, and the reflecting surface of the light reflecting area is aligned in parallel to a diagonal direction of the square lattice.

3. The two-dimensional photonic crystal plane emission laser according to claim 2, wherein
the propagating directions of diffraction light are aligned with side directions of the square lattice.

4. The two-dimensional photonic crystal plane emission laser according to claim 2, wherein
the distance from the end surface of the two-dimensional photonic crystal area to the reflecting surface of the light reflecting area is $(N \times a)/(2\sqrt{2})$, assuming that a lattice point at an outermost circumference of the two-dimensional photonic crystal area resides on the end surface of the two-dimensional photonic crystal area, "a" is the lattice constant of the square lattice, and N is an arbitrary positive integer.

5. The two-dimensional photonic crystal plane emission laser according to claim 1, wherein
a lattice of the two-dimensional photonic crystal area is a square lattice,
a lattice constant of the square lattice is equal to $\sqrt{2}$ times of a laser oscillation wavelength in a plane of the two-dimensional photonic crystal area, and
the reflecting surface of the light reflecting area is aligned in parallel to a side direction of the square lattice.

6. The two-dimensional photonic crystal plane emission laser according to claim 5, wherein
the propagating directions of diffraction light are aligned with diagonal directions of the square lattice.

7. The two-dimensional photonic crystal plane emission laser according to claim 5, wherein
the distance from the end surface of the two-dimensional photonic crystal area to the reflecting surface of the light reflecting area is $(N \times a)/4$, assuming that a lattice point at an outermost circumference of the two-dimensional photonic crystal area resides on the end surface of the two-dimensional photonic crystal area, "a" is the lattice constant of the square lattice, and N is an arbitrary positive integer.

8. The two-dimensional photonic crystal plane emission laser according to claim 1, wherein
a lattice of the two-dimensional photonic crystal area is a triangular lattice.

9. The two-dimensional photonic crystal plane emission laser according to claim 1, wherein
the light reflecting area is constituted of an area having a refractive index different from an effective refractive index of the two-dimensional photonic crystal area.

10. The two-dimensional photonic crystal plane emission laser according to claim 9, wherein
the light reflecting area is constituted of an area having a refractive index smaller than the effective refractive index of the two-dimensional photonic crystal area.

11. The two-dimensional photonic crystal plane emission laser according to claim 1, wherein
the reflecting surface of the light reflecting area is a total reflecting surface which causes total reflection with respect to laser light oscillated in a plane of the two-dimensional photonic crystal area.

12. The two-dimensional photonic crystal plane emission laser according to claim 1, wherein
the light reflecting area is a Bragg reflection mirror formed by alternately laminating layers of materials having refractive indexes different from each other.

13. The two-dimensional photonic crystal plane emission laser according to claim 1, wherein
a lattice point in the two-dimensional photonic crystal area has a triangular column shape.

* * * * *